United States Patent
Deguchi et al.

(10) Patent No.: US 9,531,977 B2
(45) Date of Patent: Dec. 27, 2016

(54) SEMICONDUCTOR INTEGRATED CIRCUIT AND IMAGE SENSOR

(71) Applicant: Kabushiki Kaisha Toshiba, Minato-ku, Tokyo (JP)

(72) Inventors: Jun Deguchi, Cambridge, MA (US); Daisuke Miyashita, Kawasaki Kanagawa (JP); Makoto Morimoto, Yokohama Kanagawa (JP); Fumihiko Tachibana, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 14/482,816

(22) Filed: Sep. 10, 2014

(65) Prior Publication Data

US 2015/0237281 A1  Aug. 20, 2015

(30) Foreign Application Priority Data

Feb. 14, 2014 (JP) .................. 2014-026720
Aug. 26, 2014 (JP) .................. 2014-171865

(51) Int. Cl.
*H04N 5/369* (2011.01)
*H03F 3/08* (2006.01)
(Continued)

(52) U.S. Cl.
CPC .............. *H04N 5/378* (2013.01); *H03F 3/087* (2013.01); *H04N 5/243* (2013.01); *H03F 2203/45514* (2013.01)

(58) Field of Classification Search
None
See application file for complete search history.

(56) References Cited

U.S. PATENT DOCUMENTS 6,498,332 B2   12/2002 Funakoshi
7,268,338 B2 *  9/2007 Liu ..................... H04N 5/243
                                                    250/214 A
(Continued)

FOREIGN PATENT DOCUMENTS

JP   2003-018471 A    1/2003
JP   2004-363666 A   12/2004
(Continued)

OTHER PUBLICATIONS

Min-Wong Seo et al., "A Low-Noise High Intrascene Dynamic Range . . . ", IEEE Journal of Solid-State Circuits, vol. 47, No. 1, pp. 272-283 (Jan. 2012).
(Continued)

*Primary Examiner* — Mark T Monk
(74) *Attorney, Agent, or Firm* — White & Case LLP

(57) ABSTRACT

According to an embodiment, a semiconductor integrated circuit includes an amplification unit, a comparison unit and a control unit. The amplification unit is configured to amplify a pixel value with an amplification factor that is set in a variable manner, the pixel value being according to an intensity of light irradiated on a pixel. The comparison unit is configured to compare an output value given by the amplification unit and a reference value. The control unit is configured to cause the amplification factor to be higher than a present amplification factor, only when the output value given by the amplification unit is not saturated even where the amplification factor is caused to be higher than the present amplification factor, based on the comparison result of the comparison unit.

15 Claims, 38 Drawing Sheets

(51) Int. Cl.
  *H04N 5/235* (2006.01)
  *H04N 5/378* (2011.01)
  *H04N 5/243* (2006.01)

(56) References Cited

U.S. PATENT DOCUMENTS

| | | | |
|---|---|---|---|
| 7,443,435 B2 * | 10/2008 | Loose | H04N 5/243 |
| | | | 330/278 |
| 8,284,286 B2 | 10/2012 | Mabuchi | |
| 2007/0103569 A1 | 5/2007 | Kawahito | |
| 2010/0277622 A1 * | 11/2010 | Fossum | H04N 5/378 |
| | | | 348/241 |
| 2011/0025420 A1 | 2/2011 | Sumi et al. | |
| 2012/0104235 A1 | 5/2012 | Sumi et al. | |
| 2012/0153130 A1 * | 6/2012 | Nakamura | H04N 5/243 |
| | | | 250/208.1 |

FOREIGN PATENT DOCUMENTS

| | | |
|---|---|---|
| JP | 2005-175517 A | 6/2005 |
| JP | 2007-251680 A | 9/2007 |
| JP | 2008-245121 A | 10/2008 |
| JP | 2010-259109 A | 11/2010 |
| JP | 2010-273385 A | 12/2010 |
| WO | 00/14960 A1 | 3/2000 |

OTHER PUBLICATIONS

B. Robert Gregoire et al., "An Over60 dB True Rail-to-Rail Performance . . . ", IEEE Journal of Solid-State Circuits, vol. 43, No. 12, pp. 2620-2630 (Dec. 2008).

* cited by examiner

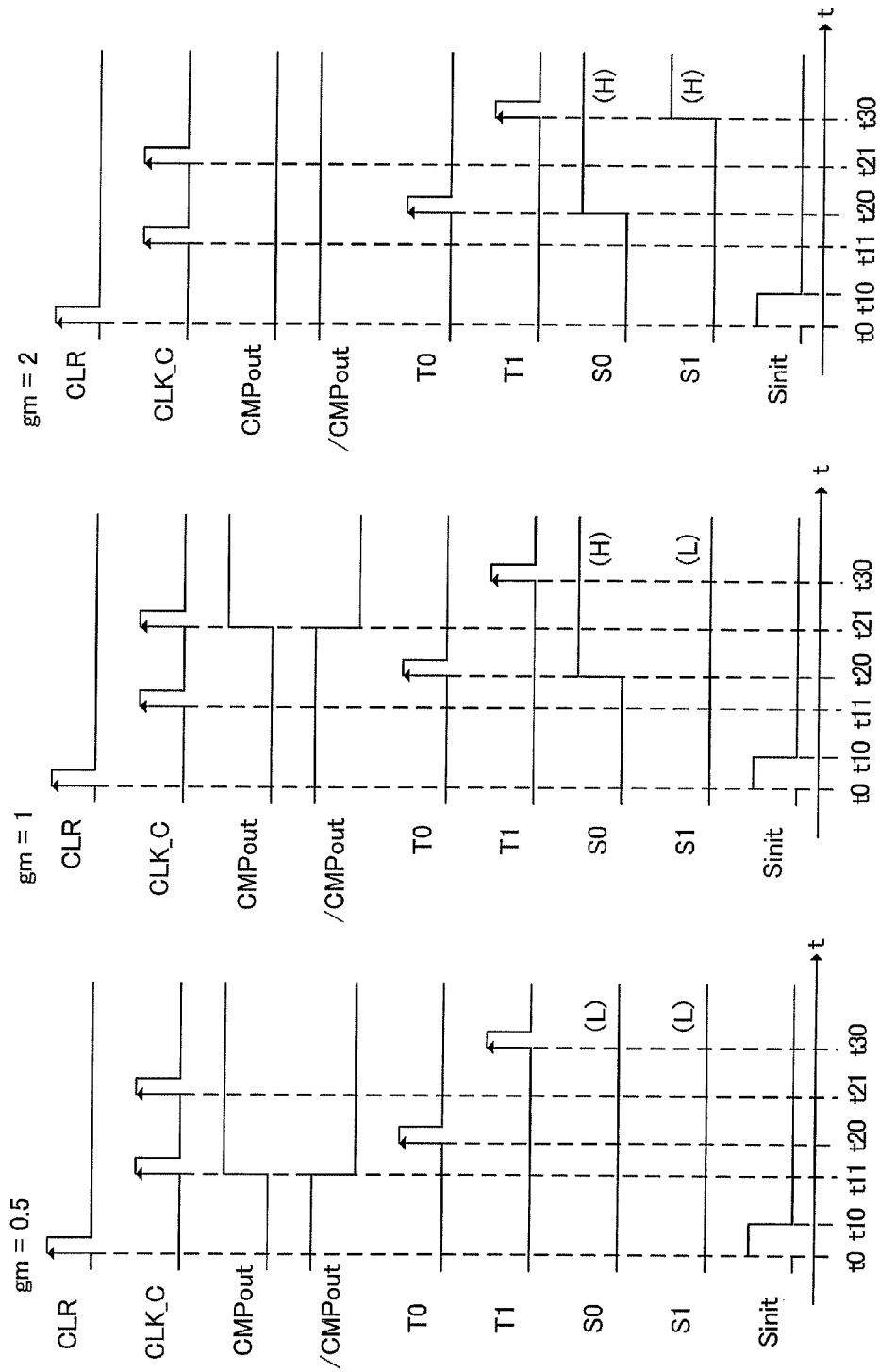

| | AMPLIFICATION FACTOR | | |
|---|---|---|---|
| | x2 | x1 | x0.5 |
| PGA 311(g1) | k1(x2) | k1(x1) | k1(x0.5) |
| PGA 321(g2) | k2(x2) | | |
| ⋮ | ⋮ | ⋮ | ⋮ |
| PGA 3n1(gn) | kn(x2) | | |

43

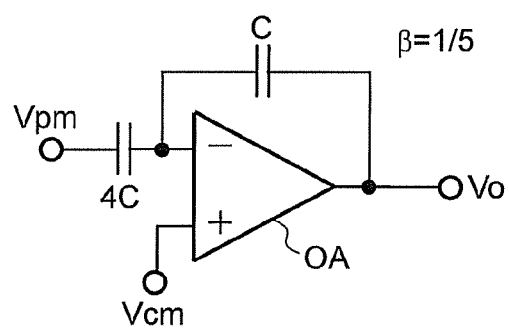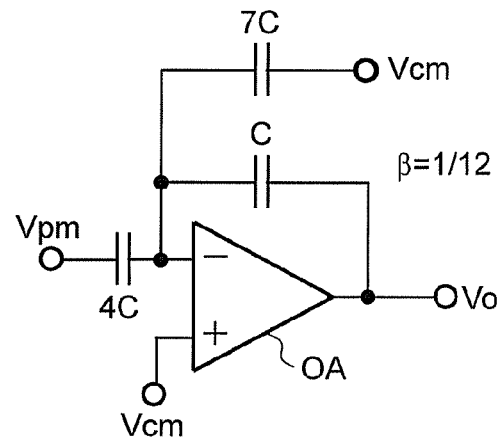
FIG. 19A                FIG. 19B
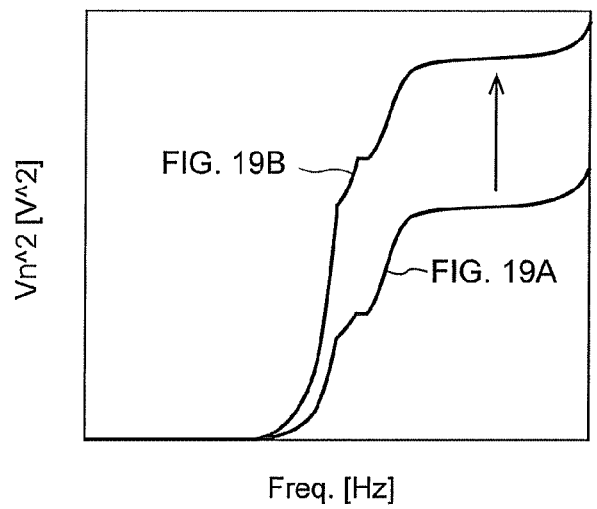
FIG. 19C

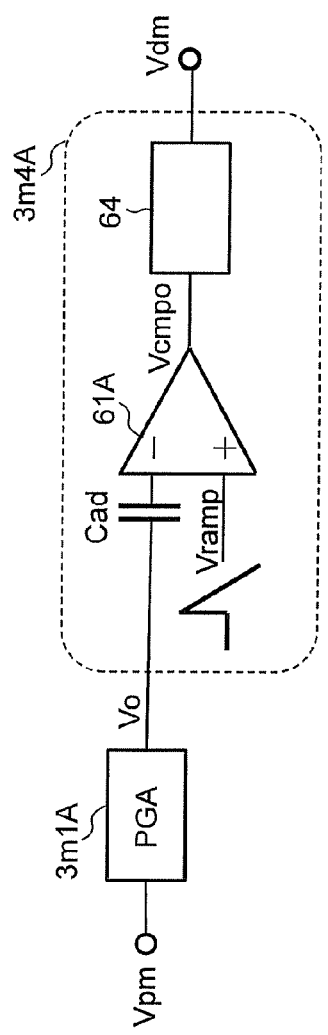
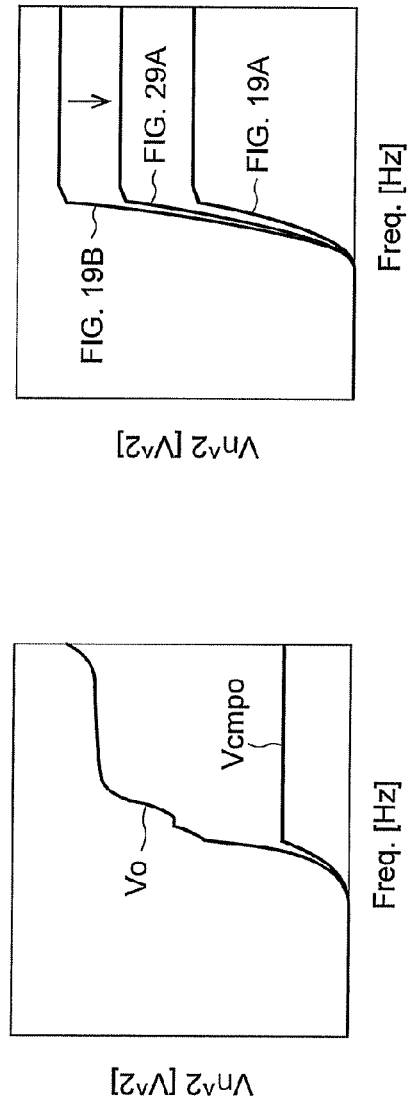
FIG. 29A
FIG. 29B
FIG. 29C

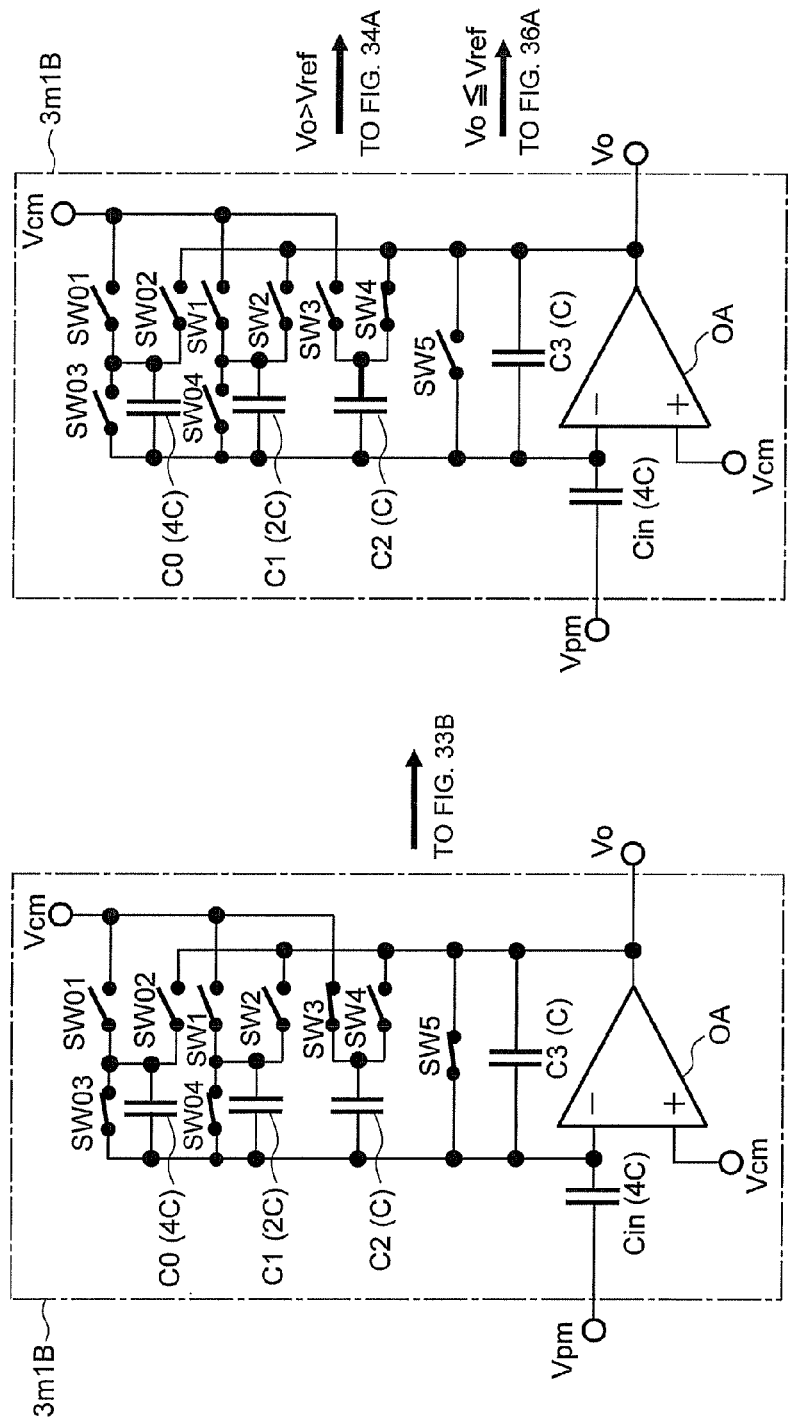

SEMICONDUCTOR INTEGRATED CIRCUIT AND IMAGE SENSOR

CROSS REFERENCE TO RELATED APPLICATION

This application is based upon and claims the benefit of priority from the prior Japanese Patent Application No. 2014-026720 filed on Feb. 14, 2014 and No. 2014-171865 filed on Aug. 26, 2014 in Japan, the entire contents of which are incorporated herein by reference.

FIELD

Embodiments described herein relate generally to a semiconductor integrated circuit and an image sensor.

BACKGROUND

In an image sensor, in many cases, analog pixel voltages are converted into digital signals, and digital signal processing is performed. When a pixel voltage is low, it is difficult to accurately convert the pixel voltage into a digital signal, and therefore, it is preferable to amplify the pixel voltage in advance. When the pixel voltage is low, the amplification factor is required to be set high, and when the pixel voltage is high, the amplification factor is required to be set low. Therefore, an amplifier of which amplification factor is variable is often used.

In this case, it is necessary to appropriately set the amplification factor. One of known setting methods includes applying various kinds of amplification factors to determine whether the output voltage from the amplifier is saturated or not, and selecting the maximum amplification factor at which the output voltage is not saturated.

However, in this method, the output voltage is saturated at least once. In such case, the pixel voltage needs to be read again, and it takes a long time to perform the amplification processing.

BRIEF DESCRIPTION OF THE DRAWINGS

FIGS. 10A, 10B and 10C are timing charts illustrating each signal of the control unit $3m3$.

FIG. 19A is circuit diagram illustrating an ideal amplification circuit where the amplification factor is "4", FIG. 19B is an equivalent circuit diagram illustrating the amplification unit based on the first embodiment where the amplification factor is "4", and FIG. 19C is a figure illustrating noise of the output voltage of the circuit of FIGS. 19A, 19B.

FIGS. 29A, 29B and 29C are diagrams illustrating an example of a configuration of an AD conversion unit according to a fourth embodiment.

FIG. 33A illustrates operation of the amplification unit in the initialization phase, and FIG. 33B is a figure, subsequent to FIG. 33A, for explaining operation of the amplification unit.

DETAILED DESCRIPTION

According to an embodiment, a semiconductor integrated circuit includes an amplification unit, a comparison unit and a control unit. The amplification unit is configured to amplify a pixel value with an amplification factor that is set in a variable manner, the pixel value being according to an intensity of light irradiated on a pixel. The comparison unit is configured to compare an output value given by the amplification unit and a reference value. The control unit is configured to cause the amplification factor to be higher than a present amplification factor, only when the output value given by the amplification unit is not saturated even where the amplification factor is caused to be higher than the present amplification factor, based on the comparison result of the comparison unit.

Embodiments will now be explained with reference to the accompanying drawings.

First Embodiment

Figure 1:
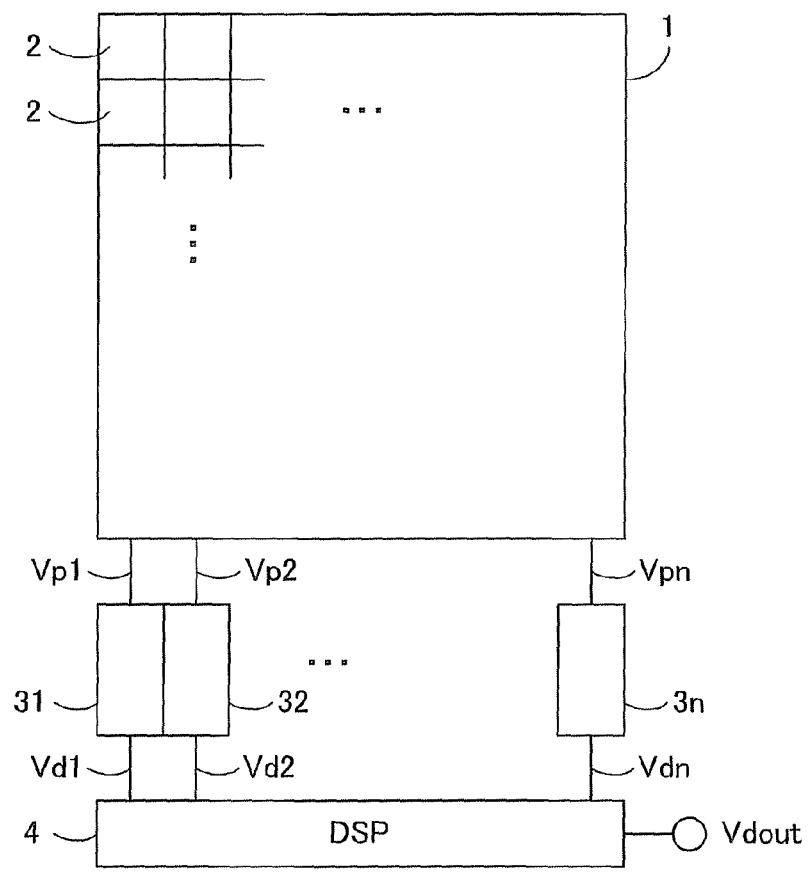
FIG. 1 is a block diagram illustrating a schematic configuration of an image sensor.

FIG. 1 is a block diagram illustrating a schematic configuration of an image sensor. The image sensor includes a pixel array 1, column processing units 31 to 3n and a digital signal processing unit (DSP) 4. All or a part of the image sensor may be formed as a semiconductor integrated circuit.

The pixel array 1 is constituted by multiple pixels 2 arranged in a row direction and a column direction. Each pixel 2 outputs a voltage according to the intensity of light irradiated thereon. A voltage, that is output by the pixel 2 when the light is not irradiated at all or the intensity of the light is extremely weak, is defined as a reset voltage. In this case, the higher the intensity of the light is, the higher the absolute value of difference between the reset voltage and the output voltage of the pixel becomes. In the explanation below, the absolute value of the voltage difference is denoted as a pixel voltage (pixel value) Vp. The reason why the absolute value is denoted as Vp is because, when the light is emitted, the output voltage of the pixel may increase to be more than the reset voltage or may decrease to be less than the reset voltage depending on the configuration of the pixel 2. The present invention can be applied to both of the cases. In the explanation below, n pixels 2 are considered to be arranged in the row direction, and the number of columns is considered to be n. The pixel voltage given by a pixel 2 which belongs to the m-th column (m=1 to n) will be denoted as Vpm (in this specification, "m" attached to the end of another parameter also indicates that the parameter in question is related to the m-th column).

The column processing units 31 to 3n are arranged in association with the columns of the pixel array 1. The column processing unit 3m receives a pixel voltage Vpm which is output from one of the pixels 2 which belongs to the corresponding m-th column. Then, the column processing unit 3m amplifies the pixel voltage Vpm by applying an amplification factor gm thereto. This amplification factor gm is variable, and the method for setting the amplification factor gm will be explained later. Further, the column processing unit 3m converts the amplified pixel voltage into a digital value Vdm.

In view of the applied amplification factors g1 to gn, the digital signal processing unit 4 processes the digital values Vd1 to Vdn, and outputs a digital value Vdout, as a serial, which is proportional to the pixel voltages Vp1 to Vpn.

In the image sensor, the pixel voltage Vpm which is output from a pixel 2 receiving weak light (which is dark) is low. Therefore, it is necessary to increase the amplification factor gm of the column processing unit 3m to reduce the noises. On the other hand, the pixel voltage Vpm which is output from a pixel 2 receiving strong light (which is bright) is high. Therefore, it is necessary to reduce the amplification factor gm of the column processing unit 3m to prevent blown-out highlights.

In view of the above, the amplification factor gm is preferably set at the highest level as long as blown-out highlights do not appear. In the explanation below, the method for setting the amplification factor gm of the column processing unit 3m will be explained in details.

Figure 2:
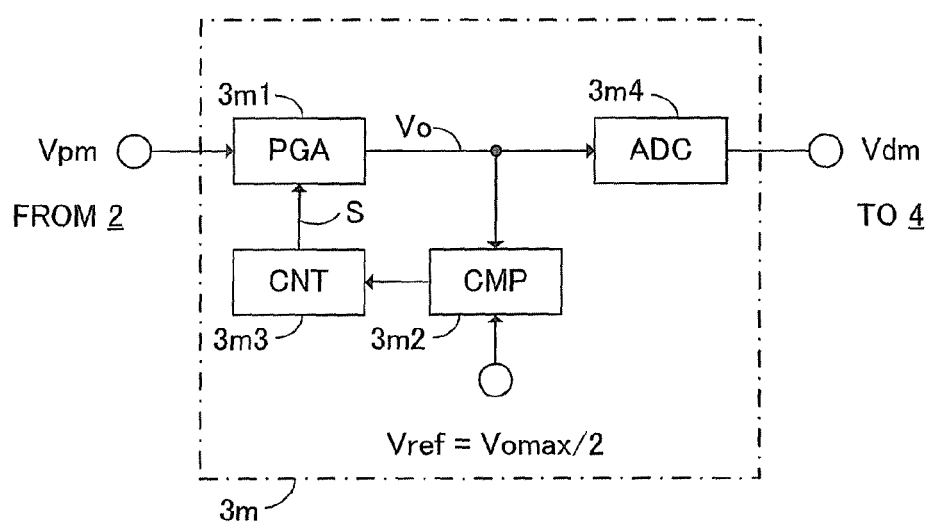
FIG. 2 is a block diagram illustrating an example of an internal configuration of a column processing unit $3m$ according to a first embodiment.

FIG. 2 is a block diagram illustrating an example of an internal configuration of a column processing unit 3m according to a first embodiment. The column processing unit 3m includes a programmable gain amplification unit 3m1 (Programmable Gain Amplifier, PGA, which will be hereinafter simply referred to as an amplification unit), a comparison unit 3m2 (CMP), a control unit 3m3 (CNT), and an AD conversion unit 3m4 (ADC).

The amplification unit 3m1 amplifies the pixel voltage Vpm given by the pixel 2 by the amplification factor gm which is set by a control signal S given by the control unit 3m3. More specifically, the amplification unit 3m1 outputs, as an output voltage Vo, a product Vpm*gm of the pixel voltage Vpm and the amplification factor gm. The amplification factor gm is variable, and may be any value in multiple steps in accordance with the control signal S. In the present embodiment, the amplification factor gm is a value of a power of two. More specifically, the present embodiment shows a case where it is set to any one of "0.5" (minimum amplification factor), "1", and "2" (maximum amplification factor).

The comparison unit 3m2 compares the output voltage Vo given by the amplification unit 3m1 and a predetermined reference voltage Vref. A comparison result indicating the relationship in terms of magnitude between the output voltage Vo and the reference voltage Vref is provided to the control unit 3m3. When the amplification factor is set to a value of a power of two, the reference voltage Vref is set to ½ of the maximum voltage value Vomax that can be output by the amplification unit 3m1.

The control unit 3m3 generates a control signal S according to the comparison result of the comparison unit 3m2, and sets the amplification factor gm of the amplification unit 3m1. More specifically, in a case where the output voltage Vo given by the amplification unit 3m1 is not saturated even if an amplification factor which is one step higher than the present amplification factor gm is applied, the control unit 3m3 sets the control signal S so that the amplification factor is one step higher than the present amplification factor gm. As necessary, the control unit 3m3 increases the amplification factor gm in multiple steps. On the other hand, in a case where the output voltage Vo given by the amplification unit 3m1 is saturated if an amplification factor which is one step higher than the present amplification factor gm is applied, the control unit 3m3 does not change the amplification factor.

In this case, "saturated" means a state in which the amplification unit 3m1 cannot generate the output voltage Vo proportional to the pixel voltage Vpm because the product of the pixel voltage Vpm and the amplification factor gm is more than the maximum voltage value Vomax. When the output of the amplification unit 3m1 is saturated, the intensity of the light irradiated on the pixel 2 cannot be accurately output. Therefore, it is necessary to perform control so that the output voltage Vout is not saturated.

After the amplification factor gm is determined, the AD conversion unit 3m4 converts the output voltage Vo given by the amplification unit 3m1 into a digital value Vdm. It should be noted that, after the maximum time required for determining the amplification factor gm elapses, the AD conversion unit 3m4 may start the AD conversion processing, or upon reception of a signal indicating that the amplification factor gm is determined from the control unit 3m3, the AD conversion unit 3m4 may start the AD conversion processing.

Figure 3:
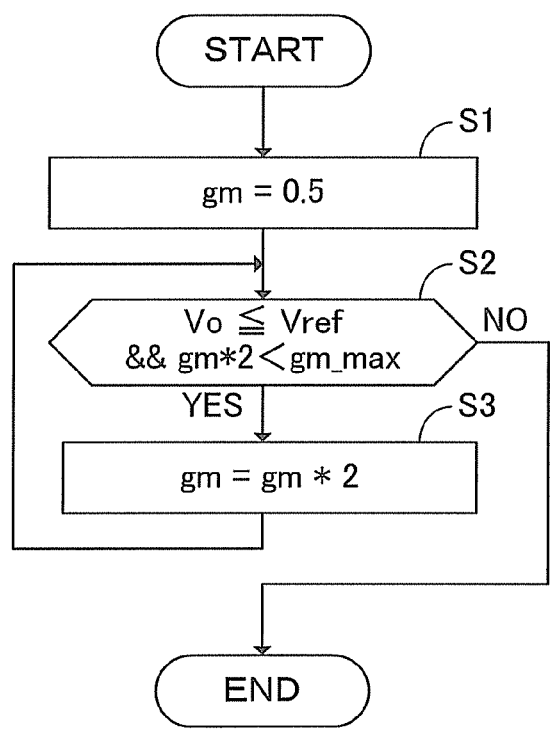
FIG. 3 is a flowchart illustrating an example of processing operation of a control unit $3m3$.

FIG. 3 is a flowchart illustrating an example of processing operation of the control unit 3m3. As the initial setting, the control unit 3m3 sets the amplification factor gm to the minimum value "0.5" (step S1).

When the output voltage Vo given by the amplification unit 3m1 is equal to or less than the reference voltage Vref (=Vomax/2), and a value obtained by doubling the present amplification factor gm is less than the maximum amplification factor gm_max that can be set (step 2, YES), the output voltage Vo is not more than the maximum voltage Vomax even if the value obtained by doubling the present amplification factor gm is adopted as the amplification factor. Therefore, the control unit 3m3 changes the amplification factor to the value obtained by doubling the present amplification factor gm (step S3). For example, when the present amplification factor gm is "0.5" which is the initial setting, the control unit 3m3 doubles the amplification factor gm to change it to "1".

Then, until the output voltage Vo becomes more than the reference voltage Vref, or the value obtained by doubling the present amplification factor gm becomes equal to or more than the maximum amplification factor gm_max that can be set, the control unit 3m3 repeats this processing (step S2, YES, S3).

When the output voltage Vo is more than the reference voltage Vref (step S2, NO), if the value obtained by doubling the present amplification factor gm is adopted as the amplification factor, the output voltage Vo is more than the maximum voltage Vomax, and the output voltage Vo is saturated. When the value obtained by doubling the present amplification factor gm becomes equal to or more than the maximum amplification factor gm_max that can be set (step S2, NO), the amplification factor gm cannot be increased. Therefore, the control unit 3m3 terminates the processing without still more increasing the amplification factor gm. Therefore, the amplification factor gm is determined.

In a more general case, the reference voltage Vref is set to 1/q (q is a number more than one) of the maximum voltage value Vomax. Then, in step S3, the control unit 3m3 may perform control so that the amplification factor is changed to q times the present amplification factor gm.

As a result of such processing, the amplification factor gm can be increased to the limitation at which the output voltage Vo of the amplification unit 3m1 is not saturated. Since the output voltage Vo of the amplification unit 3m1 is not saturated, blown-out highlights can be prevented from appearing in a pixel 2 received strong light is prevented. In addition, since the amplification factor gm can be increased, noise can be reduced in a pixel 2 received weak light. Since the column processing unit 3m controls the amplification factor gm for each pixel 2, the amplification factor gm optimum for each pixel 2 can be set.

Another method for setting the amplification factor is considered to be a method applying various kinds of amplification factors to inspect whether the output voltage is saturated or not, and selecting the maximum amplification factor at which the output voltage is not saturated. However, in this method, the output voltage is saturated at least once. Then, it is necessary to read the pixel voltage again, and it takes a long time to perform the amplification processing.

In contrast, in the present embodiment, before the output voltage is saturated, the control unit 3m3 does stop increasing the amplification factor gm. Therefore, as compared with the above method, extremely superior effect of capable of setting the optimum amplification factor gm quickly can be obtained.

A specific example of the amplification unit 3m1, the control unit 3m3, and the AD conversion unit 3m4 will be hereinafter explained.

Figure 4:
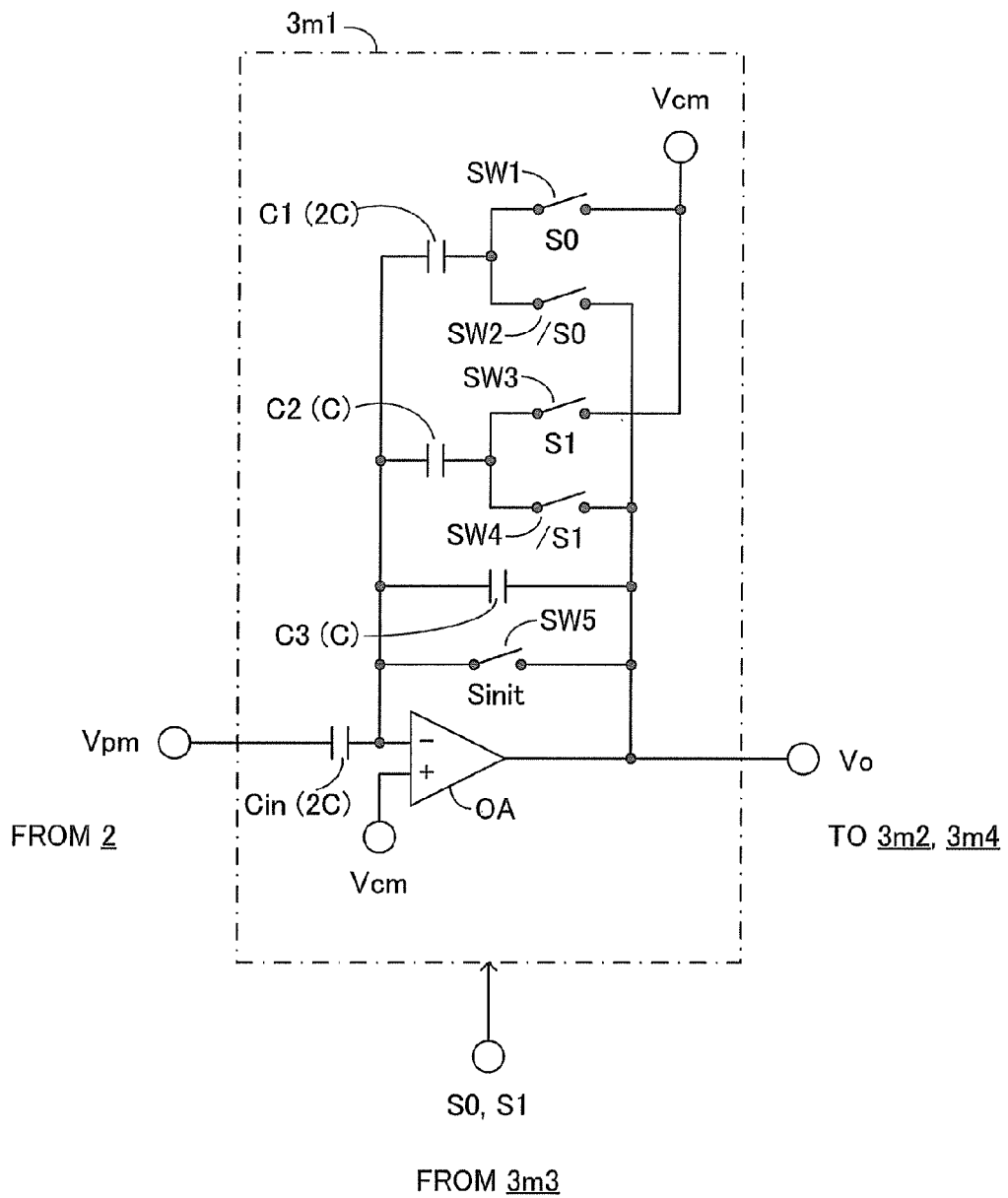
FIG. 4 is a circuit diagram illustrating an example of internal configuration of an amplification unit $3m1$.

FIG. 4 is a circuit diagram illustrating an example of internal configuration of the amplification unit 3m1. This amplification unit 3m1 can change the amplification factor gm to any one of "0.5", "1", and "2". The amplification unit 3m1 includes capacitors Cin, C1, C2, C3, an operational amplifier OA, and switches SW1 to SW5.

The capacitance of the capacitor (input capacitor) Cin is 2C. One end of the capacitor Cin receives the pixel voltage Vpm, and the other end is connected to the inverting input terminal of the operational amplifier OA. The non-inverting input terminal of the operational amplifier OA receives the common voltage Vcm. The common voltage Vcm is, for example, about ½ of the power supply voltage of the operational amplifier OA.

The capacitance of the capacitor (switching capacitor) C1 is 2C. One end of the capacitor C1 is connected to the inverting input terminal of the operational amplifier OA, and the other end is connected to ends of the switches SW1, SW2. The other end of the switch SW1 receives the common voltage Vcm. When the control signal S0 is high, the switch SW1 is ON, and when the control signal S0 is low, the switch SW1 is OFF. The other end of the switch SW2 is connected to the output terminal of the operational amplifier OA. When the control signal /S0 is high, the switch SW2 is ON, and when the control signal /S0 is low, the switch SW2 is OFF. In this specification, the control signal /S0 means a logic inverting signal of the control signal S0, and "/" of other signals mean the same.

The capacitance of the capacitor (switching capacitor) C2 is C. One end of the capacitor C2 is connected to the inverting input terminal of the operational amplifier OA, and the other end is connected to ends of the switches SW3, SW4. The other end of the switch SW3 receives the common voltage Vcm. When the control signal S1 is high, the switch SW3 is ON, and when the control signal S1 is low, the switch SW3 is OFF. The other end of the switch SW4 is connected to the output terminal of the operational amplifier OA. When the control signal /S1 is high, the switch SW4 is ON, and when the control signal /S1 is low, the switch SW4 is OFF.

The capacitance of the capacitor C3 is C. One end of the capacitor C3 is connected to the inverting input terminal of the operational amplifier OA, and the other end is connected to the output terminal of the operational amplifier OA. One end of the switch (first reset switch) SW5 is connected to the inverting input terminal of the operational amplifier OA, and the other end is connected to the output terminal of the operational amplifier OA. When the initialization signal Sinit is high, the switch SW5 is ON, and when the initialization signal Sinit is low, the switch SW5 is OFF.

In this case, the control signals S0, S1 are generated by the control unit 3m3. The initialization signal Sinit is generated by an initialization circuit, not shown.

Figures 5A, 5B:
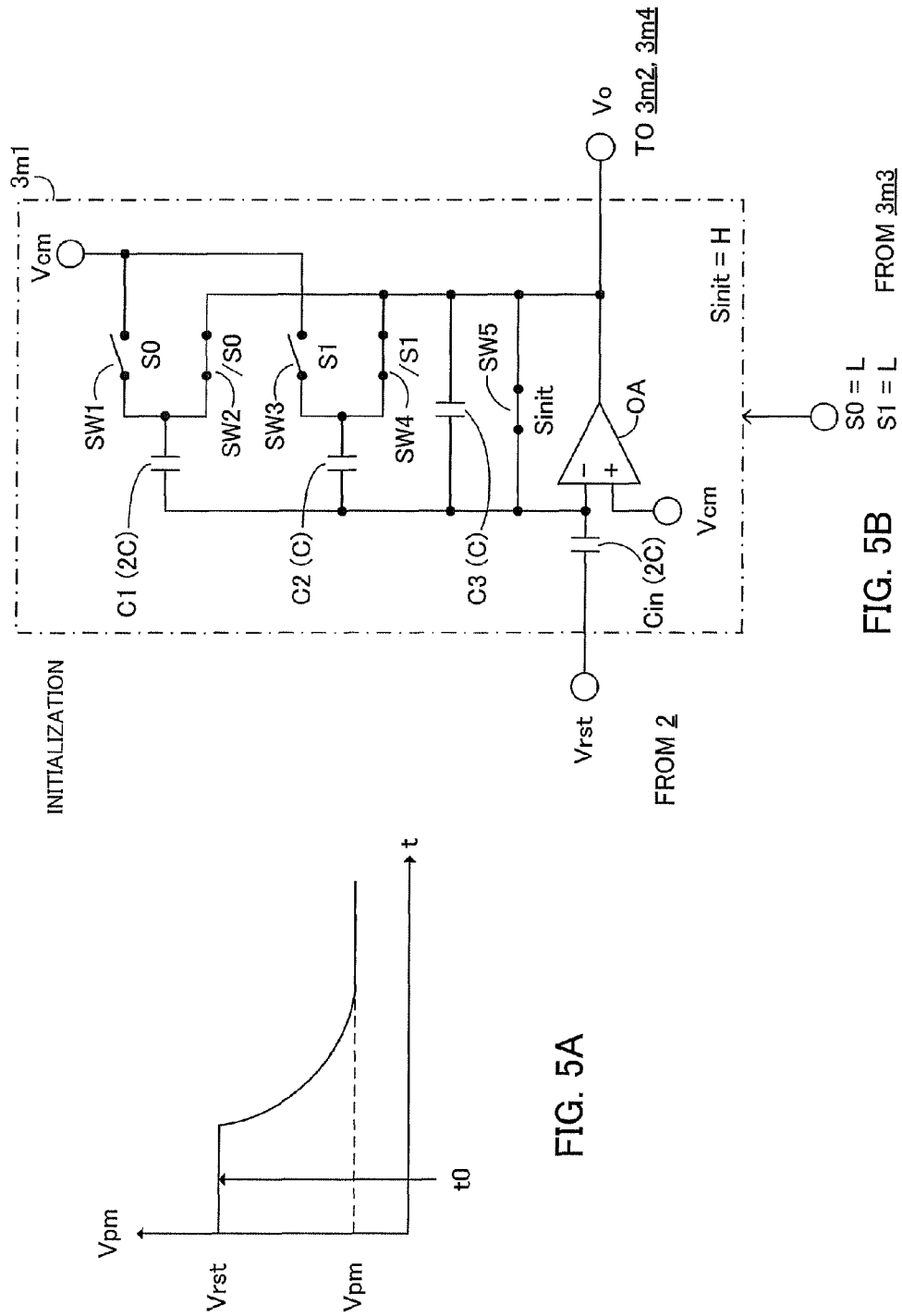
FIGS. 5A and 5B are figures for explaining operation of the amplification unit $3m1$ of FIG. 4.

FIGS. 5A and 5B are figures for explaining operation of the amplification unit 3m1 of FIG. 4. As shown in FIG. 5A, first, the pixel 2 outputs the reset voltage Vrst (t=t0), and subsequently, outputs the pixel voltage Vpm. The reset voltage Vrst is a pixel voltage that is output when no light is irradiated on the pixel 2, for example.

FIG. 5B illustrates operation of the amplification unit 3m1 at an initial phase (t=t0) for sampling the reset voltage Vrst. As shown in the figure, in the initial phase, the control signals S0, S1 are set to low, and the initialization signal Sinit is set to high. Accordingly, the switches SW2, SW4, SW5 are ON, and the switches SW1, SW3 are OFF.

The inverting input terminal of the operational amplifier OA and the output terminal are shorted by the switch SW5. Therefore, Vo is Vcm. At this occasion, the potential of each of all the terminals of the capacitors C1 to C3 is Vcm, and the potential difference between the terminals is zero. Therefore, the charges accumulated in the capacitors C1 to C3 are initialized to zero. In the capacitor Cin, the charge Q0 as shown in the following expression (3) is accumulated.

$$Q0 = 2C(Vrst - Vcm) \quad (3)$$

In the initialization phase, the potential difference between the terminals of the capacitors C1 to C3 may be zero. Therefore, unlike FIG. 5B, the switches SW1, SW3 may be ON, and the switches SW2, SW4 may be OFF.

Figures 6A, 6B:
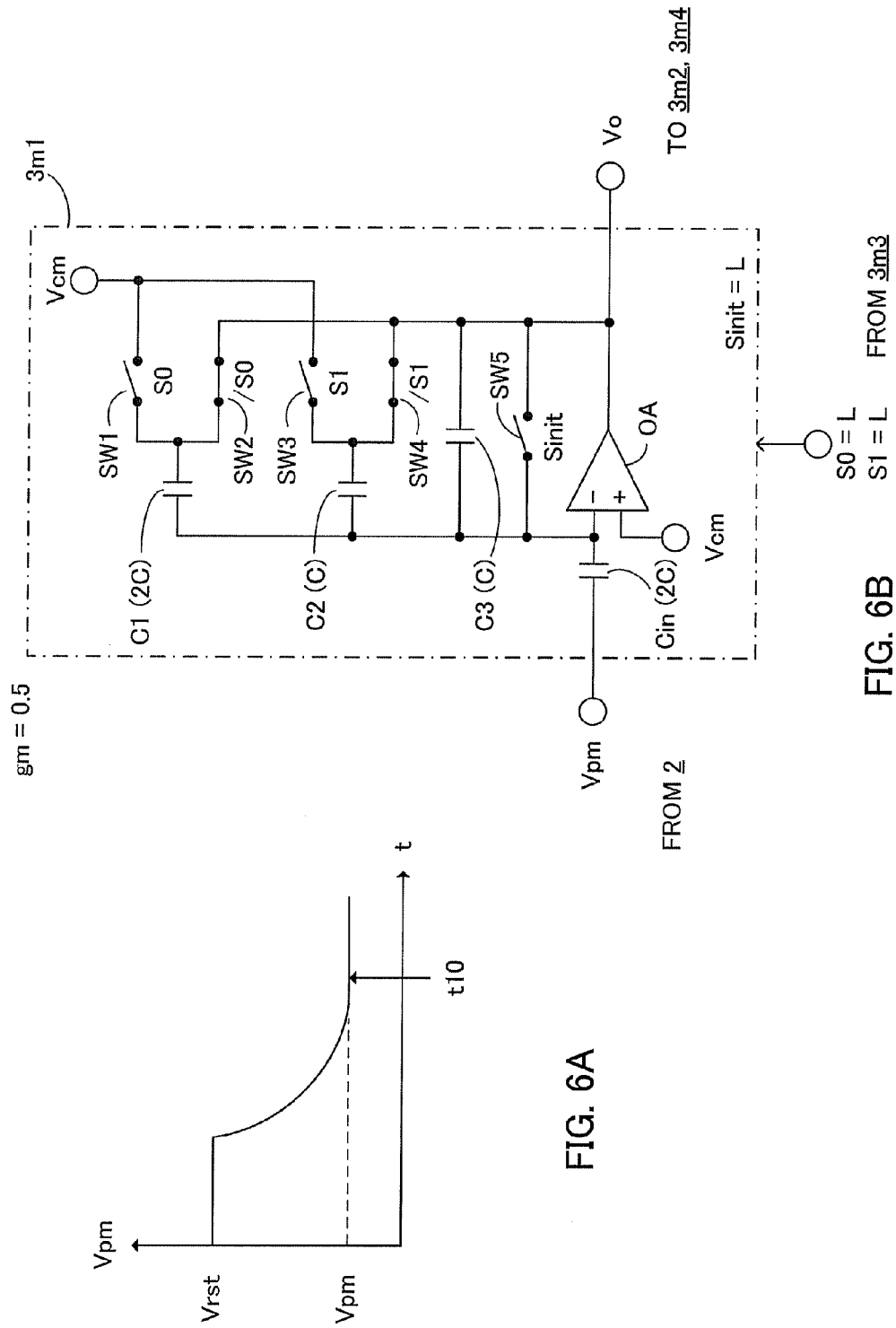
FIGS. 6A and 6B are figures, subsequent to FIGS. 5A and 5B, for explaining operation of the amplification unit $3m1$.

FIGS. 6A and 6B are figures, subsequent to FIGS. 5A and 5B, for explaining operation of the amplification unit 3m1. FIG. 6B illustrates operation of the amplification unit 3m1 in a case where the pixel voltage Vpm is amplified by applying the minimum amplification factor gm of "0.5" to the pixel voltage Vpm.

After the reset voltage Vrst is sampled in the initial phase, the pixel voltage Vpm is input (time t10 in FIG. 6A). Then, the initialization signal Sinit is set to low, and the switch SW5 changes to OFF. On the other hand, the control signals S0, S1 are still low, and like FIG. 6B, the switches SW1, SW3 are OFF, and the switches SW2, SW4 are ON.

At this occasion, the charge of the inverting input terminal of the operational amplifier OA is conserved. Therefore, the following expression (4) is satisfied.

$$Vo - Vcm = 2C/(C + C + 2C) * (Vrst - Vpm) \quad (4)$$
$$= 0.5 * (Vrst - Vpm)$$

This expression (4) means that the amplification factor gm is "0.5".

The output voltage Vo at this occasion is compared with the reference voltage Vref. When the output voltage Vo is more than the reference voltage Vref (=Vomax/2) (YES in step S2 in FIG. 3), the control unit 3m3 does not change the control signals S0, S1. On the other hand, when the output voltage Vo is equal to or less than the reference voltage Vref (=Vomax/2) (NO in step S2 in FIG. 3), the control unit 3m3 sets the control signal S0 to high and sets the control signal S1 to low so that the amplification factor gm is set to "1".

Figures 7A, 7B:
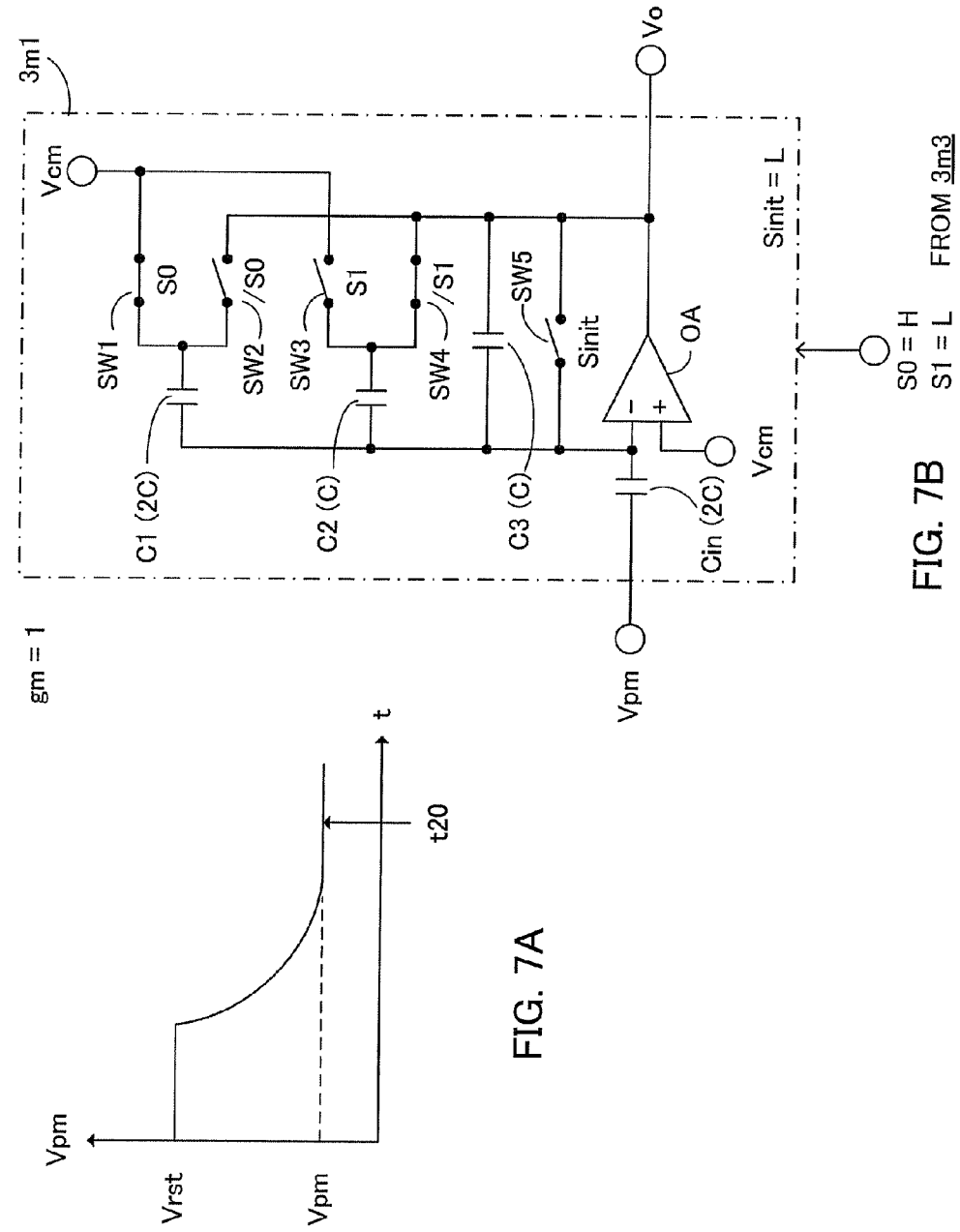
FIGS. 7A and 7B are figures, subsequent to FIGS. 6A and 6B, for explaining operation of the amplification unit $3m1$.

FIGS. 7A and 7B are figures, subsequent to FIGS. 6A and 6B, for explaining operation of the amplification unit 3m1. FIG. 7B illustrates operation of the amplification unit 3m1 in a case where the pixel voltage Vpm is amplified by applying the amplification factor gm of "1" to the pixel voltage Vpm.

At a time t20 in FIG. 7A, the switch SW1 is turned ON and the switch SW2 is turned OFF in accordance with the control signal S0. The other switches SW3 to SW5 are the same as those in FIG. 6B. At this occasion, the charge at the inverting input terminal of the operational amplifier OA is conserved. Therefore, the following expression (5) is satisfied.

$$Vo - Vcm = 2C/(C + C) * (Vrst - Vpm) \quad (5)$$
$$= (Vrst - Vpm)$$

This expression (4) means that the amplification factor gm is "1".

The output voltage Vo at this occasion is compared with the reference voltage Vref. When the output voltage Vo is more than the reference voltage Vref (=Vomax/2) (YES in step S2 in FIG. 3), the control unit 3m3 does not change the control signals S0, S1. On the other hand, when the output voltage Vo is equal to or less than the reference voltage Vref (=Vomax/2) (NO in step S2 in FIG. 3), the control unit 3m3 sets the control signals S0, S1 to high so that the amplification factor gm is set to "2".

Figure 8B:
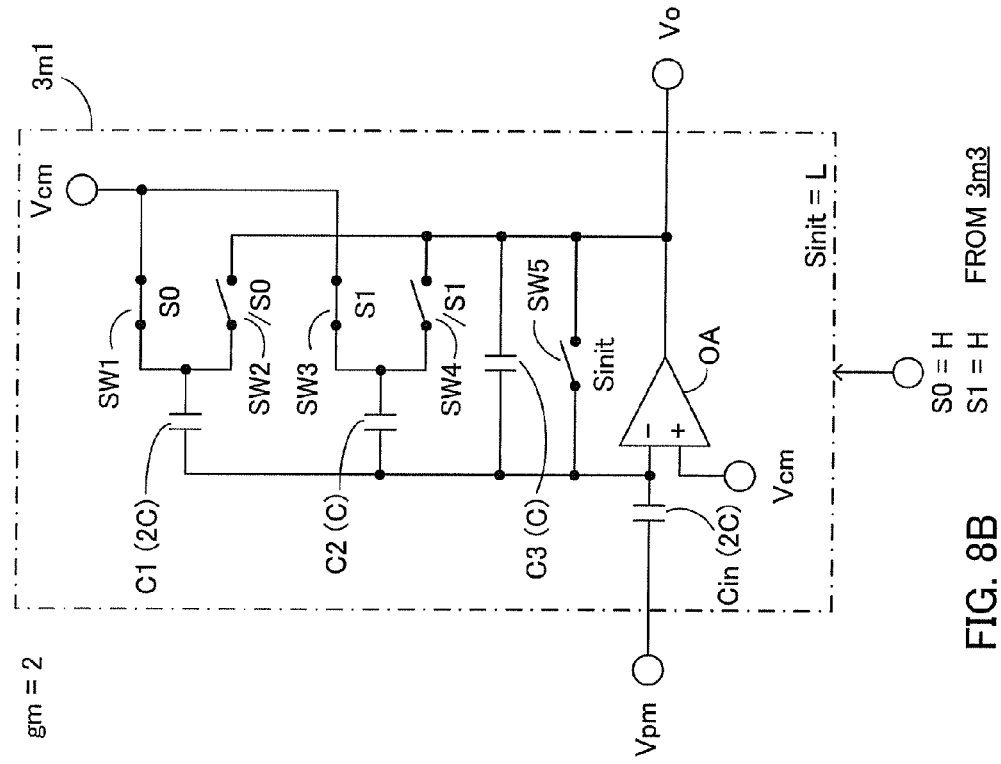
FIGS. 8A and 8B are figures, subsequent to FIGS. 7A and 7B, for explaining operation of the amplification unit $3m1$.
Figure 8A:
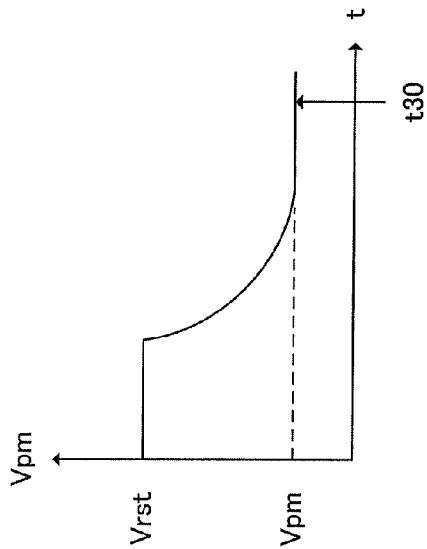

FIGS. 8A and 8B are figures, subsequent to FIGS. 7A and 7B, for explaining operation of the amplification unit 3m1.

FIG. 8B illustrates operation of the amplification unit 3m1 in a case where the pixel voltage Vpm is amplified by applying the amplification factor gm of "2" to the pixel voltage Vpm.

At a time t30 in FIG. 8A, the switches SW1, SW3 are turned ON and the switches SW2, SW4 are turned OFF in accordance with the control signals S0, S1. The switch SW5 keeps the OFF state.

At this occasion, the charge at the inverting input terminal of the operational amplifier OA is conserved. Therefore, the following expression (6) is satisfied.

$$Vo - Vcm = 2C/C*(Vrst - Vpm) \quad (6)$$
$$= 2(Vrst - Vpm)$$

This means that the amplification factor gm is "2".

As described above, in the circuit as shown in FIG. 4, the amplification factor gm is set variably in accordance with the control signals S0, S1.

In the present embodiment, for example, the amplification factor gm takes three values, which are "0.5", "1", and "2" for the sake of simplicity of explanation. In reality, the amplification factor gm is desired to be set variably over a wide range. For example, the amplification factor gm may take six values, which are "0.25", "0.5", "1", "2", "4", and "8". In this case, in the circuit as shown in FIG. 4, capacitors having appropriate capacitances and switches may be additionally provided as necessary.

Figure 9:
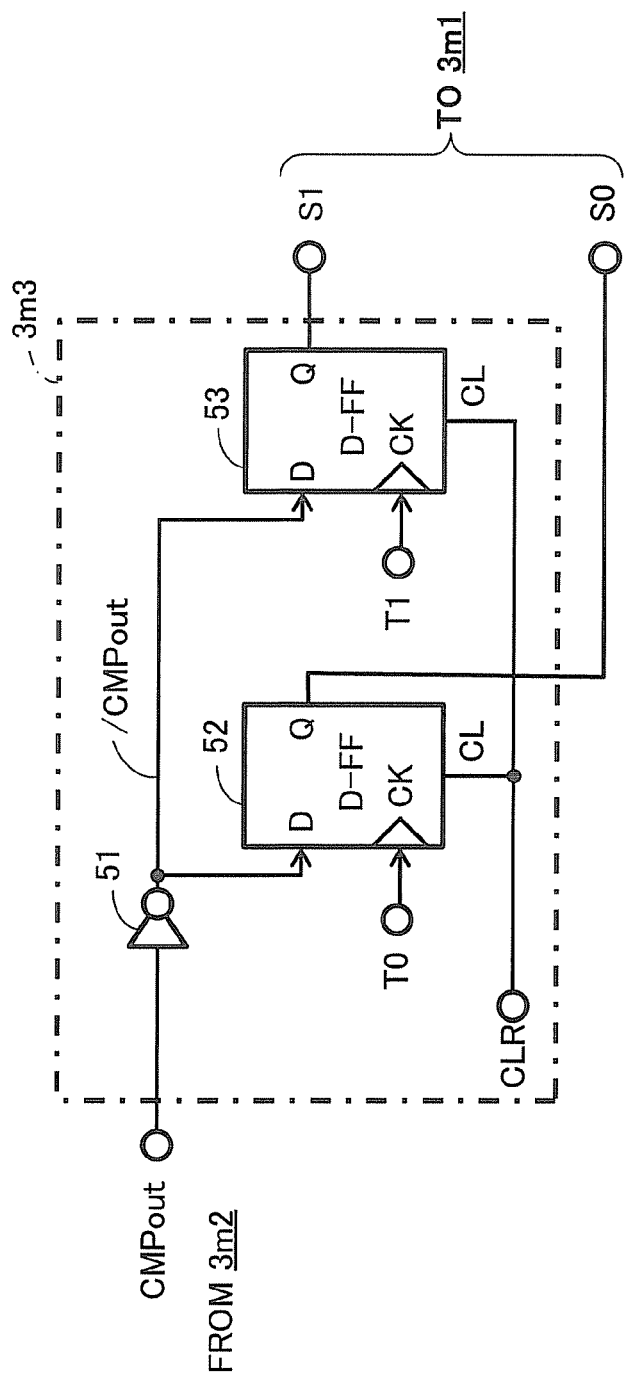
FIG. 9 is a circuit diagram illustrating an example of internal configuration of the control unit $3m3$.

FIG. 9 is a circuit diagram illustrating an example of internal configuration of the control unit 3m3. This control unit 3m3 generates the control signals S0, S1 for the amplification unit 3m1 as shown in FIG. 4 The control unit 3m3 includes an inverter 51, and D flip flops with clear (D-FF) 52, 53.

The inverter 51 inverts a signal CMPout which is output from the comparison unit 3m2 of FIG. 2, and generates a signal /CMPout. In this case, the signal CMPout is a signal indicating a comparison result, and in a case where Vo>Vref holds, the signal CMPout is set to high, and in a case where Vo≤Vref holds, the signal CMPout is set to low.

In the D-FF 52, a D terminal receives the signal /CMPout, a clock terminal CK receives the signal T0, and a clear terminal CL receives the clear signal CLR. A Q terminal outputs the control signal S0.

In the D-FF 53, a D terminal receives the signal /CMPout, a clock terminal CK receives the signal T1, and a clear terminal CL receives the clear signal CLR. A Q terminal outputs the control signal S1.

FIGS. 10A to 10C are timing charts illustrating each signal of the control unit 3m3. FIG. 10A is a timing chart illustrating a case where the amplification factor gm is set to "0.5" because the pixel voltage Vpm is sufficiently high, and FIG. 10A corresponds to FIGS. 6A and 6B. FIG. 10B is a timing chart illustrating a case where the amplification factor gm is set to "1" because the pixel voltage Vpm is about middle level, and FIG. 10B corresponds to FIGS. 7A and 7B. FIG. 10C is a timing chart illustrating a case where the amplification factor gm is set to "2" because the pixel voltage Vpm is sufficiently low, and FIG. 10C corresponds to FIGS. 8A and 8B.

In the figure, in synchronization with the rise of the comparator clock CLK_C, the comparison unit 3m2 performs comparison, and updates the signal CMPout.

At the time t0, in synchronization with the rise of the clear signal CLR, the D-FFs 51, 52 set both of the control signals S1, S1 to low. The initialization signal Sinit is set to high. Accordingly, the initialization as shown in FIG. 5B is performed.

Subsequently, at the time t10, the initialization signal Sinit is set to low. Accordingly, the amplification unit 3m1 is configured to have the amplification factor gm of "0.5" as shown in FIG. 6B. The explanation below will be made in each of the cases of FIGS. 10A, 10B, and 10C.

First, the case where the pixel voltage Vpm is sufficiently high in FIG. 10A will be explained. While the amplification factor gm is "0.5", the comparison unit 3m2 updates the signal CMPout in synchronization with the rise of the comparator clock CLK_C at the time t11. In FIG. 10A, the pixel voltage Vpm is considered to be sufficiently high, and Vo>Vref is considered to be satisfied. Therefore, at the time t11, the signal CMPout is set to high. Accordingly, the signal /CMPout is set to low.

Thereafter, at the time t20, the signal T0 rises. At this occasion, the signal /CMPout is low, and therefore, the control signal S0 which is output from the Q terminal by the D-FF 51 is still low. Therefore, the amplification unit 3m1 still has the amplification factor gm of "0.5" shown in FIG. 6B.

Further, the comparison unit 3m2 updates the signal CMPout in synchronization with the rise of the comparator clock CLK_C at the time t21. In FIG. 10A, Vo>Vref is also satisfied. Therefore, at the time t21, the signal CMPout is set to high. Accordingly, the signal /CMPout is set to low.

Thereafter, at the time t30, the signal T1 rises. At this occasion, the signal /CMPout is low, and therefore, the control signal S1 which is output from the Q terminal by the D-FF 52 is still low. Therefore, the amplification unit 3m1 still has the amplification factor gm of "0.5" as shown in FIG. 6B.

As described above, ultimately, both of the control signals S0, S1 become low, and the amplification factor gm of the amplification unit 3m1 is determined to be "0.5".

Subsequently, the case where the pixel voltage Vpm is about the middle level in FIG. 10B will be explained.

While the amplification factor gm is "0.5", the comparison unit 3m2 updates the signal CMPout in synchronization with the rise of the comparator clock CLK_C at the time t11. In FIG. 10B, the pixel voltage Vpm is considered to about the middle level, and Vo≤Vref is considered to be satisfied in the amplification factor gm is 0.5. Therefore, at the time t11, the signal CMPout is set to high. Accordingly, at the time t11, the signal CMPout is set to low. Therefore, the signal /CMPout is set to high.

Thereafter, at the time t20, the signal T0 rises. At this occasion, the signal /CMPout is high, and therefore, the control signal S0 which is output from the Q terminal by the D-FF 51 is set to high. Therefore, the amplification unit 3m1 still has the amplification factor gm of "1" shown in FIG. 7B.

Further, the comparison unit 3m2 updates the signal CMPout in synchronization with the rise of the comparator clock CLK_C at the time t21. In a case where the amplification factor gm is "1", Vo>Vref is considered to be satisfied. Therefore, at the time t21, the signal CMPout is set to high. Therefore, the signal /CMPout is set to low.

Thereafter, at the time t30, the signal T1 rises. At this occasion, the signal /CMPout is low, and therefore, the control signal S1 which is output from the Q terminal by the D-FF 52 is still low. Therefore, the amplification unit 3m1 still has the amplification factor gm of "1" as shown in FIG. 7B.

As described above, ultimately, the control signal S0 becomes high, and the control signal S1 becomes low, and the amplification factor gm of the amplification unit 3m1 is determined to be "1".

Subsequently, the case where the pixel voltage Vpm is sufficiently low in FIG. 10C will be explained.

While the amplification factor gm is "0.5", the comparison unit 3m2 updates the signal CMPout in synchronization with the rise of the comparator clock CLK_C at the time t11. In FIG. 10C, the pixel voltage Vpm is considered to be sufficiently low, and Vo≤Vref is considered to be satisfied. Therefore, at the time t11, the signal CMPout is set to low. Accordingly, the signal /CMPout is set to high.

Thereafter, at the time t20, the signal T0 rises. At this occasion, the signal /CMPout is high, and therefore, the control signal S0 which is output from the Q terminal by the D-FF 51 is set to high. Therefore, the amplification unit 3m1 has the amplification factor gm of "1" shown in FIG. 7B.

Further, the comparison unit 3m2 updates the signal CMPout in synchronization with the rise of the comparator clock CLK_C at the time t21. Since Vo≤Vref is also satisfied, the signal CMPout is set to low at the time t21. Therefore, the signal /CMPout is set to high.

Thereafter, at the time t30, the signal T1 rises. At this occasion, the signal /CMPout is high, and therefore, the control signal S1 which is output from the Q terminal by the D-FF 52 is set to high. Therefore, the amplification unit 3m1 has the amplification factor gm of "2" as shown in FIG. 8B.

As described above, ultimately, both of the control signals S0, S1 become high, and the amplification factor gm of the amplification unit 3m1 is determined to be "2".

As explained above, with the amplification unit 3m1 as shown in FIG. 4 and the control unit 3m3 as shown in FIG. 9, the amplification factor gm applied to the pixel voltage Vpm can be set appropriately. FIG. 4 shows an example of a variable capacitance amplification circuit, but various kinds of amplification circuits such as a variable resistance type can be applied. For example, FIG. 9 shows an example where the control signals S0, S1 are generated by hardware. Alternatively, the control signals S0, S1 may be generated by software processing.

Figure 11A:
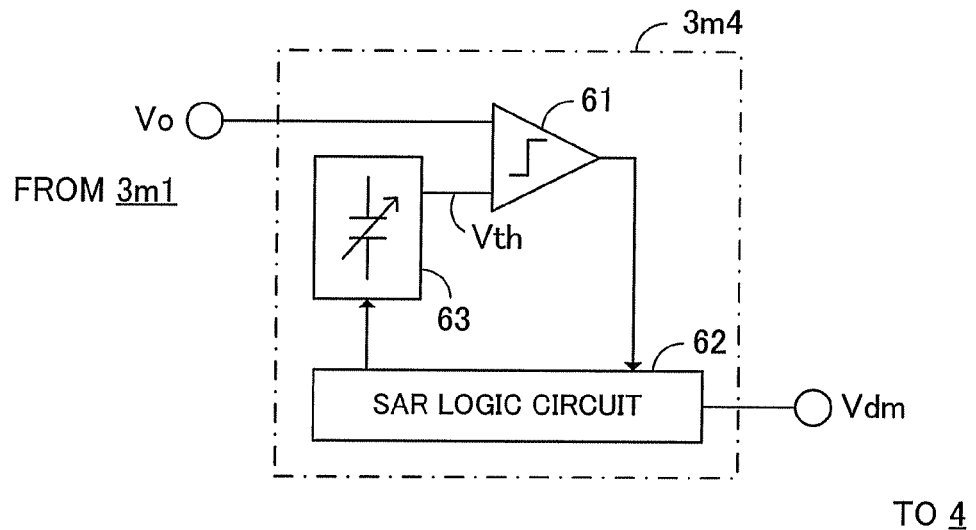
FIGS. 11A and 11B are block diagrams illustrating an example of an internal configuration of an AD conversion unit $3m4$.

FIG. 11 is a block diagram illustrating an example of an internal configuration of the AD conversion unit 3m4. The circuit in FIG. 11A performs successive approximation resistor (SAR) AD conversion. In FIG. 11, the AD conversion unit 3m4 includes a comparison unit 61, an SAR logic circuit 62, and a capacitance DA conversion unit 63.

The comparison unit 61 compares the output voltage Vo given by the amplification unit 3m1 and a threshold voltage Vth which is output from the capacitance DA conversion unit 63. The SAR logic circuit 62 outputs a signal according to a comparison result given by the comparison unit 61, to the capacitance DA conversion unit 63. The capacitance DA conversion unit 63 generates the threshold voltage Vth of the comparison unit 61 on the basis of the signal given by the SAR logic circuit 62. The comparison unit 61 successively repeats comparison between the output voltage Vo and the threshold voltage Vth, so that the SAR logic circuit 62 outputs multi-bit digital value Vdm.

In this case, the comparison unit 61 is provided in the AD conversion unit 3m4 of FIG. 11A. As shown in FIG. 2, the comparison unit 3m2 is provided in the column processing unit 3m. The comparison unit 3m2 is used to control the amplification factor gm of the amplification unit 3m1. The comparison unit 61 is used for the AD conversion after the amplification factor gm is determined. Therefore, the comparison unit 3m2 and the comparison unit 61 are not operated simultaneously.

Figure 11B:
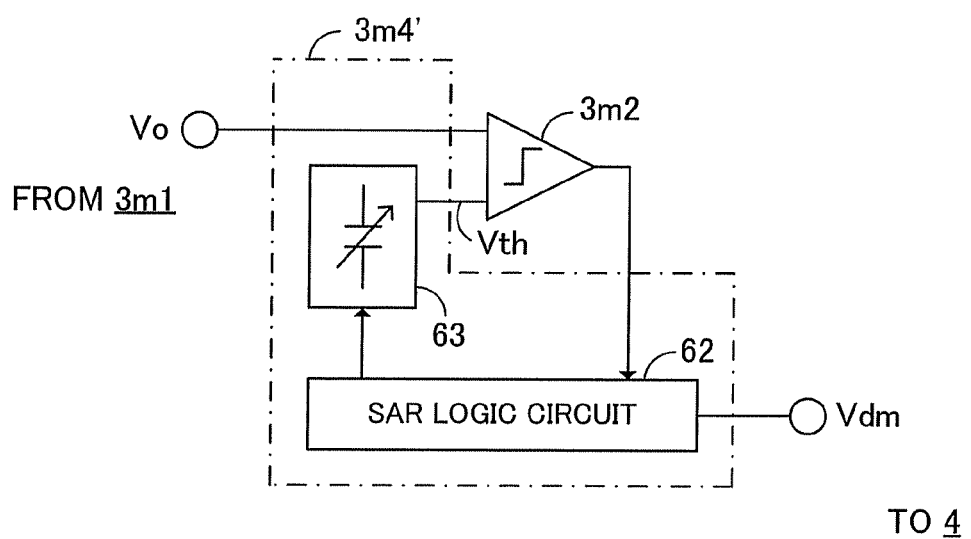

Therefore, the comparison unit 61 may be omitted, and the AD conversion may be done using the comparison unit 3m2. An example of configuration of the AD conversion unit 3m4' in such case is shown in FIG. 11B. The AD conversion unit 3m4' has an SAR logic circuit 62 and a capacitance DA conversion unit 63, and uses the comparison unit 3m2 to perform the AD conversion. The comparison unit 3m2 receives the reference voltage Vref when controlling the amplification factor gm of the amplification unit 3m1, and receives the threshold voltage Vth from the capacitance DA conversion unit 63 when performing the AD conversion, although this is not shown.

As described above, the comparison unit 3m2 is used for both of the control of the amplification factor gm and the AD conversion, and therefore the size of the circuit of the entire column processing unit 3m can be reduced.

The AD conversion unit 3m4 is not limited to successive approximation resistor-type. Various kinds of AD converters such as pipeline type, flash type, and single-slope type can be applied.

By the way, the amplification factor g is set for each pixel 2 as described above, and therefore, the amplification factor g may be different in any given pixel 2 and in another pixel 2 (for example, an adjacent pixel 2 which belongs to an adjacent column). For example, the amplification factor g applied to the pixel voltage Vp given by the pixel 2 may be "0.5", but the amplification factor g applied to the pixel voltage Vp given by the another pixel 2 may be "2". More specifically, the digital value Vd proportional to the pixel voltage Vp is obtained for each pixel 2, but the proportional coefficients may be different among the pixels 2. Therefore, the difference in the amplification factor g among the pixels 2 is cancelled by providing the digital signal processing unit 4 and making adjustment according to the amplification factor g, and the proportional coefficient is unified.

Figures 12, 13:
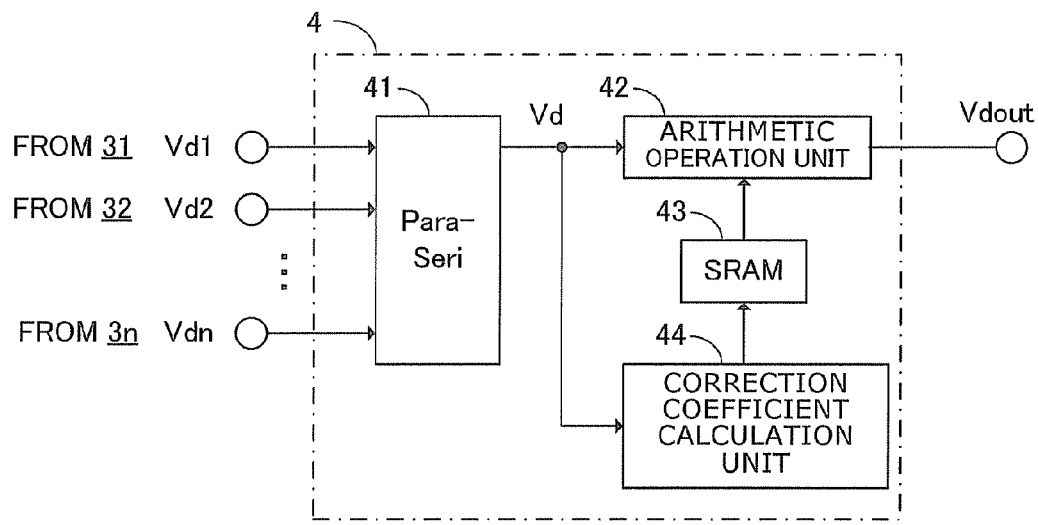
FIG. 12 is a figure illustrating an example of internal configuration of a digital signal processing unit 4.
FIG. 13 is a figure illustrating an example of a correction coefficient k stored in an SRAM 43.

FIG. 12 is a figure illustrating an example of internal configuration of the digital signal processing unit 4. The digital signal processing unit 4 includes a parallel-serial conversion unit 41 (Para-Seri), an arithmetic operation unit 42, SRAM 43, and a correction coefficient calculation unit 44.

The parallel-serial conversion unit 41 provides, one by one in order, the digital values Vd1 to Vdn, which are received from the AD conversion unit 314 to 3n4 in the column processing unit 31 to 3n, to the arithmetic operation unit 42 and the correction coefficient calculation unit 44.

The arithmetic operation unit 42 divides the digital value Vdm by the amplification factor gm applied by the amplification unit 3m1, and outputs the quotient as the digital value Vdout. More specifically, a reciprocal number of the amplification factor gm applied by the amplification unit 3m1 is defined as a correction coefficient km, and the arithmetic operation unit 42 multiplies the digital value Vdm by the correction coefficient km. The amplification factors g1 to gn applied by the amplification unit 311 to 3n1 are also provided from the column processing units 31 to 3n to the arithmetic operation unit 42, which is not shown.

For example, when the amplification factor gm which the amplification unit 3m1 applied to the pixel voltage Vpm is "2", the arithmetic operation unit 42 multiplies the digital value Vdm by the correction coefficient km=a/2 (a is a constant value). On the other hand, when the amplification factor gm' which the amplification unit 3m'1 (m'=1 to n, and m' is not m) applies to the pixel voltage Vpm' is "0.5", the arithmetic operation unit 42 multiplies the digital value Vdm' by the correction coefficient km'=2a. Therefore, the proportional coefficients of the pixel 2 can be unified to the constant value a.

By the way, the amplification factor gm may not be precisely controlled at all times, in a case where, for example the amplification unit 3m1 is an analog circuit. For example, even where the amplification factor gm is set to "2", the amplification factor gm actually applied may be "1.9". The amplification factor g may vary among the amplification units. For example, when the amplification factor g is set to "2" times, the following case may occur: even where the amplification factor gm applied in the amplification unit 3m1 is strictly "2", the amplification factor gm' applied in the amplification unit 3m'1 may be "1.9".

Therefore, the SRAM 43 and the correction coefficient calculation unit 44 are preferably provided, and it is desired to set the correction coefficient k for each amplification unit 3 and for each amplification factor g that is set.

FIG. 13 is a figure illustrating an example of the correction coefficient k stored in the SRAM 43. The SRAM 43 stores, in advance, the correction coefficients k1 to kn for the amplification factors g1 to gn which are set in the amplification units 311 to 3n1 in the column processing units 31 to 3n. In FIG. 13, the correction coefficient, where the amplification factor gm for the amplification unit 3m1 is "p", is denoted as km (xp). For example, in a case where the amplification factor g1 for the amplification unit 311 is "2", the correction coefficient is k1 (x2). The arithmetic operation unit 42 reads the correction coefficient km, and multiplies the digital value Vdm by the correction coefficient km.

Before the pixel voltage Vp is read, each correction coefficient k is calculated by the correction coefficient calculation unit 44 in advance as follows.

First, in order to compensate variation among the amplification units 311 to 3n1, the correction coefficient calculation unit 44 calculates the correction coefficients k1 (x2) to kn (x2) in a case where the amplification factors g1 to gn is set to "2" which is the maximum.

Figure 14:
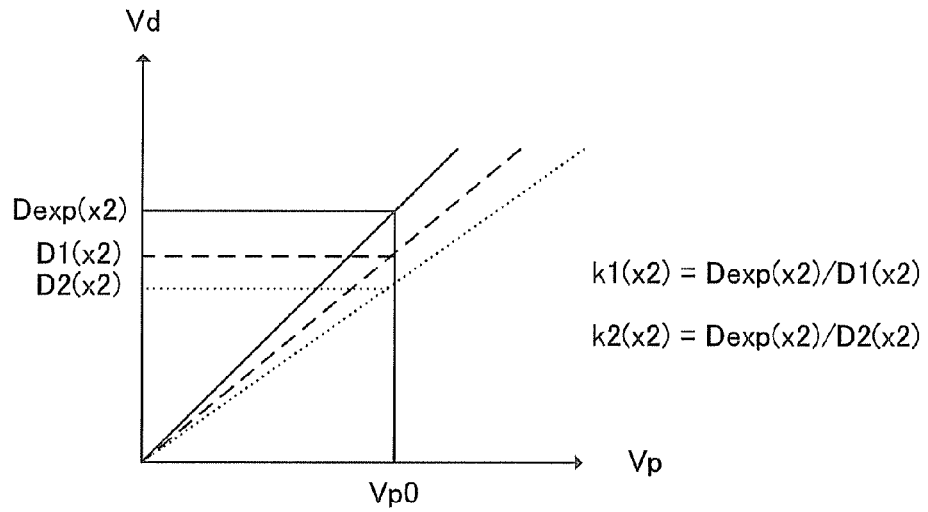
FIG. 14 is a figure for explaining a calculation method for calculating the correction coefficient k in a case where "2" is set as an amplification factor g.

FIG. 14 is a figure for explaining a calculation method for calculating the correction coefficient k in a case where "2" is set as the amplification factor g. In FIG. 14, a solid line indicates that the pixel voltage Vp is a predetermined reference voltage Vp0, and that the expected value of the digital value Vd is Dexp (x2) in a case where the amplification factor g which is set to "2" is applied.

As indicated by a broken line in FIG. 14, suppose that, in a case where the amplification factor g1 which is set to "2" is applied to the reference voltage Vp0, the digital value Vd1 is actually D1 (x2) in the amplification unit 311 in the column processing unit 31. In this case, the correction coefficient calculation unit 44 sets the correction coefficient k1 (x2) to Dexp (x2)/D1 (x2), and writes this to the SRAM 43.

As indicated by a dotted line in FIG. 14, suppose that, in a case where the amplification factor g2 which is set to "2" is applied to the reference voltage Vp0, the digital value Vd2 is actually D2 (x2) in the amplification unit 321 in the column processing unit 32. In this case, the correction coefficient calculation unit 44 sets the correction coefficient k2 (x2) to Dexp (x2)/D2 (x2), and writes this to the SRAM 43.

The other correction coefficients k3 (x2) to kn (x2) are also in the same manner. Therefore, the correction coefficients k1 (x2) to kn (x2) where the amplification factors g1 to gn are set to "2" are calculated for all of the amplification units 311 to 3n1.

As described above, any given expected value Dexp (x2) is adopted as the reference, the correction coefficients k1 (x2) to kn (x2) are defined. Then, the arithmetic operation unit 42 uses the correction coefficient k which is set for each of the amplification units 311 to 31n. The pixel voltage Vp and the digital value Vd are proportional, and therefore, even where the pixel voltage Vp is different from the reference voltage Vp0, the use of such correction coefficient k can compensate variation among the amplification units 311 to 31n where the amplification factor g that is set to "2" is applied.

Subsequently, the correction coefficient calculation unit 44 uses, as the reference, the correction coefficient where the amplification factor g that has been set is "2", and calculates the correction coefficient k for each amplification factor g for each of the amplification units 311 to 31n.

Figure 15:
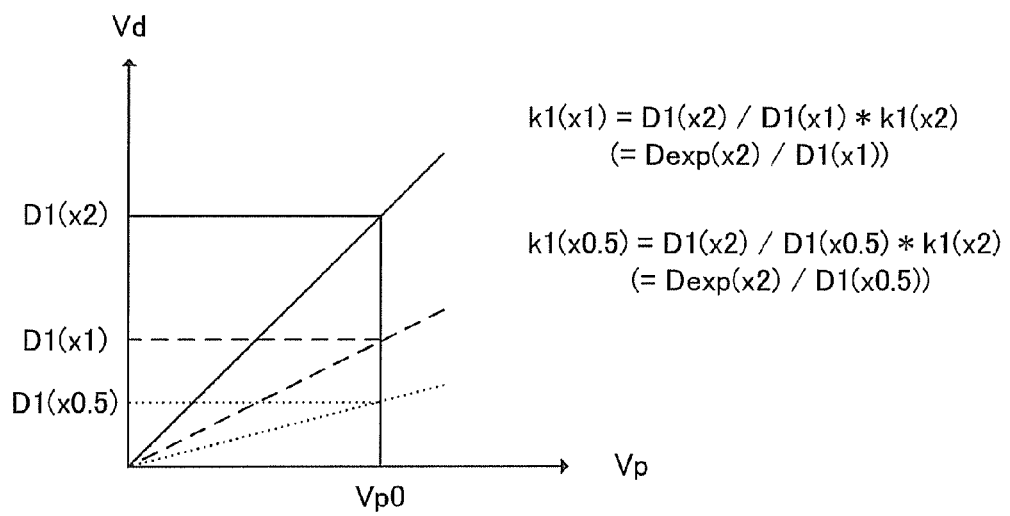
FIG. 15 is a figure for explaining a calculation method for calculating a correction coefficient k for each amplification factor g.

FIG. 15 is a figure for explaining a calculation method for calculating a correction coefficient k for each amplification factor g. As shown by a broken line in FIG. 15, suppose that, in a case where the amplification factor g1 that is set to "1" is applied to the reference voltage Vp0, the digital value Vd1 is D1 (x1), in the amplification unit 311. In this case, the correction coefficient calculation unit 44 sets the correction coefficient k1 (x1) as shown in the following expression (7), and writes this to the SRAM 43.

$$k1(x1) = D1(x2)/D1(x1) * k1(x2)( = Dexp(x2)/D1(x1)) \quad (7)$$

As shown by a dotted line in FIG. 15, suppose that, in a case where the amplification factor g1 that is set to "0.5" is applied to the reference voltage Vp0, the digital value Vd1 is D1 (x0.5), in the amplification unit 311. In this case, the correction coefficient calculation unit 44 sets the correction coefficient k1 (x0.5) as shown in the following expression (8), and writes this to the SRAM 43.

$$k1(x0.5) = D1(x2)/D1(x0.5) * k1(x2)( = Dexp(x2)/D1(x0.5)) \quad (8)$$

The correction coefficient k is also set in the same manner for the other amplification units 321 to 3n1.

As described above, the correction coefficient k is set for each amplification unit 311 to 31n and for each amplification factor g1 to gn that is set, so that the digital value Vdout proportional to the pixel voltage Vp can be obtained with a high degree of accuracy.

In the digital signal processing unit 4, CDS (Correlated Double Sampling) processing may be performed. The CDS processing is processing for correcting the pixel voltage Vpm on the basis of the reset voltage Vrst that is output from the pixel 2 when no light is irradiated on the pixel 2.

Figure 16:
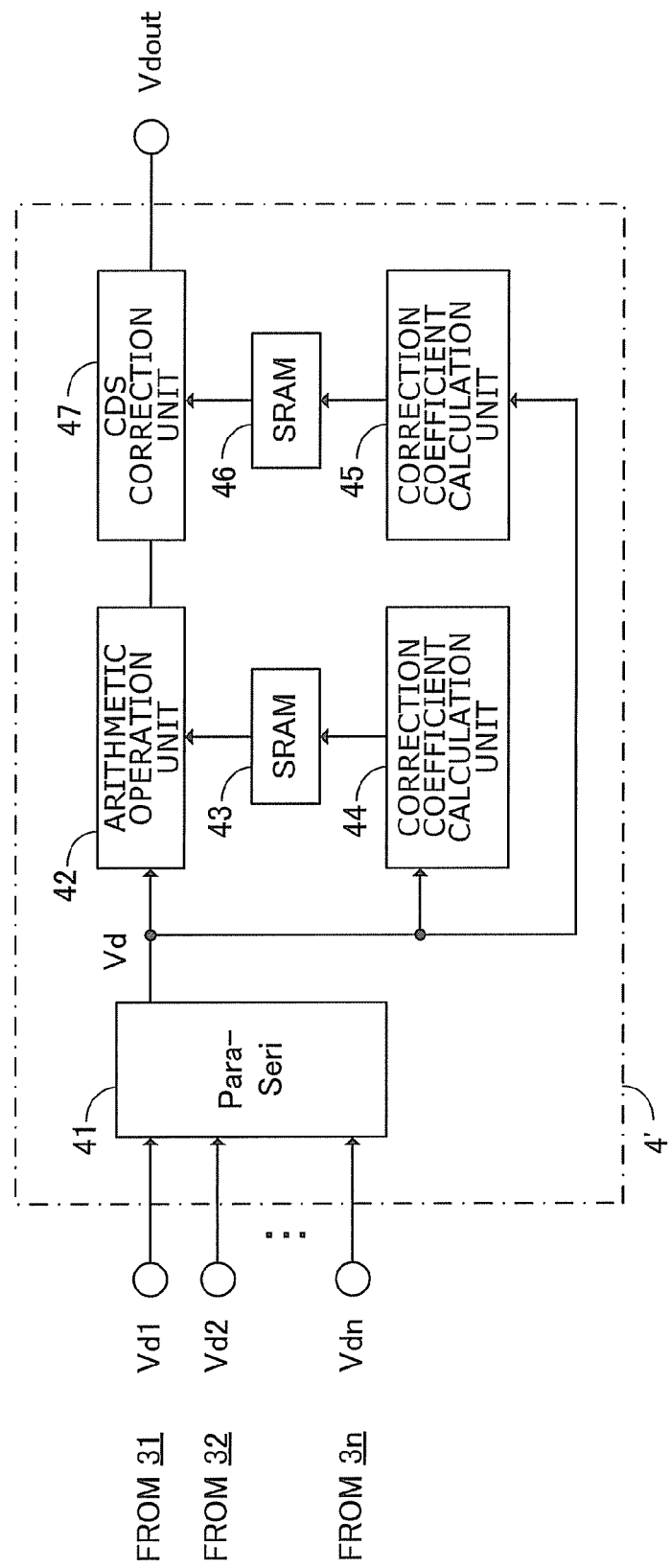
FIG. 16 is a block diagram illustrating a schematic configuration of a digital signal processing unit 4' that performs a CDS processing.

FIG. 16 is a block diagram illustrating a schematic configuration of the digital signal processing unit 4' that performs the CDS processing. The digital signal processing unit 4' includes not only each unit of the digital signal processing unit 4 as shown in FIG. 12 but also a correction coefficient calculation unit 45, SRAM 46, and a CDS correction unit 47.

In order to perform the CDS processing, it is necessary to find, in advance, the reset voltage Vrst that is output from the pixel 2 when no light is irradiated on the pixel 2. Therefore, the column processing unit 3m converts the reset voltage Vrst into the digital value Vdm, and provides the digital value Vdm to the correction coefficient calculation unit 45 via the parallel-serial conversion unit 41. The correction coefficient calculation unit 45 calculates the correction coefficient for the CDS processing on the basis of the converted digital value Vd, and writes this to the SRAM 46. The CDS correction unit 47 reads the correction coefficient from the SRAM 46, and uses this correction coefficient to correct the digital value Vd on the basis of the pixel voltage Vpm.

In this case, the reset voltage Vrst is sufficiently low. Therefore, the amplification factor gm of the amplification unit 3m1 of the column processing unit 3m may be set to the maximum value, and it is not necessary to control the amplification factor gm as shown in FIG. 3.

As explained above, in the first embodiment, the amplification factor gm is increased to the limit at which the output voltage Vo is not saturated. Therefore, the amplification factor can be set appropriately in a short time.

Second Embodiment

In the first embodiment explained above, the amplification unit 3m1 multiplies the pixel voltage Vpm by the amplification factor gm to amplify the pixel voltage Vpm. In contrast, in the second embodiment explained below, an integration unit integrates the pixel voltage Vp to amplify the pixel voltage Vp. Hereinafter the difference from the first embodiment will be mainly explained.

Figure 17:
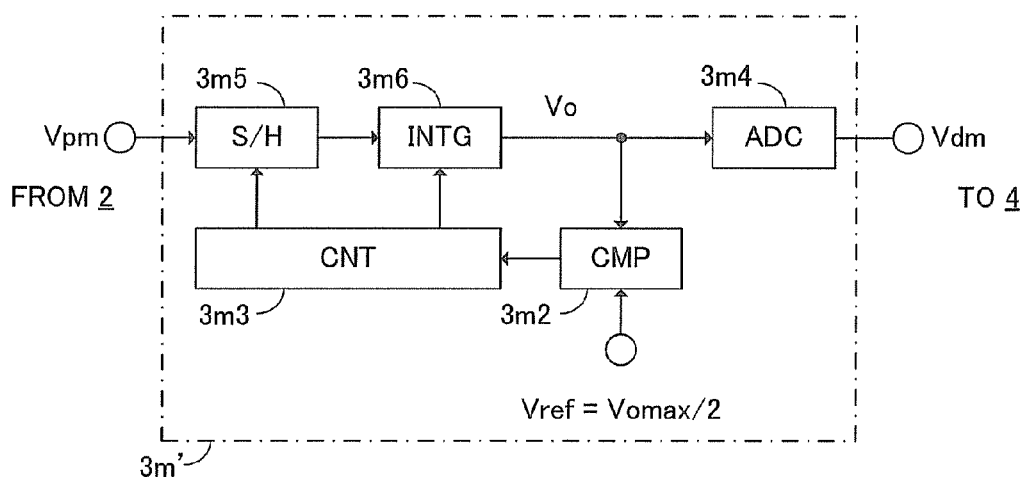
FIG. 17 is a block diagram illustrating an example of an internal configuration of a column processing unit $3m'$ according to a second embodiment.

FIG. 17 is a block diagram illustrating an example of an internal configuration of a column processing unit 3m' according to the second embodiment. The difference from FIG. 2 is that a column processing unit 3m' includes a sample and hold unit 3m5 (S/H) and an integration unit 3m6 (INTG). They take place of the amplification unit 3m1 of FIG. 2.

The sample and hold unit 3m5 samples the pixel voltage Vpm, and temporarily holds the pixel voltage Vpm. Then, in accordance with the control of the control unit 3m3, the sample and hold unit 3m5 outputs the held pixel voltage Vpm to the integration unit 3m6.

When the sample and hold unit 3m5 outputs the pixel voltage Vpm, the integration unit 3m6 integrates the pixel voltage Vpm and generates the output voltage Vo. In the present embodiment, the integration unit 3m6 integrates the pixel voltage Vpm once or multiple times. More specifically, the product of the number of times of integrations and the pixel voltage Vpm is the output voltage Vo. In other words, in the present embodiment, the number of times of integrations is equivalent to the amplification factor according to the first embodiment.

The control unit 3m3 controls the number of times of integrations of the integration unit 3m6 on the basis of the comparison result given by the comparison unit 3m2. More specifically, when the output voltage Vo is not saturated even if the pixel voltage Vpm is further integrated, the control unit 3m3 controls the sample and hold unit 3m5 and the integration unit 3m6 so that the integration unit 3m6 further performs integration. On the other hand, when the output voltage Vo is saturated if the pixel voltage Vpm is further integrated, the control unit 3m3 controls the sample and hold unit 3m5 and the integration unit 3m6 so that the integration unit 3m6 does not perform integration any more.

Figure 18:
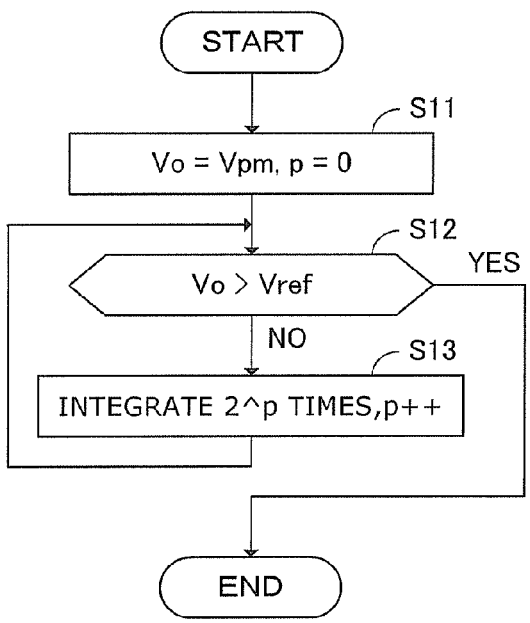
FIG. 18 is a flowchart illustrating an example of processing operation performed by the control unit $3m3$.

FIG. 18 is a flowchart illustrating an example of processing operation performed by the control unit 3m3. This indicates that the pixel voltage Vpm can be appropriately amplified by the processing shown in the flowchart, and the same output voltage Vo as that of the first embodiment can be obtained. In this example, the reference voltage Vref is set to ½ of the maximum voltage value Vomax.

First, the control unit 3m3 controls the sample and hold unit 3m5 and the integration unit 3m6 so that the integration unit 3m6 integrates the pixel voltage Vpm only once. Therefore, Vo=Vpm holds. The control unit 3m3 initializes the parameter p for controlling the number of times of integrations so that the parameter p is set to zero (step S11).

Then, when the output voltage Vo is equal to or less than the reference voltage Vref (=Vomax/2) (NO in step S12), the control unit 3m3 controls the sample and hold unit 3m5 and the integration unit 3m6 so that the integration unit 3m6 further integrates the pixel voltage Vpm for $2^p$ times. Then, the control unit 3m3 increases the parameter p by one (step S13).

For example, when p is 0 (at this occasion, Vo=Vpm), the integration unit 3m6 integrates pixel voltage Vpm for $2^0$=a single time. As a result, Vo becomes 2 Vpm, and the output voltage Vo becomes twice the value before the integration. In addition, p becomes 1.

When p is 1 (at this occasion, Vo=2 Vpm), the integration unit 3m6 integrates the pixel voltage Vpm for $2^1$=two times. As a result, Vo becomes 4Vpm, and the output voltage Vo becomes twice the value before the integration. In addition, p becomes 2.

When p=2 (at this occasion, Vo=4 Vpm), the integration unit 3m6 integrates the pixel voltage Vpm for $2^2$=4 times. As a result, Vo becomes 8 Vpm, and the output voltage Vo becomes twice the value before the integration.

As described above, every time the integration processing in step S13 is performed once, the output voltage Vo becomes twice the value before the integration. This is equivalent to multiplying the amplification factor gm by two (step S3 in FIG. 3) in the first embodiment.

When the output voltage Vo becomes more than the reference voltage Vref (YES in step S12), the control unit 3m3 stops the integration processing performed with the sample and hold unit 3m5 and the integration unit 3m6.

In a more general case, the reference voltage Vref is set to 1/q (q is any given positive number) of the maximum voltage value Vomax. Then, in step S13, the integration unit 3m6 performs integration processing once or multiple times so that the output voltage Vo becomes q times the current output voltage Vo, according to the control of the control unit 3m3.

As explained above, in the second embodiment, the integration unit 3m6 is provided, and the number of times of integrations is adjusted, so that the pixel voltage Vpm can be amplified appropriately. The integration is repeated up to the limitation at which the output voltage Vo is not saturated, and therefore, the number of times of integrations (i.e., amplification factor) can be set appropriately in a short time.

The configuration of each unit in each embodiment explained above may be modified in various manners. For example, FIG. 2 shows an example where the AD conversion unit 3m4 is provided in the column processing unit 3m. However, the AD conversion unit may be provided in the digital signal processing unit 4. In this case, the AD conversion unit may be provided downstream of the parallel-serial conversion unit 41 of FIG. 12.

FIG. 1 shows an example where a single column processing unit is provided per column. However, a single column processing unit may be provided for multiple columns. In this case, in the column processing unit 3m of FIG. 2, a multiplexer may be provided upstream of the amplification unit 3m1, and the column processing unit 3m may process multiple pixel voltages Vp in a time divisional manner.

Third Embodiment

In the third embodiment, the circuit configuration of the amplification unit 3m1 and the method for setting the amplification factor gm are different from those in the first embodiment. Hereinafter, the difference from the first embodiment will be mainly explained.

First, the fact that noises are larger in the amplification unit 3m1 of FIG. 4 according to the first embodiment than in an ideal amplification circuit will be explained. In this case, explanation will be made about a case where the number of capacitors is increased than the number of capacitors in the example of FIG. 4 and the amplification factor gm is set to "4" for the sake of explanation. FIG. 19A is circuit diagram illustrating an ideal amplification circuit where the amplification factor gm is "4". FIG. 19B is an equivalent circuit diagram illustrating the amplification unit 3m1 based on the first embodiment where the amplification factor gm is "4". FIG. 19C is a figure illustrating noise of the output voltage Vo of the circuit of FIGS. 19A, 19B.

The feedback coefficient β of an ideal amplification circuit shown in FIG. 19A is ⅕. On the other hand, the feedback coefficient β of the amplification unit 3m1 based on the first embodiment as shown in FIG. 19B is 1/12. The reason for this is because there is a capacitor having a capacitance 7C of which one end is connected to the common voltage Vcm, and of which other end is connected to the inverting input terminal of the operational amplifier OA. The capacitor having the capacitance 7C is the capacitor used for feedback when the amplification factor gm is "0.5" first.

As described above, the feedback coefficient β of the amplification unit 3m1 according to the first embodiment is less than the feedback coefficient β of the ideal amplification circuit. Therefore, as shown in FIG. 19C, the noise of the circuit in FIG. 19B is higher than the noise of the circuit in FIG. 19A. In FIG. 19C, the value of the noise at a certain frequency is a value obtained by integrating the noises at frequencies lower than that frequency.

Therefore, in the third embodiment, the noise of the amplification unit is reduced by employing the following configuration.

Figure 20:
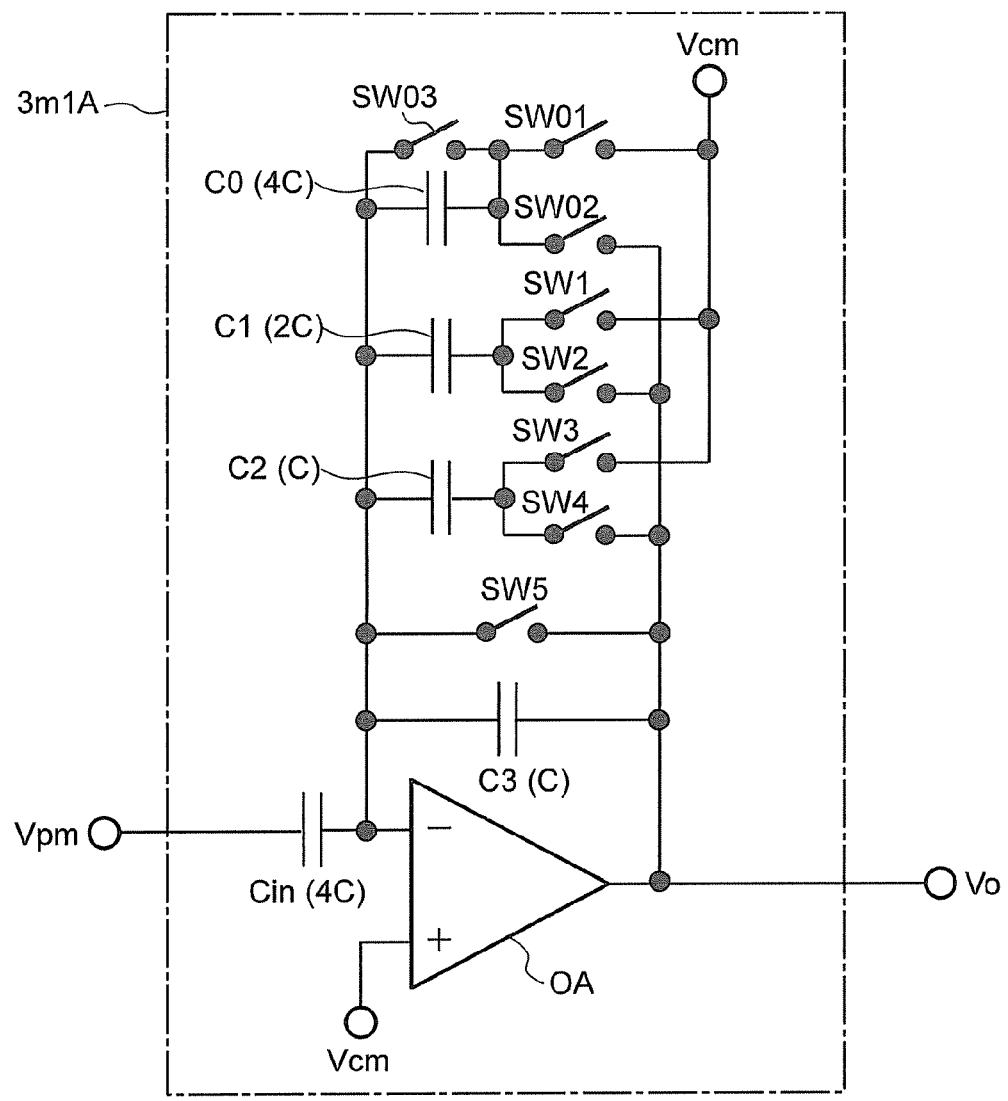
FIG. 20 is a circuit diagram illustrating an example of internal configuration of an amplification unit according to a third embodiment.

FIG. 20 is a circuit diagram illustrating an example of internal configuration of an amplification unit 3m1A according to the third embodiment. In FIG. 20, the same constituent elements as those in FIG. 4 are denoted with the same reference numerals, and the difference therefrom will be mainly explained in the explanation below. FIG. 20 shows an example where the number of capacitors is increased than the example of FIG. 4, and the amplification factor gm may take four values, which are "0.5", "1", "2", and "4".

The amplification unit 3m1A includes the configuration of FIG. 4 but also a capacitor (floating capacitor) C0, a switch SW01, a switch SW02, and a switch (second reset switch) SW03. The capacitance of the capacitor Cin is 4C.

The capacitance of the capacitor C0 is 4C. The one end of the capacitor C0 is connected to the inverting input terminal of the operational amplifier OA, and the other end thereof is connected to ends of the switches SW01, SW02. The other end of the switch SW01 receives a common voltage Vcm. The other end of the switch SW02 is connected to the output terminal of the operational amplifier OA. The switches SW01, SW02 are OFF when the signal C0DEN given by the control unit 3m3 is one. Any one of the switches SW01, SW02 is ON when the signal C0DEN is zero.

The switch SW03 is connected between both of the terminals of the capacitor C0. The switch SW03 is ON at the time of the initial phase, and is OFF at the time of the state other than the initial state.

The capacitances of the capacitors C1, C2 and the capacitor C0 are different from each other.

Unlike the first embodiment, first, the control unit 3m3 sets the amplification factor gm to the amplification factor "1" which is one step higher than the minimum amplification factor "0.5", and thereafter, when the output voltage (output value) Vo given by the amplification unit 3m1A may be saturated, the control unit 3m3 sets the amplification factor gm to an amplification factor lower than the present amplification factor by one step, and only when the output value from the amplification unit 3m1A is not saturated even where the amplification factor gm is raise to an amplification factor higher than the present amplification factor by one step, the control unit 3m3 sets the amplification factor gm to an amplification factor higher than the present amplification factor by one step. According to such control, when the pixel voltage Vp is close to the maximum, the output voltage may be saturated when the amplification factor gm is the amplification factor "1" at first, but when the amplification factor gm is increased, the amplification factor gm is increased to the limitation at which the output voltage Vo is not saturated just like the first embodiment. Therefore, the amplification factor can be set appropriately in a short time.

The amplification factor gm is set to "1" at first, and therefore, as explained later, the noise can be reduced than the first embodiment.

At first, the control unit 3m3 may set the amplification factor gm to an amplification factor higher than the minimum amplification factor "0.5" by two steps or more.

Subsequently, operation of the amplification unit 3m1A will be explained in more details.

(1) Initialization Phase

Figures 21A, 21B:
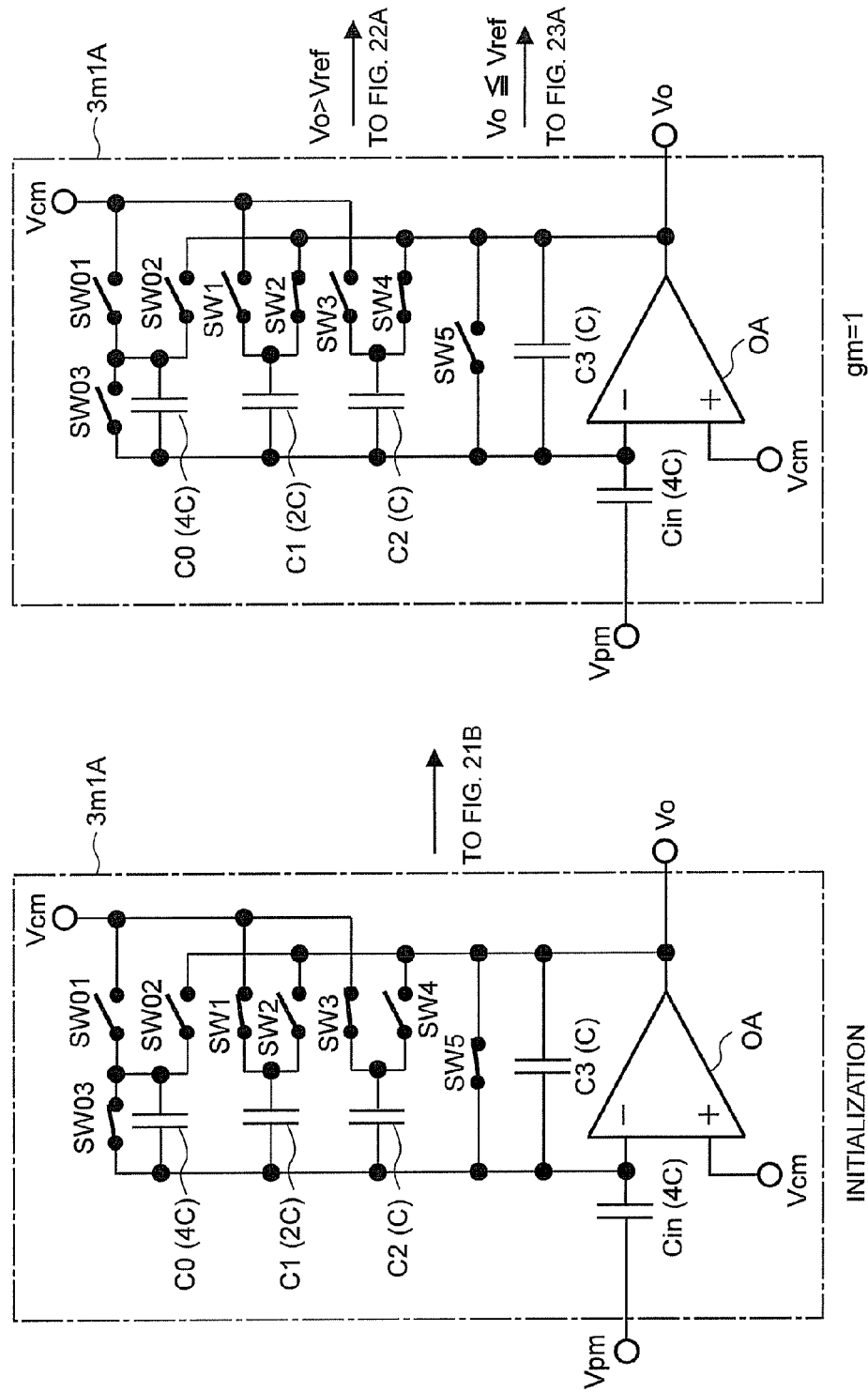
FIG. 21A illustrates operation of the amplification unit in an initialization phase.
FIG. 21B is a figure, subsequent to FIG. 21A, for explaining operation of the amplification unit.

FIG. 21A illustrates operation of the amplification unit 3m1A in the initialization phase. As shown in FIG. 21A, in the initialization phase, the control unit 3m3 turns on the switches SW03, SW1, SW3, SW5, and turns off the switches SW01, SW02, SW2, SW4. In the initialization phase, no light is irradiated on the pixel 2, and the pixel 2 outputs the reset voltage Vrst.

More specifically, the control unit 3m3 short-circuits both of the ends of the capacitor C0, and connects the other ends of the capacitors C1, C2 with the common voltage Vcm. This is different from the first embodiment in that both ends of the capacitor C0 are short-circuited.

Therefore, the charges accumulated in the capacitors C0 to C3 are initialized to zero.

(2) gm="1"

FIG. 21B is a figure, subsequent to FIG. 21A, for explaining operation of the amplification unit 3m1A. The amplification factor gm is "1".

As shown in FIG. 21B, after the initialization phase, the control unit 3m3 turns off the switches SW03, SW1, SW3, SW5, and turns on the switches SW2, SW4, and keeps the switches SW01, SW02 in the OFF state.

In other word, first, the control unit 3m3 makes the other end of the capacitor C0 in a floating state, and connects the other ends of the capacitors C1, C2 to the output terminal of the operational amplifier OA. Therefore, like FIG. 7, the control unit 3m3 sets the amplification factor gm to the amplification factor "1" which is higher than the minimum amplification factor by one step.

At this occasion, the output voltage Vo is compared with the reference voltage Vref. When the output voltage Vo is more than the reference voltage Vref (Vomax/2), the control unit 3m3 sets the amplification factor gm to "0.5" ((3), FIG. 22A). On the other hand, when the output voltage Vo is equal to or less than the reference voltage Vref, the amplification factor is set to "2" ((5), FIG. 23A).

(3) gm="0.5"

Figure 22A:
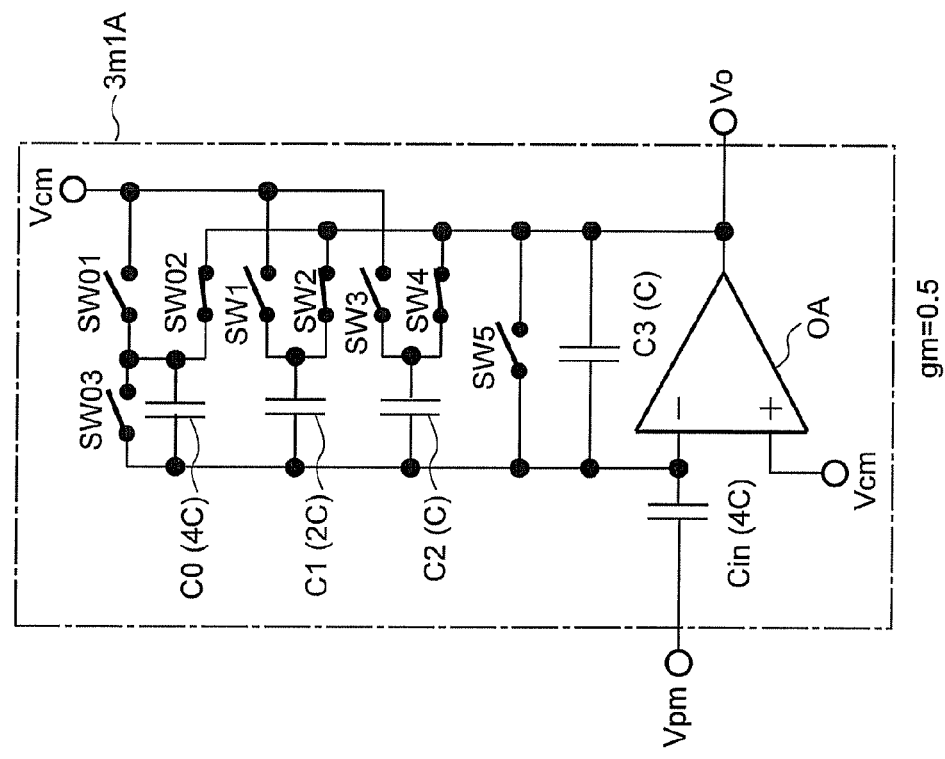
FIG. 22A is a figure, subsequent to FIG. 21B, for explaining operation of the amplification unit.

FIG. 22A is a figure, subsequent to FIG. 21B, for explaining operation of the amplification unit 3m1A. The amplification factor gm is "0.5".

As shown in FIG. 22A, the control unit 3m3 turns on the switch SW02. The other switches are in the same state as FIG. 21B. Therefore, like FIG. 6, the amplification factor gm is set to "0.5".

Therefore, when the control unit 3m3 reduces the amplification factor gm, the control unit 3m3 connects the other end of the capacitor C0 to the output terminal of the operational amplifier OA.

At this occasion, the output voltage Vo is compared with the reference voltage Vref. When the output voltage Vo is higher than the reference voltage Vref, the control unit 3m3 keeps and determines the amplification factor gm of "0.5" ((4), FIG. 22B). On the other hand, when the output voltage Vo is equal to or less than the reference voltage Vref, the amplification factor is set to "1" ((7), FIG. 24A).

(4) Determine that gm="0.5"

Figure 22B:
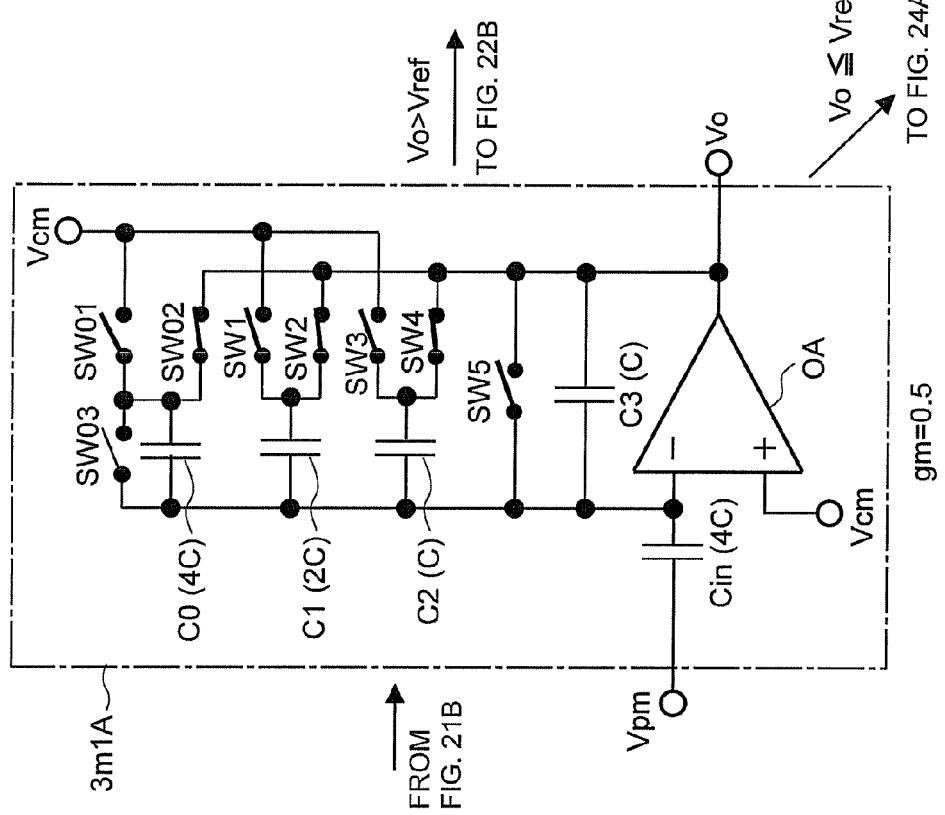
FIG. 22B is a figure, subsequent to FIG. 22A, for explaining operation of the amplification unit.

FIG. 22B is a figure, subsequent to FIG. 22A, for explaining operation of the amplification unit 3m1A. The amplification factor gm is "0.5". Therefore, the state of each switch is the same as that of FIG. 22A.

(5) gm="2"

Figures 23A, 23B:
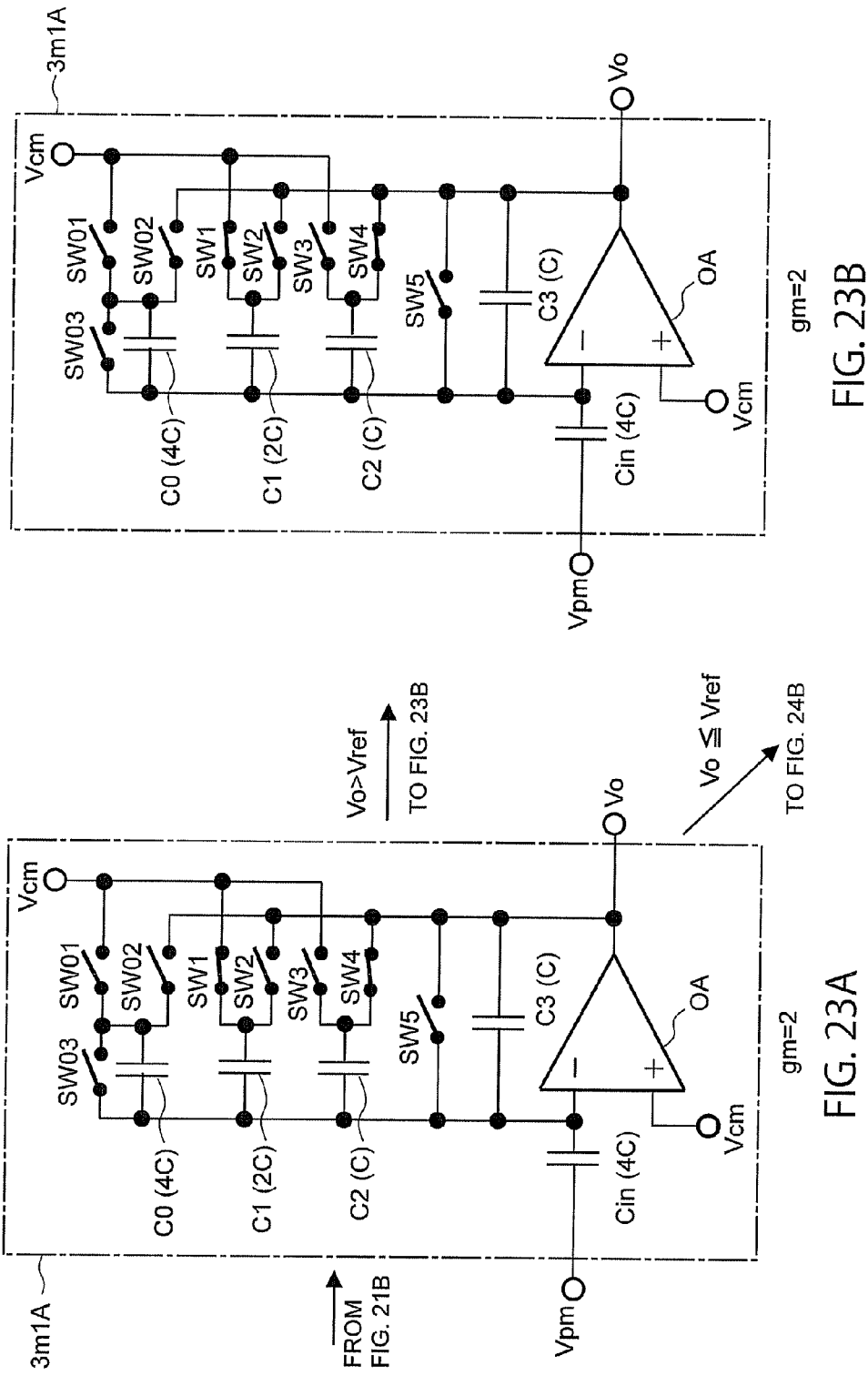
FIG. 23A is a figure, subsequent to FIG. 21B, for explaining operation of the amplification unit.
FIG. 23B is a figure, subsequent to FIG. 23A, for explaining operation of the amplification unit.

FIG. 23A is a figure, subsequent to FIG. 21B, for explaining operation of the amplification unit 3m1A. The amplification factor gm is "2".

As shown in FIG. 23A, the control unit 3m3 turns on the switch SW1 and turns off the switch SW2. The other switches are in the same state as those in FIG. 21B. Therefore, like FIG. 8, the amplification factor gm is set to "2".

More specifically, when the control unit 3m3 increases the amplification factor gm, the control unit 3m3 disconnects the other end of any one of the capacitors C1, C2 (the capacitor C1 in this case) from the output terminal of the operational amplifier OA, and connects it to the common voltage Vcm.

In this manner, the other end of the capacitor C0 is kept in the floating, and the amplification factor gm can be set to "2". In contrast, in the first embodiment, the other end of the capacitor C0 is also connected to the common voltage Vcm, and the amplification factor is set to "2". Therefore, in the present embodiment, as compared with the first embodiment, the feedback coefficient β can be increased, and therefore the noise can be reduced.

At this occasion, the output voltage Vo is compared with the reference voltage Vref. When the output voltage Vo is more than the reference voltage Vref, the control unit 3m3 keeps and determines the amplification factor gm of "2" ((6), FIG. 23B). On the other hand, when the output voltage Vo is equal to or less than the reference voltage Vref, the amplification factor is set to "4" ((8), FIG. 24B).

(6) Determine that gm="2"

FIG. 23B is a figure, subsequent to FIG. 23A, for explaining operation of the amplification unit 3m1A. The amplification factor gm is "2". Therefore, the state of each switch is the same as that of FIG. 23A.

(7) Determine that gm="1"

Figure 24B:
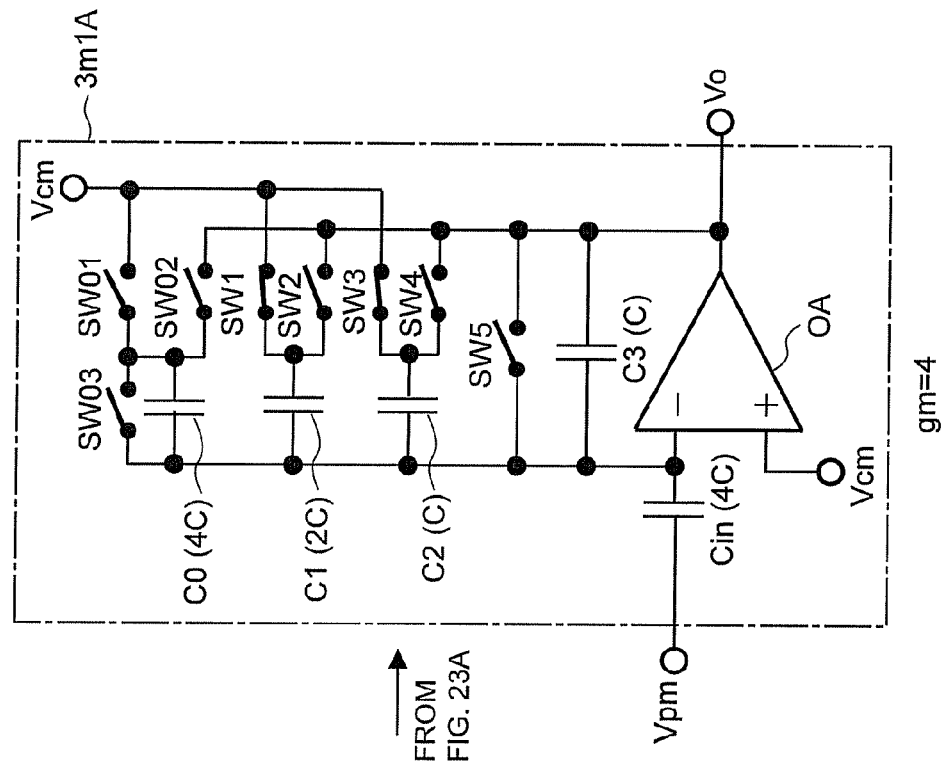
FIG. 24B is a figure, subsequent to FIG. 23A, for explaining operation of the amplification unit.
Figure 24A:
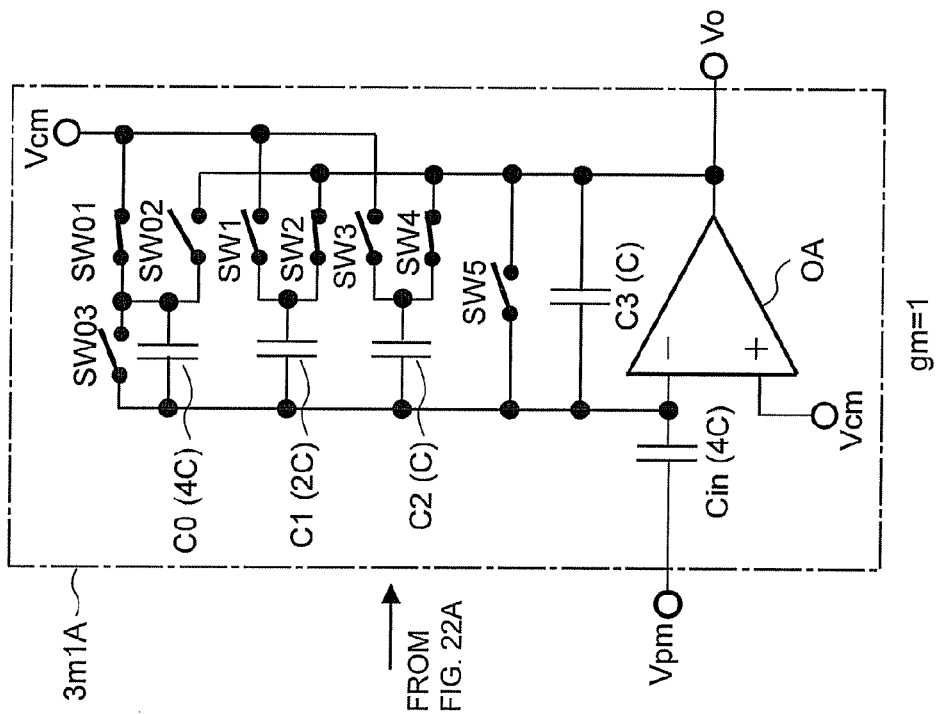
FIG. 24A is a figure, subsequent to FIG. 22A, for explaining operation of the amplification unit.

FIG. 24A is a figure, subsequent to FIG. 22A, for explaining operation of the amplification unit 3m1A. The amplification factor gm is "1".

As shown in FIG. 24A, the control unit 3m3 turns on the switch SW01, and turns off the switch SW02. The other switches are in the same state as those in FIG. 22A. Therefore, like FIG. 21B, the amplification factor gm is set to "1". However, in FIG. 21B, the other end of the capacitor C0 is in the floating state, but in FIG. 24A, the other end of the capacitor C0 is connected to the common voltage Vcm. The reason for this is that, in the state of FIG. 22A, the other end of the capacitor C0 is connected to the output terminal of the operational amplifier OA.

(8) Determine that gm="4"

FIG. 24B is a figure, subsequent to FIG. 23A, for explaining operation of the amplification unit 3m1A. The amplification factor gm is "4".

As shown in FIG. 24B, the control unit 3m3 turns on the switch SW3 and turns off the switch SW4. The other switches are in the same state as those of FIG. 23A. Therefore, the amplification factor gm is set to "4". Therefore, the other end of the capacitor C0 can be made in the floating, and the amplification factor gm can be set to "4".

The above operation will be explained with reference to the flowchart.

Figure 25:
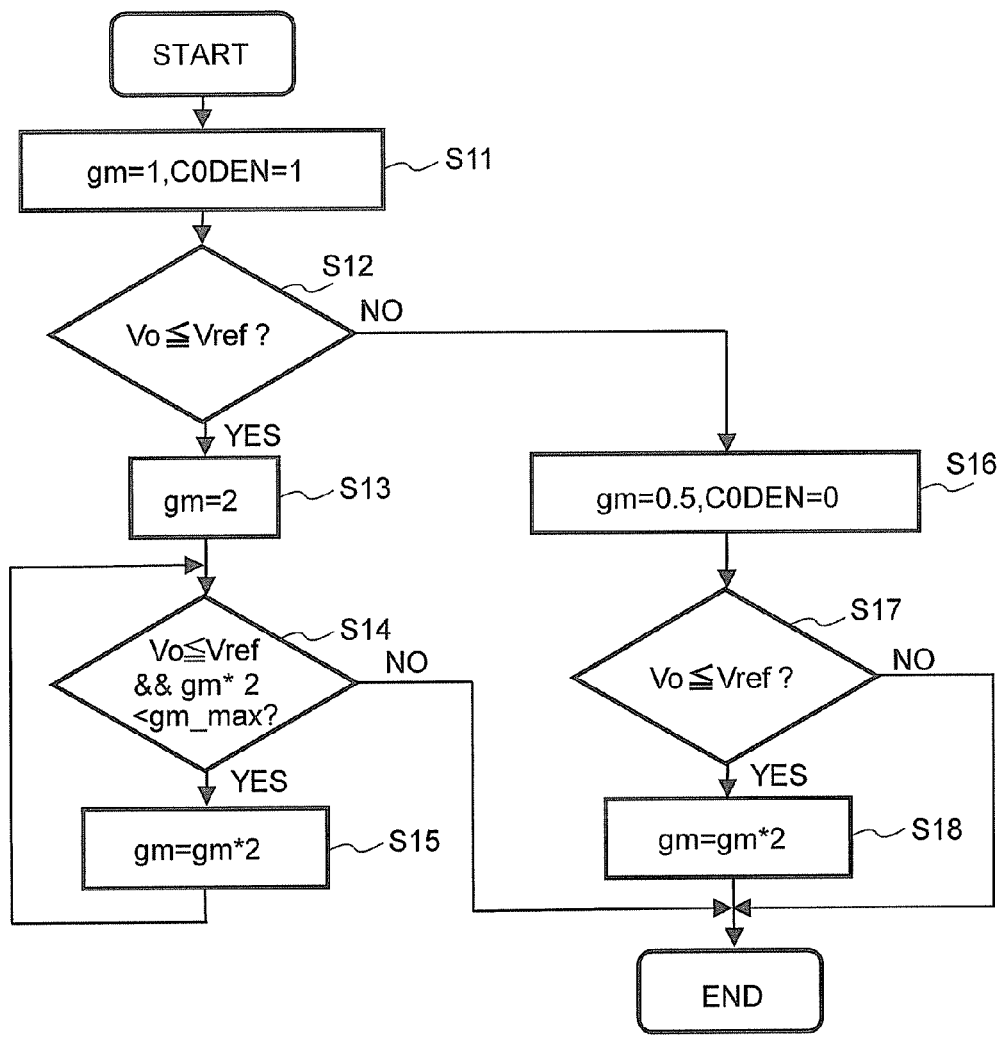
FIG. 25 is a flowchart illustrating an example of processing operation of the control unit.

FIG. 25 is a flowchart illustrating an example of processing operation of the control unit 3m3. This flowchart can be applied not only to a case where the amplification factor gm is switched into four levels but also a case where the amplification factor gm is switched into any given level.

As described above, in the initial setting, the control unit 3m3 sets the signal C0DEN to 1, and sets the amplification factor gm to "1" (step S11, FIG. 21B).

When the output voltage Vo given by the amplification unit 3m1A is equal to or less than the reference voltage Vref (=Vomax/2) (YES in step S12), the output voltage Vo is not more than the maximum voltage Vomax even if the amplification factor which is twice the present amplification factor gm is applied. Therefore, the control unit 3m3 changes the amplification factor gm to "2" (step S13, FIG. 23A).

Subsequently, when the output voltage Vo is equal to or less than the reference voltage Vref, and the value obtained by doubling the present amplification factor gm is less than the maximum amplification factor gm_max that can be set (YES in step S14), the control unit 3m3 changes the amplification factor to the value obtained by doubling the present amplification factor gm (step S15, FIG. 24B).

Then, the control unit 3m3 repeats this processing until the output voltage Vo becomes more than the reference voltage Vref, or, the value obtained by doubling the present amplification factor gm becomes equal to or more than the maximum amplification factor gm_max that can be set (YES in steps S14, S15).

When the output voltage Vo is more than the reference voltage Vref (NO in step S14), and when the value obtained by doubling the present amplification factor gm is applied, the output voltage Vo becomes more than the maximum voltage Vomax, and the output voltage Vo is saturated. When the value obtained by doubling the present amplification factor gm is equal to or more than the maximum amplification factor gm_max that can be set (NO in step S14), the amplification factor gm cannot be increased any more. Therefore, the control unit 3m3 terminates the processing without increasing the amplification factor gm any more. Therefore, the amplification factor gm is determined.

On the other hand, when the output voltage Vo is more than the reference voltage Vref in step S12 (NO in step S12), the output voltage Vo may be saturated if the amplification factor gm is "1". Therefore, the control unit 3m3 changes the signal C0DEN to zero, and temporarily changes the amplification factor gm to "0.5" (step S16, FIG. 22A).

Subsequently, when the output voltage Vo is equal to or less than the reference voltage Vref (YES in step S17), the output voltage Vo is not saturated even where the amplification factor gm is "1", and therefore, the control unit 3m3 changes the amplification factor gm back to "1" again (step S18, FIG. 24A), and terminates the processing. Therefore, the amplification factor gm is determined to be "1".

When the output voltage Vo is more than the reference voltage Vref (NO in step S17, FIG. 22B), the processing is terminated. Therefore, the amplification factor gm is determined to be "0.5".

Figure 26:
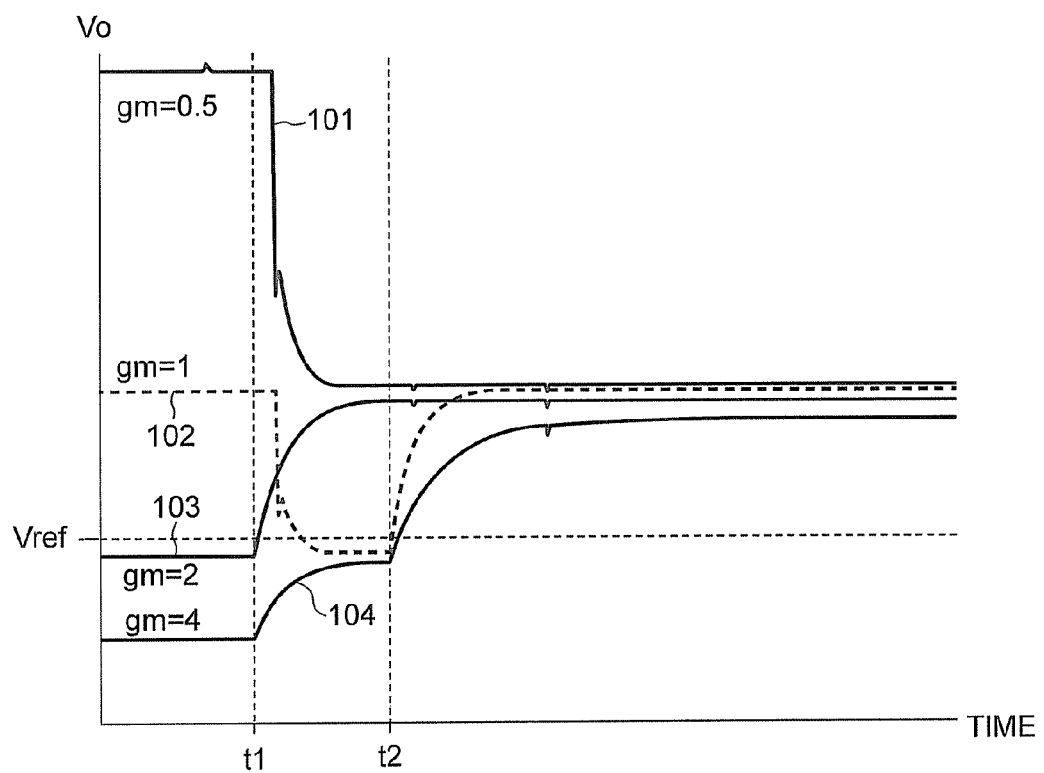
FIG. 26 is a figure illustrating change of an output voltage according to a pixel voltage over time.

FIG. 26 is a figure illustrating change of the output voltage Vo according to the pixel voltage Vp over time. FIG. 26 illustrates properties of four pixel voltages Vp from the maximum pixel voltage Vp to the minimum pixel voltage Vp. Suppose that the reference voltage Vref is lower than the maximum pixel voltage Vp and the second highest pixel voltage Vp, and higher than the minimum pixel voltage Vp and the second lowest pixel voltage Vp.

The amplification factor gm up to the time t1 is "1" regardless of the pixel voltage Vp.

In the case of the maximum pixel voltage Vp, the output voltage Vo is higher than the reference voltage Vref where the amplification factor gm is "1" as indicated by a feature 101, and the amplification factor gm is changed to "0.5" after the time t1. As a result, the output voltage Vo becomes an appropriate value.

In the case of the second highest pixel voltage Vp, the output voltage Vo is higher than the reference voltage Vref where the amplification factor gm is "1" as indicated by a feature 102, and the amplification factor gm is changed to "0.5" after the time t1. Therefore, the output voltage Vo becomes equal to or less than the reference voltage Vref, and accordingly, at the time t2, the amplification factor gm is changed to "1". As a result, the output voltage Vo becomes an appropriate value.

In the case of the second lowest pixel voltage Vp, the output voltage Vo is equal to or less than the reference voltage Vref where the amplification factor gm is "1" as indicated by a feature 103, and the amplification factor gm is changed to "2" after the time t1. Therefore, the output voltage Vo becomes higher than the reference voltage Vref, and therefore, the amplification factor gm is determined to be "2". As a result, the output voltage Vo becomes an appropriate value.

In the case of the minimum pixel voltage Vp, the output voltage Vo is equal to or less than the reference voltage Vref where the amplification factor gm is "1" as indicated by a feature 104, and the amplification factor gm is changed to "2" after the time t1. However, the output voltage Vo is equal to or less than the reference voltage Vref, and therefore, the amplification factor gm is changed to "4" after the time t2. Therefore, the output voltage Vo becomes more than the reference voltage Vref, and accordingly, the amplification factor gm is determined to be "4". As a result, the output voltage Vo becomes an appropriate value.

Figure 27A:
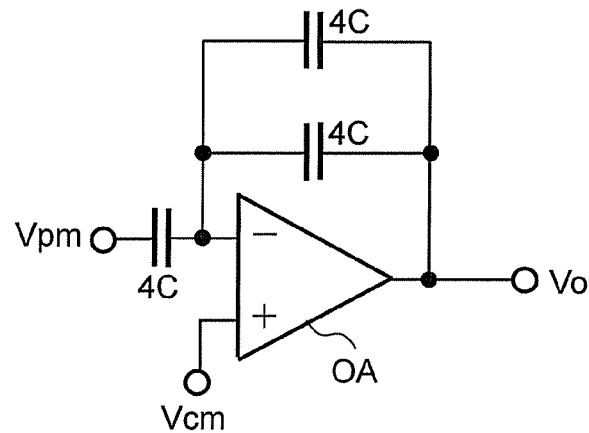
FIG. 27A is an equivalent circuit diagram illustrating the amplification unit in a case where the amplification factor is "0.5"
Figure 27B:
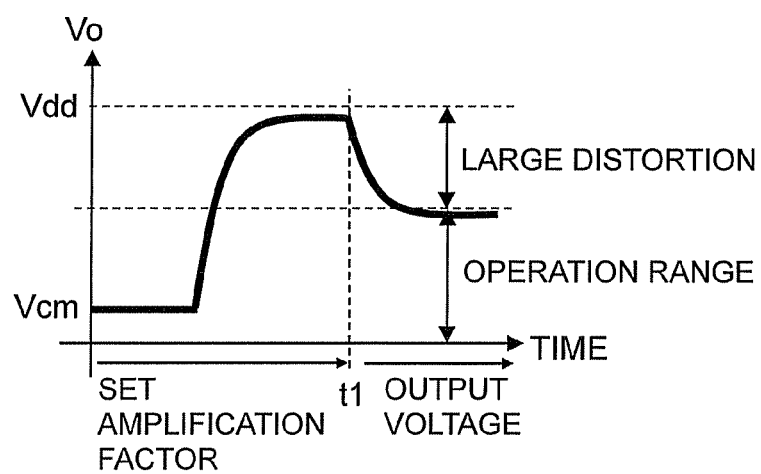
FIG. 27B is a figure schematically illustrating change of the output voltage over time in this case.

FIG. 27A is an equivalent circuit diagram illustrating the amplification unit 3m1A in a case where the amplification factor gm is "0.5". FIG. 27B is a figure schematically illustrating change of the output voltage Vo over time in this case.

As shown in FIG. 27B, after the time t1 at which the amplification factor gm has been determined, the output voltage Vo is within small distortion and linear operation range, and therefore, the error in the amplification factor gm can be reduced.

Figure 28A:
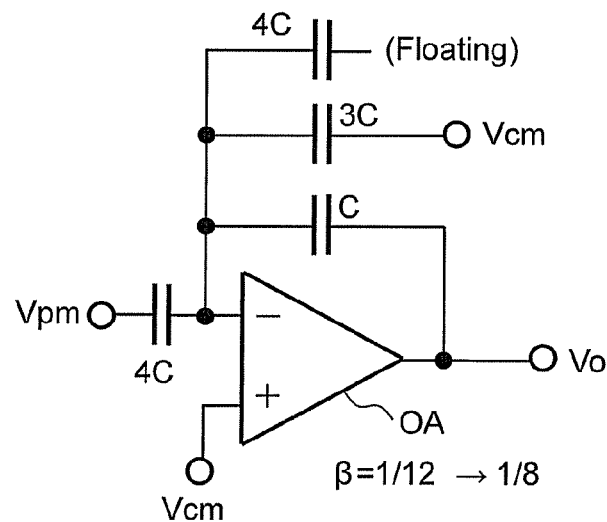
FIG. 28A is an equivalent circuit diagram of the amplification unit in a case where the amplification factor is "4"
Figure 28B:
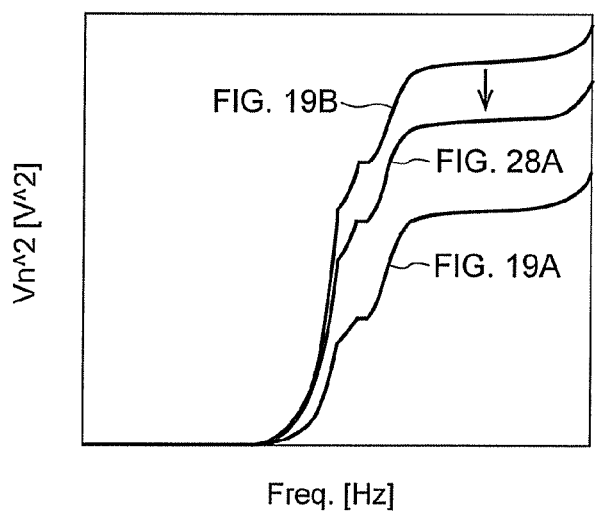
FIG. 28B is a figure illustrating noise of the output voltage in this case.

FIG. 28A is an equivalent circuit diagram of the amplification unit 3m1A in a case where the amplification factor gm is "4". FIG. 28B is a figure illustrating noise of the output voltage Vo in this case.

In FIG. 19B, the other end of the capacitor having the capacitance 7C is connected to the common voltage Vcm, but in FIG. 28A, the other end of the capacitor having the capacitance 3C is connected to the common voltage Vcm, and the other end of the capacitor having the capacitance 4C is in floating state. Therefore, the capacitor having the capacitance 4C does not affect the feedback coefficient β. Therefore, the feedback coefficient β becomes ⅛, which is more than 1/12 in FIG. 19B.

Therefore, as shown in FIG. 28B, the noise can be reduced to a lower level than the noise of the circuit in FIG. 19B.

As explained above, according to the present embodiment, first, the other end of the capacitor C0 is made in the floating state, and the amplification factor gm is set to the amplification factor "1" higher than the minimum amplification factor "0.5" by one step. Then, when the amplification factor gm is thereafter reduced, the other end of the capacitor C0 is connected to the output terminal of the operational amplifier OA. When the amplification factor gm is increased, the other end of any one of the switching capacitors C1, C2 is disconnected from the output terminal of the operational amplifier OA and is connected to the common voltage Vcm. Therefore, when the amplification factor gm is high, the capacitors connected to the common voltage Vcm can be reduced, and therefore, the feedback coefficient β can be increased. Therefore, when the amplification factor gm is high, the noise can be reduced than the first embodiment.

As explained in the first embodiment, the amplification factor gm may take a value other than the four values. In this case, in the circuit as shown in FIG. 20, a capacitor having an appropriate capacitor and a switch may be additionally provided as necessary.

Fourth Embodiment

The fourth embodiment is different from the third embodiment in the circuit configuration of the AD conversion unit 3m4. Hereinafter the difference from the third embodiment will be mainly explained.

FIG. 29A is a block diagram illustrating an example of a configuration of an AD conversion unit 3m4A according to the fourth embodiment. In the first to the third embodiments, the AD conversion unit 3m4 is a successive approximation resistor-type AD conversion unit. However, this AD conversion unit 3m4A is a single-slope-type AD conversion unit.

The single-slope-type AD conversion unit 3m4A includes an AD conversion capacitor Cad, a comparator 61A, and a digital value determination unit 64.

One end of the AD conversion capacitor Cad receives the output voltage Vo from an amplification unit 3m1A.

The inverting input terminal of the comparator 61A is connected to the other end of the AD conversion capacitor Cad, and the non-inverting input terminal of the comparator 61A receives the ramp voltage Vramp.

The digital value determination unit 64 determines the digital value Vdm in accordance with the rise timing of the ramp voltage Vramp and the comparison result of the comparator 61A.

FIG. 29B is a figure illustrating noise of the output Vcmpo of the comparator 61A and the output voltage Vo of a circuit in FIG. 29A. FIG. 29C is a figure illustrating noise of the output Vcmpo of the comparator 61A in a case where the amplification unit 3m1A of the circuit of FIG. 29A is replaced with the amplification unit 3m1 of the first embodiment (FIG. 19B) or the ideal amplification circuit (FIG. 19A). In this case, the amplification factor gm is considered to be set to "4".

As shown in FIG. 29B, the noise of the output Vcmpo of the comparator 61A is lower than the noise of the output voltage Vo because of the low pass filter effect of the comparator 61A.

As shown in FIG. 29C, the noise of the circuit of FIG. 29A is lower than the noise in the case where the amplification unit 3m1 (FIG. 19B) of the first embodiment is used in place of the amplification unit 3m1A of the circuit of FIG. 29A. More specifically, the noise of the circuit of FIG. 29A is more close to the noise in the case where the ideal amplification unit of FIG. 19A is used in place of the amplification unit 3m1A of the circuit of FIG. 29A.

As described above, in the third embodiment, the noise can be reduced as compared with the first embodiment, but the amount of reduction of the noise can be further improved by using the single-slope-type AD conversion unit 3m4A.

As described above, according to the present embodiment, the single-slope-type AD conversion unit 3m4A is provided, and therefore, in the output of the comparator 61A of the AD conversion unit 3m4A, noise in a high frequency band can be further reduced than the first embodiment. The feedback coefficient β of the amplification unit 3m1A is higher than that of the first embodiment, and therefore, the bandwidth is wide. Accordingly, in the noise output from the amplification unit 3m1A, the integration value is substantially the same as that of the first embodiment, but the noise also exists in a higher frequency band. For this reason, by reducing the noise in the high frequency band, the noise can be reduced as compared with the case where the single-slope-type AD conversion unit 3m4A is used in the first embodiment.

Fifth Embodiment

The fifth embodiment is different from the third embodiment in that the initial amplification factor of the amplification unit 3m1B is switched in accordance with the dynamic range of the pixel voltage Vpm. Hereinafter, the difference from the third embodiment will be mainly explained.

Figure 30:
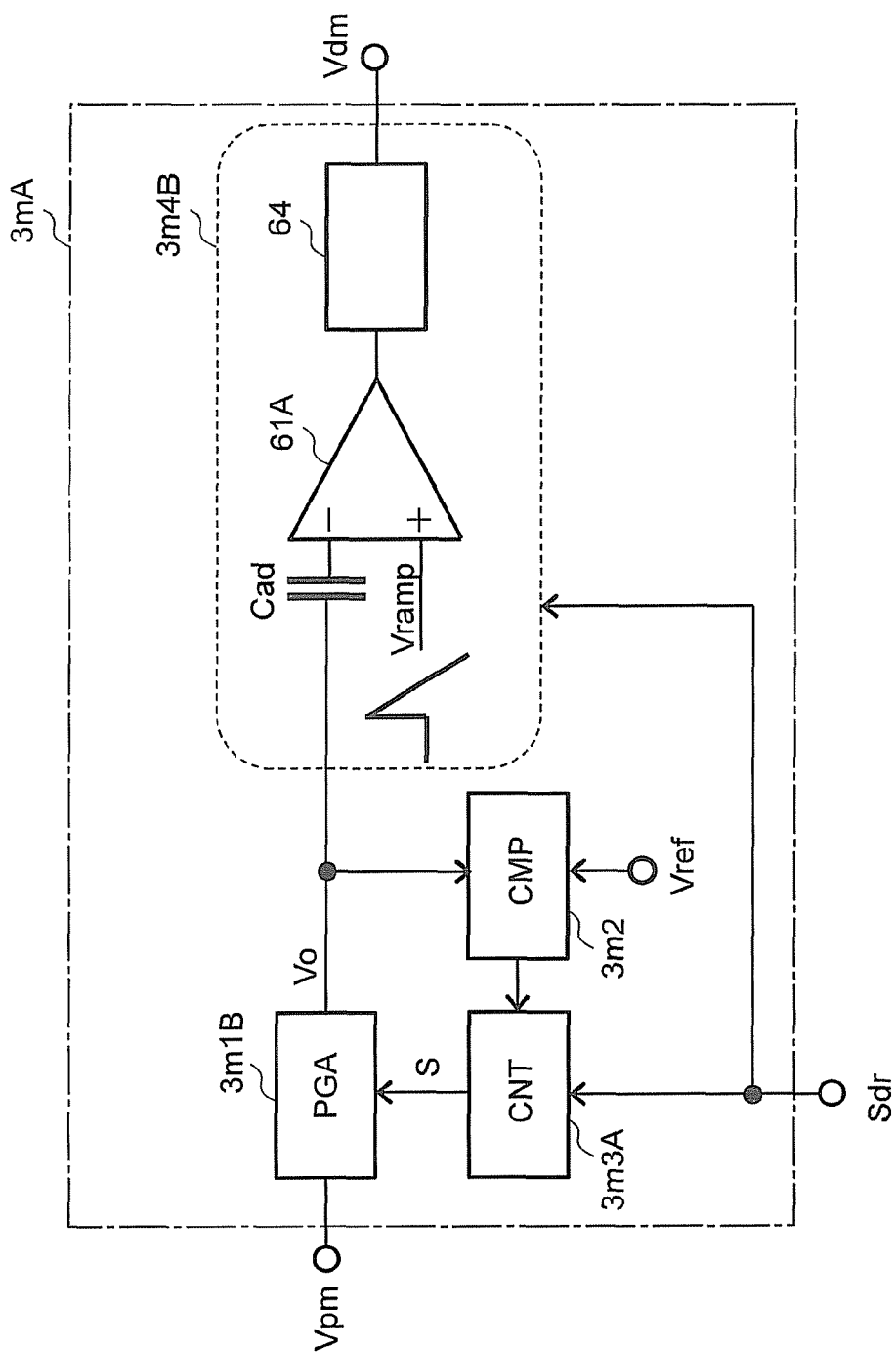
FIG. 30 is a block diagram illustrating an example of configuration of a column processing unit according to a fifth embodiment.

FIG. 30 is a block diagram illustrating an example of configuration of the column processing unit 3mA according to the fifth embodiment.

The column processing unit 3mA receives a dynamic range control signal Sdr which is given from the outside and which indicates that the dynamic range of the pixel voltage Vpm is 1/(2^M) times (M is an integer equal to or more than zero). The dynamic range control signal Sdr is set by, for example, user's operation, and the dynamic range control signal Sdr indicates whether the dynamic range is high or low. For example, in an environment where strong light is not irradiated on the pixel 2, the dynamic range of the pixel voltage Vpm is low, and the dynamic range control signal Sdr may be set so as to indicate a low dynamic range. More specifically, M indicates the degree how much the dynamic range decreases. When M is zero, the dynamic range is one time. When M is one, the dynamic range is ½ times. In the explanation below, an example of switching the dynamic range between one time and ½ times will be explained.

Figure 31A:
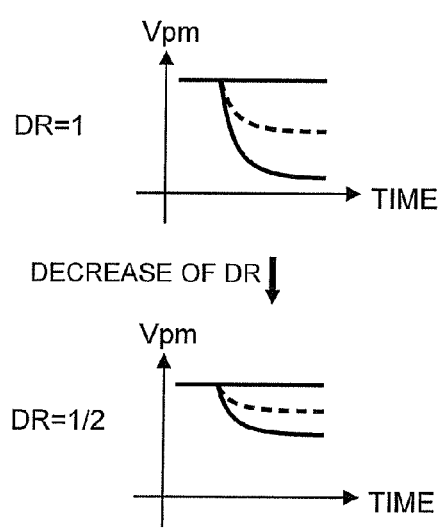
FIG. 31A is a figure illustrating a range of the pixel voltage according to the dynamic range.

FIG. 31A is a figure illustrating a range of the pixel voltage Vpm according to the dynamic range. In the example shown in FIG. 31A, when the dynamic range is low (DR=½ times), the range in which the pixel voltage Vpm changes becomes about half as compared with the case where the dynamic range is high (DR=1 time).

In accordance with the dynamic range control signal Sdr, first, the control unit 3m3A sets the amplification factor gm to an amplification factor which is higher than the minimum amplification factor "0.5" by (M+1) step. More specifically, when the dynamic range is high (DR=1 time), first, the control unit 3m3A sets the amplification factor gm to an amplification factor "1" which is higher than the minimum amplification factor "0.5" by one step, and when the dynamic range is low (DR=½ times), first, the control unit 3m3A sets the amplification factor gm to an amplification factor "2" which is higher than the minimum amplification factor "0.5" by two steps. Therefore, even if the amplification factor gm is set to "2" at first, this would not increase the possibility of saturating the output voltage Vo because the dynamic range is ½ times. By setting the amplification factor gm to "2" at first, noise reduction effect better than the third embodiment can be obtained as explained later.

Figure 31B:
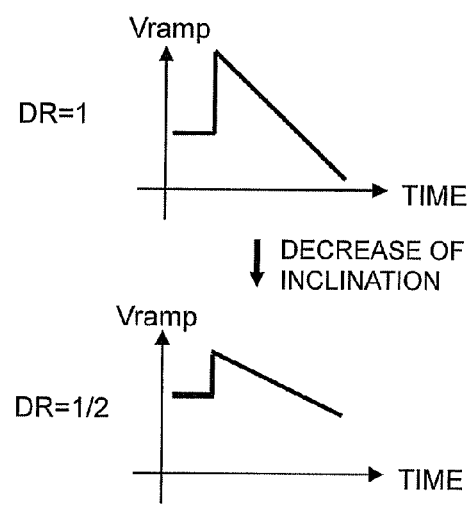
FIG. 31B is a figure illustrating a ramp voltage according to the dynamic range.

The AD conversion unit 3m4B can switch the dynamic range of input in accordance with the dynamic range control signal Sdr. More specifically, as shown in FIG. 31B, when the dynamic range of the pixel voltage Vpm is high, the AD conversion unit 3m4B increases the inclination of the ramp voltage Vramp, and accordingly, the input of the dynamic range is increased. As shown in FIG. 31B, when the dynamic range of the pixel voltage Vpm is low, the AD conversion unit 3m4B decreases the inclination of the ramp voltage Vramp, and accordingly, the input of the dynamic range is decreased.

It should be noted that the AD conversion unit 3m4B may be a successive approximation resistor-type AD conversion unit according to the first embodiment configured to switch the input dynamic range.

Figure 32:
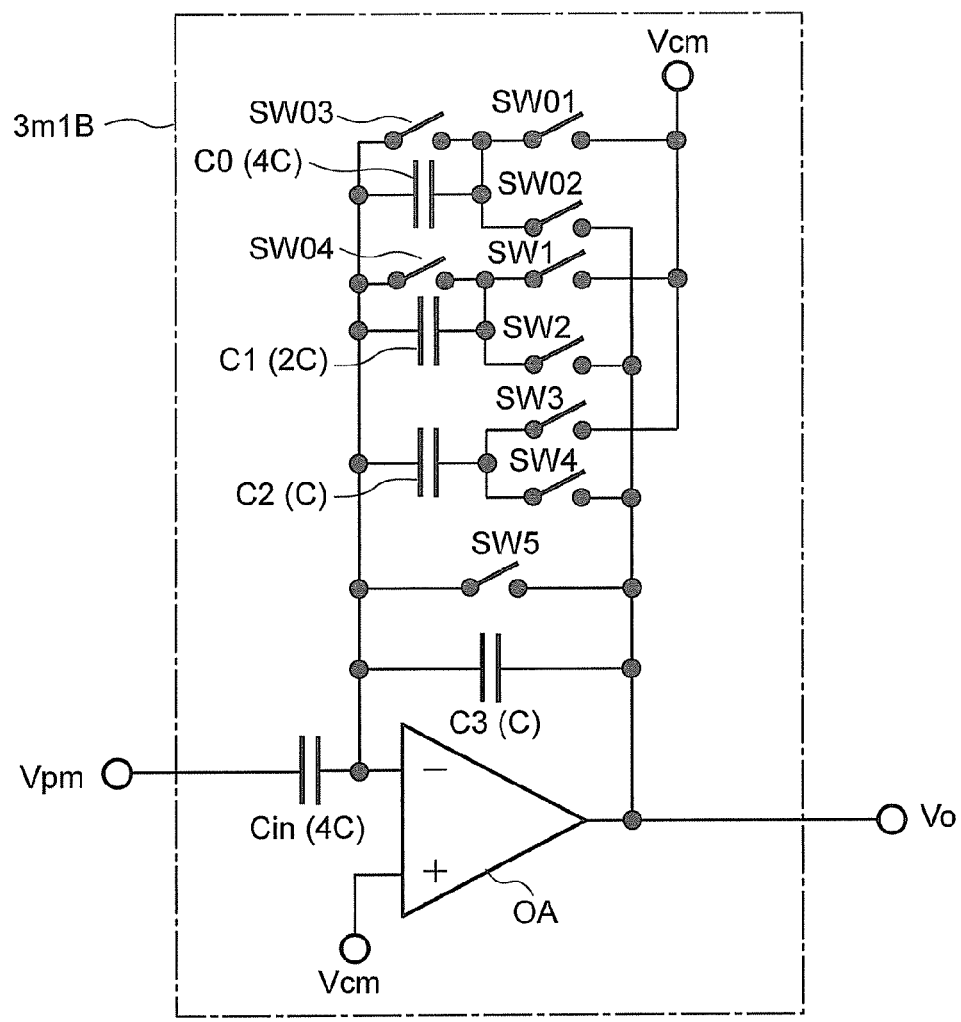
FIG. 32 is a circuit diagram illustrating an example of internal configuration of the amplification unit according to the fifth embodiment.

FIG. 32 is a circuit diagram illustrating an example of internal configuration of the amplification unit 3m1B according to the fifth embodiment. As shown in FIG. 32, the amplification unit 3m1B includes not only the configuration of the amplification unit 3m1A according to the third embodiment but also a switch (second reset switch) SW04. The switch SW04 is connected between both of the ends of the capacitor C1. At the time of the initial phase and the dynamic range being high, the switch SW04 is OFF, and at the time of the initial phase and the dynamic range being low, the switch SW04 is ON. The switch SW04 is OFF, at the time of the state other than the initial state.

The switches SW1, SW2 are OFF when the signal C1DEN given by the control unit 3m3A is one. Any one of the switches SW1, SW2 is ON when the signal C1DEN is zero.

In the present embodiment, the capacitors C0 to C2 function as the switching capacitors.

Subsequently, operation of the amplification unit 3m1B will be explained in more details.
(A) Case where Dynamic Range is High
In this case, the control unit 3m3A turns off the switch SW04 at all times. Therefore, the amplification unit 3m1B operates as explained in the third embodiment.
(B) Case where Dynamic Range is Small
(B1) Initialization Phase
FIG. 33A illustrates operation of the amplification unit 3m1B in the initialization phase. In FIG. 33A, in the initialization phase, the control unit 3m3A turns on the switches SW03, SW04, SW3, SW5 and turns off the switches SW01, SW02, SW1, SW2, SW4.

More specifically, the control unit 3m3A short-circuits both ends of each of the capacitors C0, C1, and connects the other end of the capacitor C2 to the common voltage Vcm.

Therefore, the charge accumulated in the capacitors C0 to C3 is initialized to zero.

(B2) gm="2"

FIG. 33B is a figure, subsequent to FIG. 33A, for explaining operation of the amplification unit 3m1B. The amplification factor gm is "2".

As shown in FIG. 33B, after the initialization phase, the control unit 3m3A turns off the switches SW03, SW04, SW3, SW5, and turns on the switch SW4. The switches SW01, SW02, SW1, SW2 are left in OFF state.

More specifically, first, the control unit 3m3 makes the other end of the capacitors C0, C1 in a floating state, and connects the other end of the capacitor C2 to the output terminal of the operational amplifier OA. Therefore, the control unit 3m3 sets the amplification factor gm to the amplification factor "2" which is higher than the minimum amplification factor by two steps.

The output voltage Vo at this occasion is compared with the reference voltage Vref. In the case where the dynamic range is ½ times, the reference voltage Vref is set to, for example, Vomax/4. When the output voltage Vo is more than the reference voltage Vref, the control unit 3m3A sets the amplification factor gm to "1" ((B3), FIG. 34A). On the other hand, when the output voltage Vo is equal to or less than the reference voltage Vref, the amplification factor is set to "4" ((B7), FIG. 36A).

(B3) gm="1"

Figures 34A, 34B:
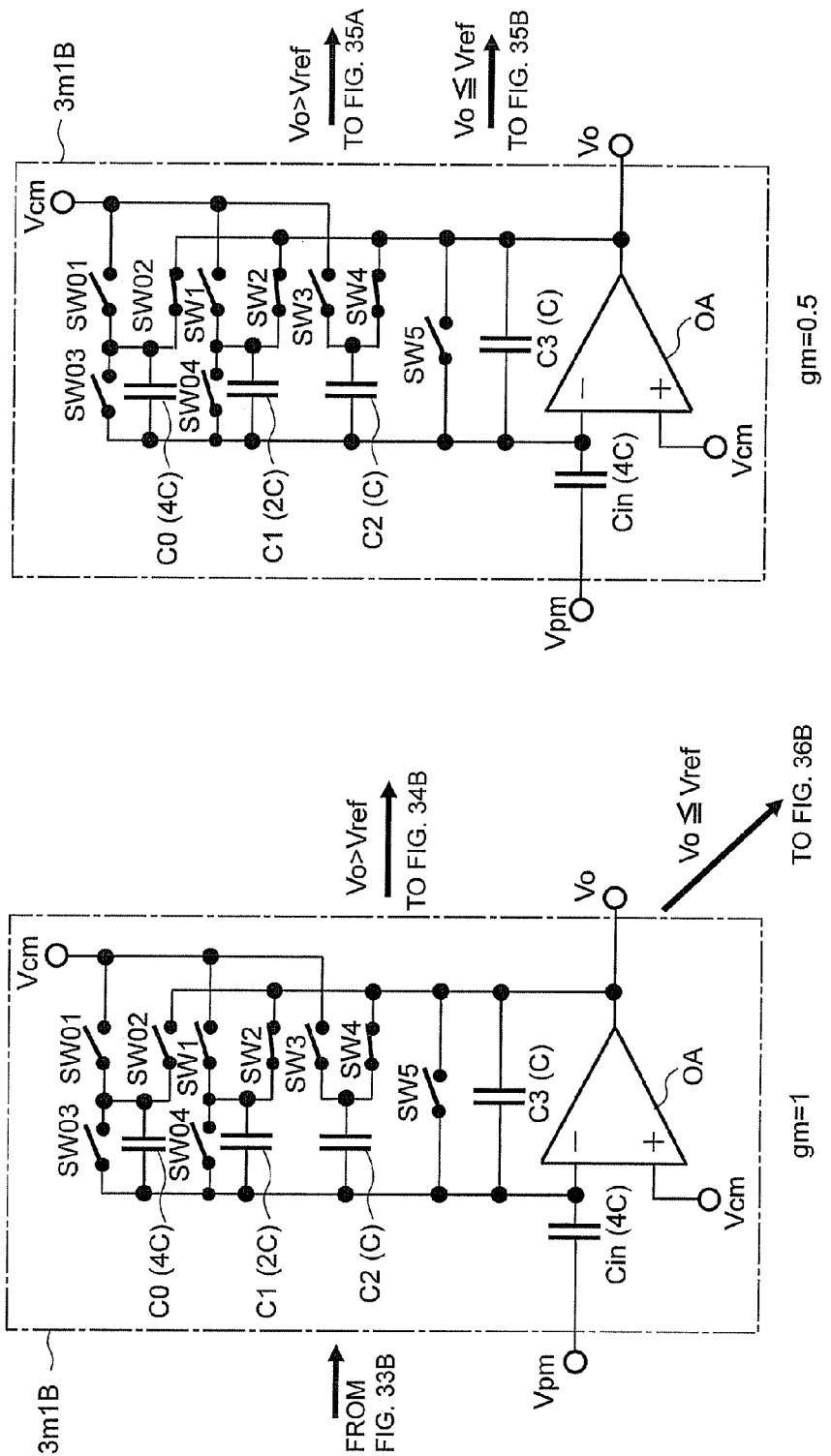
FIG. 34A is a figure, subsequent to FIG. 33B, for explaining operation of the amplification unit.
FIG. 34B is a figure, subsequent to FIG. 34A, for explaining operation of the amplification unit.

FIG. 34A is a figure, subsequent to FIG. 33B, for explaining operation of the amplification unit 3m1B. The amplification factor gm is "1".

As shown in FIG. 34A, the control unit 3m3A turns on the switch SW2. The other switches are the same as FIG. 33B. Therefore, the amplification factor gm is set to "1".

More specifically, when the control unit 3m3A reduces the amplification factor gm, the control unit 3m3A connects the other end of the capacitor C1 to the output terminal of the operational amplifier OA.

The output voltage Vo at this occasion is compared with the reference voltage Vref. When the output voltage Vo is more than the reference voltage Vref, the control unit 3m3A sets the amplification factor gm to "0.5" ((B4), FIG. 34B). On the other hand, when the output voltage Vo is equal to or less than the reference voltage Vref, the amplification factor is set to "2" ((B8), FIG. 36B).

(B4) gm="0.5"

FIG. 34B is a figure, subsequent to FIG. 34A, for explaining operation of the amplification unit 3m1B. The amplification factor gm is "0.5".

As shown in FIG. 34B, the control unit 3m3A turns on the switch SW02. The other switches are in the same state as FIG. 34A. Therefore, the amplification factor gm is set to "0.5". More specifically, the control unit 3m3A connects the other end of the capacitor C0 to the output terminal of the operational amplifier OA.

The output voltage Vo at this occasion is compared with the reference voltage Vref. When the output voltage Vo is more than the reference voltage Vref, the control unit 3m3A sets the amplification factor gm to "0.5" ((B5), FIG. 35A). On the other hand, when the output voltage Vo is equal to or less than the reference voltage Vref, the amplification factor is set to "1" ((B6), FIG. 35B).

(B5) Determine that gm="0.5"

Figure 35B:
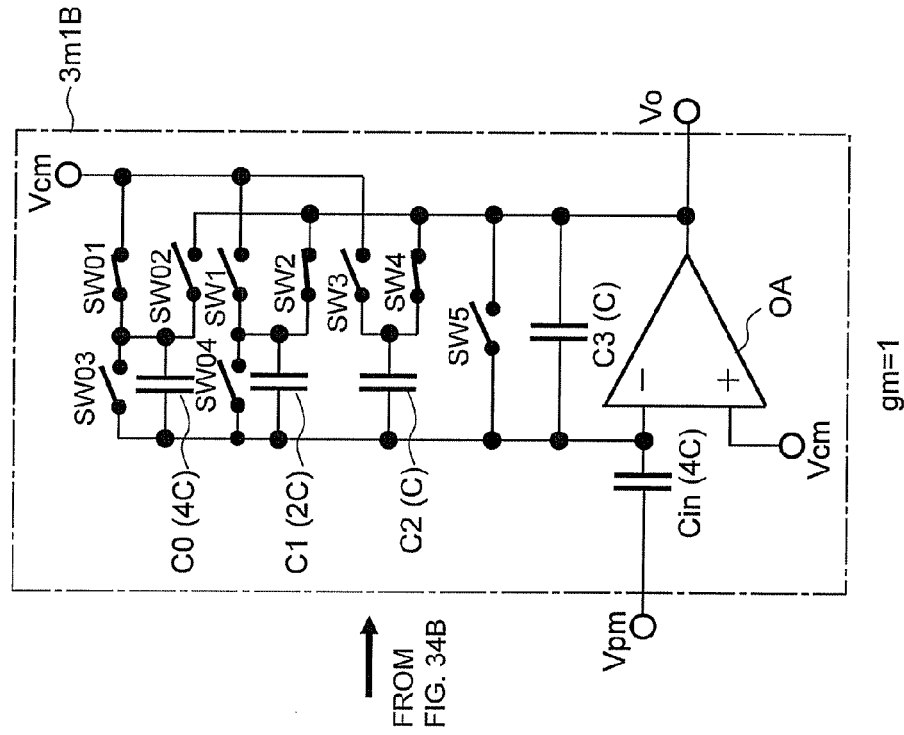
FIG. 35B is a figure, subsequent to FIG. 34B, for explaining operation of the amplification unit.
Figure 35A:
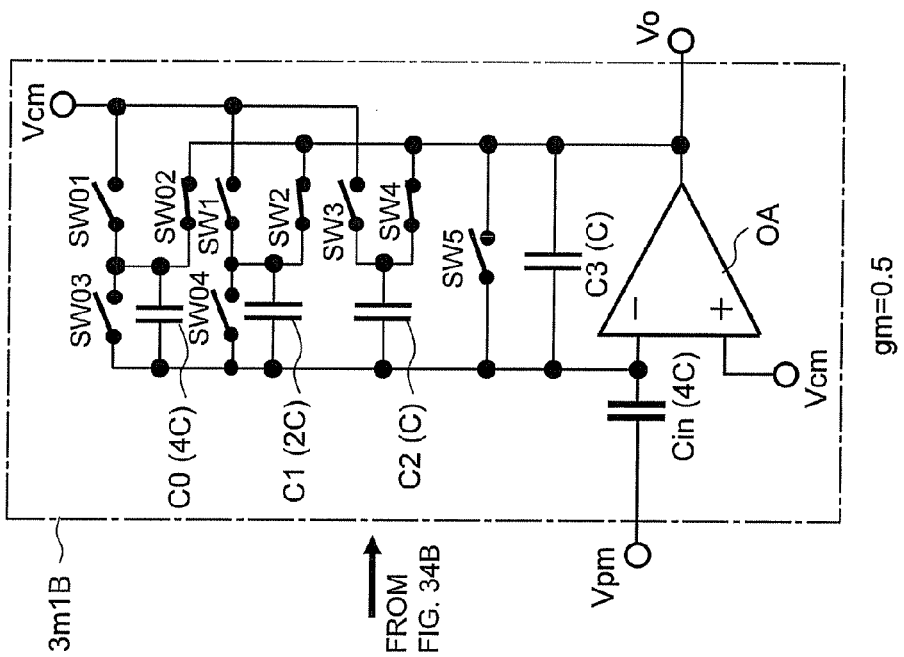
FIG. 35A is a figure, subsequent to FIG. 34B, for explaining operation of the amplification unit.

FIG. 35A is a figure, subsequent to FIG. 34B, for explaining operation of the amplification unit 3m1B. The amplification factor gm is "0.5". Therefore, the state of each switch is the same as that of FIG. 34B.

(B6) Determine that gm="1"

FIG. 35B is a figure, subsequent to FIG. 34B, for explaining operation of the amplification unit 3m1B. The amplification factor gm is "1".

As shown in FIG. 35B, the control unit 3m3A turns on the switch SW01, and turns off the switch SW02. The other switches are in the same state as those in FIG. 34B. Therefore, like FIG. 34A, the amplification factor gm is set to "1". In FIG. 34A, however, the other end of the capacitor C0 is in the floating state, but in FIG. 35B, the other end of the capacitor C0 is connected to the common voltage Vcm. The reason for this is that, in the state of FIG. 34B, the other end of the capacitor C0 is connected to the output terminal of the operational amplifier OA.

(B7) Determine that gm="4"

Figure 36B:
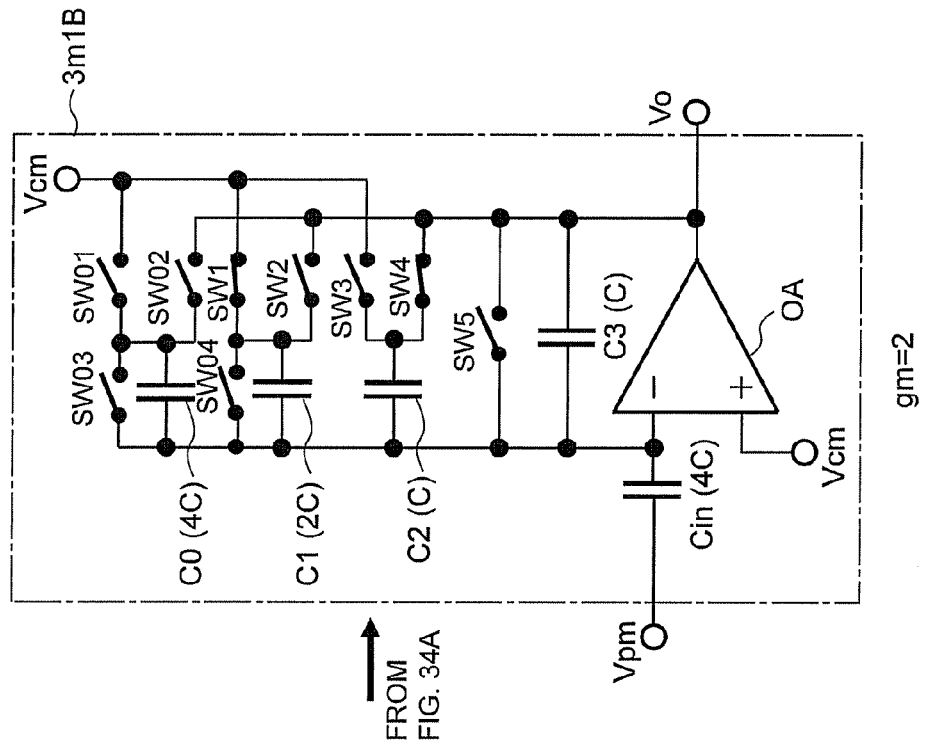
FIG. 36B is a figure, subsequent to FIG. 34A, for explaining operation of the amplification unit.
Figure 36A:
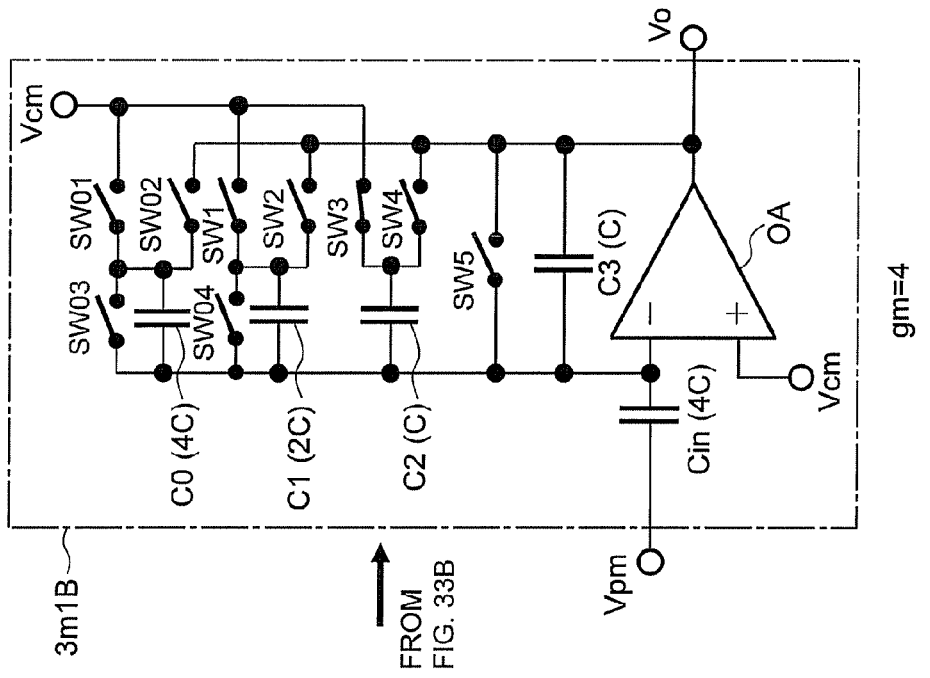
FIG. 36A is a figure, subsequent to FIG. 33B, for explaining operation of the amplification unit.

FIG. 36A is a figure, subsequent to FIG. 33B, for explaining operation of the amplification unit 3m1B. The amplification factor gm is "4".

As shown in FIG. 36A, the control unit 3m3A turns on the switch SW3 and turns off the switch SW4. The other switches are in the same state as those of FIG. 33B. Therefore, the amplification factor gm is set to "4".

More specifically, when the control unit 3m3A increases the amplification factor gm, the control unit 3m3A disconnects the other end of the capacitor C2 from the output terminal of the operational amplifier OA and connects it to the common voltage Vcm.

(B8) Determine that gm="2"

FIG. 36B is a figure, subsequent to FIG. 34A, for explaining operation of the amplification unit 3m1B. The amplification factor gm is "2".

As shown in FIG. 36B, the control unit 3m3A turns on the switch SW1, and turns off the switch SW2. The other switches are in the same state as FIG. 34A. Therefore, the amplification factor gm is set to "2".

The above operation will be explained with reference to the flowchart.

Figure 37:
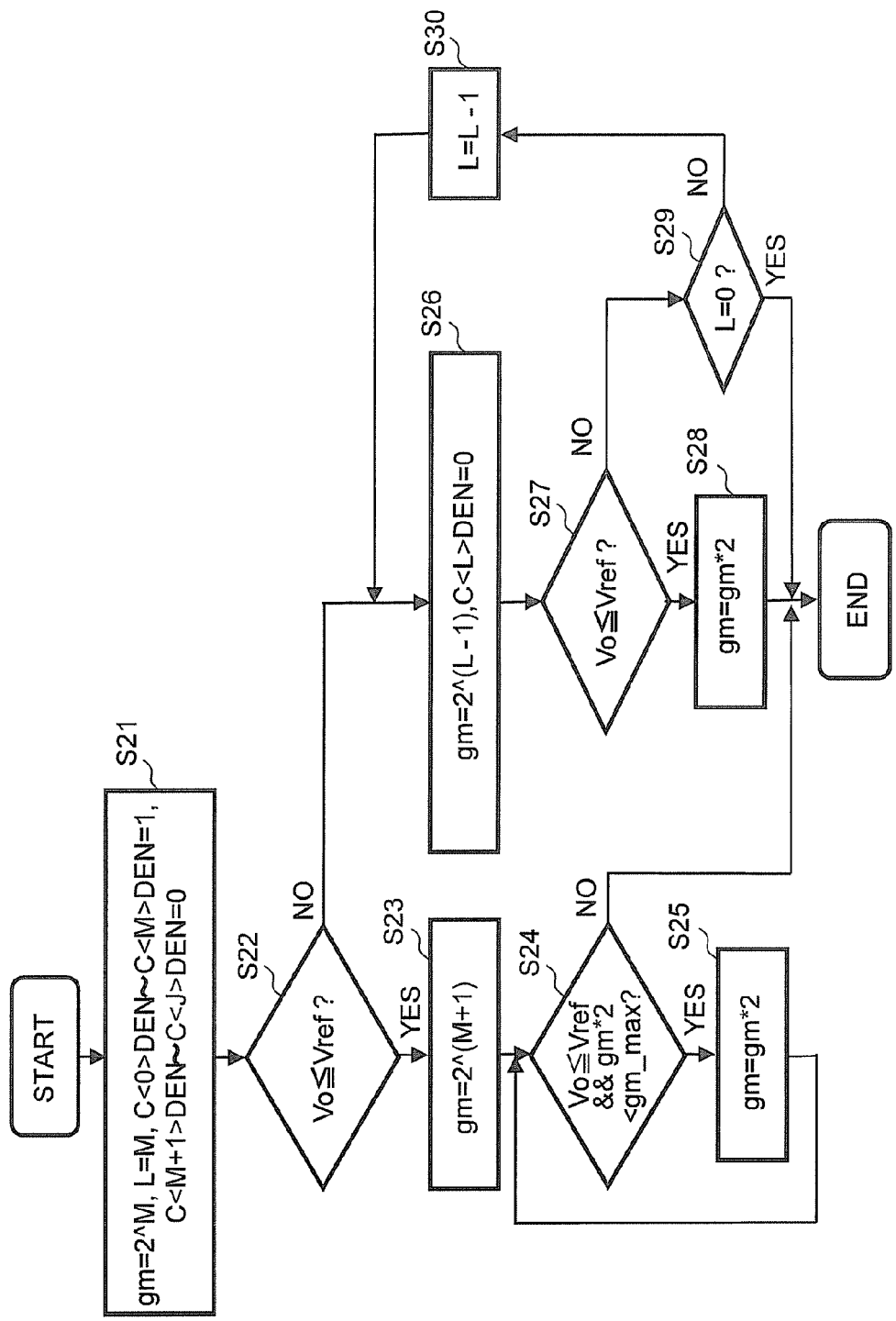
FIG. 37 is a flowchart illustrating an example of processing operation of the control unit.

FIG. 37 is a flowchart illustrating an example of processing operation of the control unit 3m3A. This flowchart can be applied not only to a case where the amplification factor gm is switched into four levels but also a case where the amplification factor gm is switched into any given level. This flowchart can be applied not only to the case where the dynamic range is one time and ½ times but also the case where the dynamic range is $1/(2^M)$ times described above.

As described above, in the initial setting, the control unit 3m3A sets the signals C<0>DEN to C<M>DEN to one, sets the signals C<M+1>DEN to C<J>DEN to zero (J is the maximum value of M), and sets the amplification factor gm to "$2^M$" (step S21). At this occasion, the variable L is set to M.

More specifically, first, the control unit 3m3A makes the other ends of the (M+1) switching capacitors in a floating state, and connects the other ends of the remaining switching capacitors to the output terminal of the operational amplifier OA, and accordingly, the amplification factor gm is set to an amplification factor higher than the minimum amplification factor by (M+1) steps.

When the output voltage Vo given by the amplification unit 3m1B is equal to or less than the reference voltage Vref (YES in step S22), the control unit 3m3A changes the amplification factor gm to "$2^{(M+1)}$" (step S23).

Subsequently, when the output voltage Vo is equal to or less than the reference voltage Vref, and the value obtained by doubling the present amplification factor gm is equal to or less than the maximum amplification factor gm_max that can be set (YES in step S24), the control unit 3m3A changes the amplification factor to twice the present amplification factor gm (step S25).

Then, the control unit 3m3A repeats this processing when the output voltage Vo becomes more than the reference voltage Vref, or the value obtained by doubling the present amplification factor gm becomes equal to or more than the maximum amplification factor gm_max that can be set (YES in step S24, step S25).

More specifically, when the control unit 3m3A increases the amplification factor gm, the control unit 3m3A disconnects the other end of any one of the switching capacitors connected to the output terminal of the operational amplifier OA from the output terminal of the operational amplifier OA, and connects it to the common voltage Vcm.

When the output voltage Vo is more than the reference voltage Vref, or the value obtained by doubling the present amplification factor gm is equal to or more than the maximum amplification factor gm_max that can be set (NO in step S24), then, the processing is terminated. Therefore, the amplification factor gm is determined.

On the other hand, when the output voltage Vo is more than the reference voltage Vref in step S22 (NO in step S22), the output voltage Vo may be saturated when the amplification factor gm is "2^M". Therefore, the control unit 3m3A changes the signal C<L>DEN to zero, and changes the amplification factor gm to "2^(L−1)" (step S26).

More specifically, when the control unit 3m3A decreases the amplification factor gm, the control unit 3m3A connects the other end of any one of the switching capacitors in the floating state to the output terminal of the operational amplifier OA.

Subsequently, when the output voltage Vo is equal to or less than the reference voltage Vref (YES in step S27), the control unit 3m3A changes the amplification factor back to twice the present amplification factor gm again (step S28), and terminates the processing.

On the other hand, when the output voltage Vo is more than the reference voltage Vref (NO in step S27), a determination is made as to whether the variable L is zero or not (step S29).

When the variable L is zero (NO in step S29), the processing is terminated.

When the variable L is not zero (YES in step S29), one is subtracted from the variable L (step S30), and step S26 is performed again.

In this case, (J+1) (J is the maximum value of M) second reset switches are provided. Each of these second reset switches is connected to between both ends of the corresponding switching capacitor.

Then, in the initialization phase, when no light is irradiated on the pixel 2, the control unit 3m3A turns on the first reset switch and (M+1) second reset switches and turns off the remaining second reset switches and connects, to the common voltage Vcm, the other ends of the switching capacitors other than the (M+1) switching capacitors of which both ends are short-circuited.

Thereafter, the control unit 3m3A turns off the first reset switch and the (M+1) second reset switches, and as described above, the control unit 3m3A sets the amplification factor gm to an amplification factor higher than the minimum amplification factor by (M+1) step.

Figure 38A:
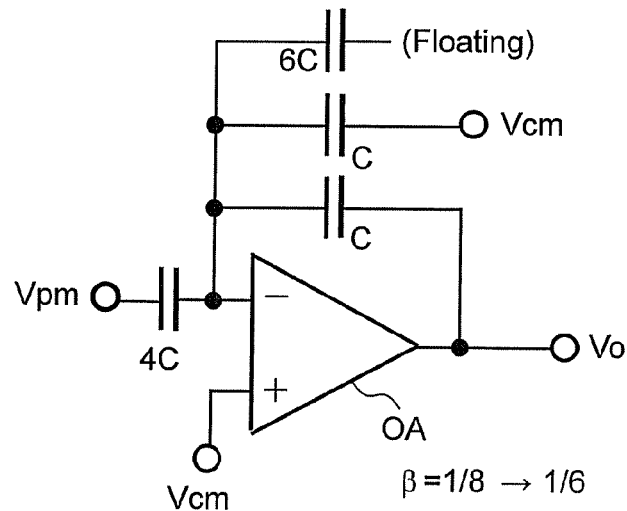
FIG. 38A is an equivalent circuit diagram of the amplification unit in a case where the dynamic range is ½ times and the amplification factor is "4"

FIG. 38A is an equivalent circuit diagram of the amplification unit 3m1B in a case where the dynamic range is ½ times and the amplification factor gm is "4".

In FIG. 28A of the third embodiment, the other end of the capacitor having the capacitance 3C is connected to the common voltage Vcm, and the other end of the capacitor having the capacitance 4C is in the floating state. In contrast, as shown in FIG. 38A, the other end of the capacitor having the capacitance C is connected to the common voltage Vcm, and the other end of the capacitor having the capacitance 6C is in the floating state. Therefore, the feedback coefficient β becomes ⅙, which is more than ⅛ of FIG. 28A. Therefore, the noise can be reduced than the third embodiment.

Figure 38B:
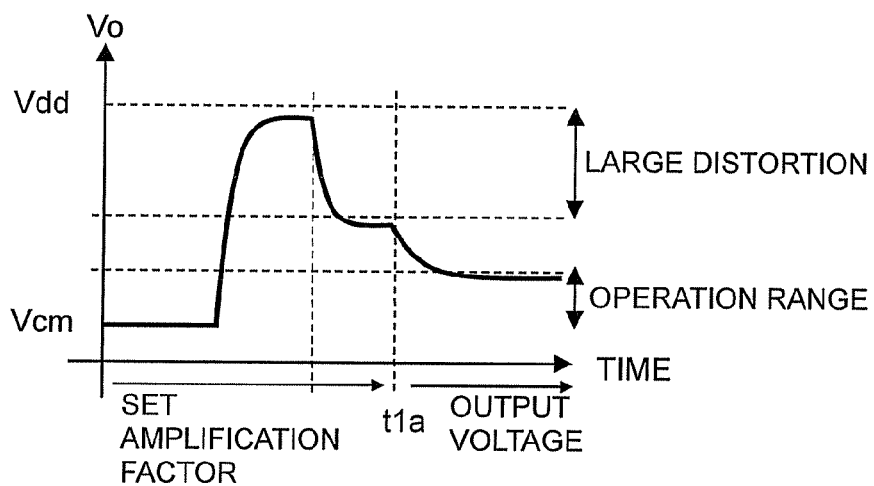
FIG. 38B is a figure schematically illustrating change of the output voltage over time in a case where the dynamic range is ½ times and the amplification factor is "0.5".

FIG. 38B is a figure schematically illustrating change of the output voltage Vo over time in a case where the dynamic range is ½ times and the amplification factor gm is "0.5". As shown in FIG. 38B, the reference voltage Vref is Vomax/4, and therefore, after the time t1a at which the amplification factor gm is determined, the output voltage Vo is within an operation range lower than the case where the dynamic range is one time. Therefore, the operation is performed within smaller distortion and the linear region than the case where the dynamic range is one time, and therefore, the error of the amplification factor gm can be reduced.

As described above, according to the present embodiment, when the dynamic range of the pixel voltage Vp is small, first, the other ends of the capacitors C0, C1 are made in the floating state, and the amplification factor gm is set to an amplification factor "2" higher than the minimum amplification factor "0.5" by two steps. More specifically, first, the capacitors connected to the output terminal of the operational amplifier OA are reduced than the third embodiment. Therefore, when the dynamic range is low, and the amplification factor gm is high, and therefore, as compared with the third embodiment, the capacitors connected to the common voltage Vcm can be reduced, and therefore, the noise can be further reduced.

It should be noted that the fifth embodiment may be combined with the first embodiment. In other word, when the dynamic range is one time, first, the other ends of the capacitors C0, C1 are not made in the floating state, and the amplification factor gm is set to "0.5", and like the first embodiment. When the dynamic range is ½ times, first, the other end of the capacitor C0 is made in the floating state, and the amplification factor gm is set to "1". Specifically, in accordance with the dynamic range control signal Sdr, when M is equal to or more than one, first, the control unit 3m3A sets the amplification factor gm to an amplification factor which is higher than the minimum amplification factor by (M+1) step.

Furthermore, the fifth embodiment may be combined with the fourth embodiment.

Sixth Embodiment

The sixth embodiment is different from the first embodiment in that CLS (Correlated Level Shift) technique is applied to an amplification unit. Hereinafter the difference from the first embodiment will be mainly explained.

Figure 39:
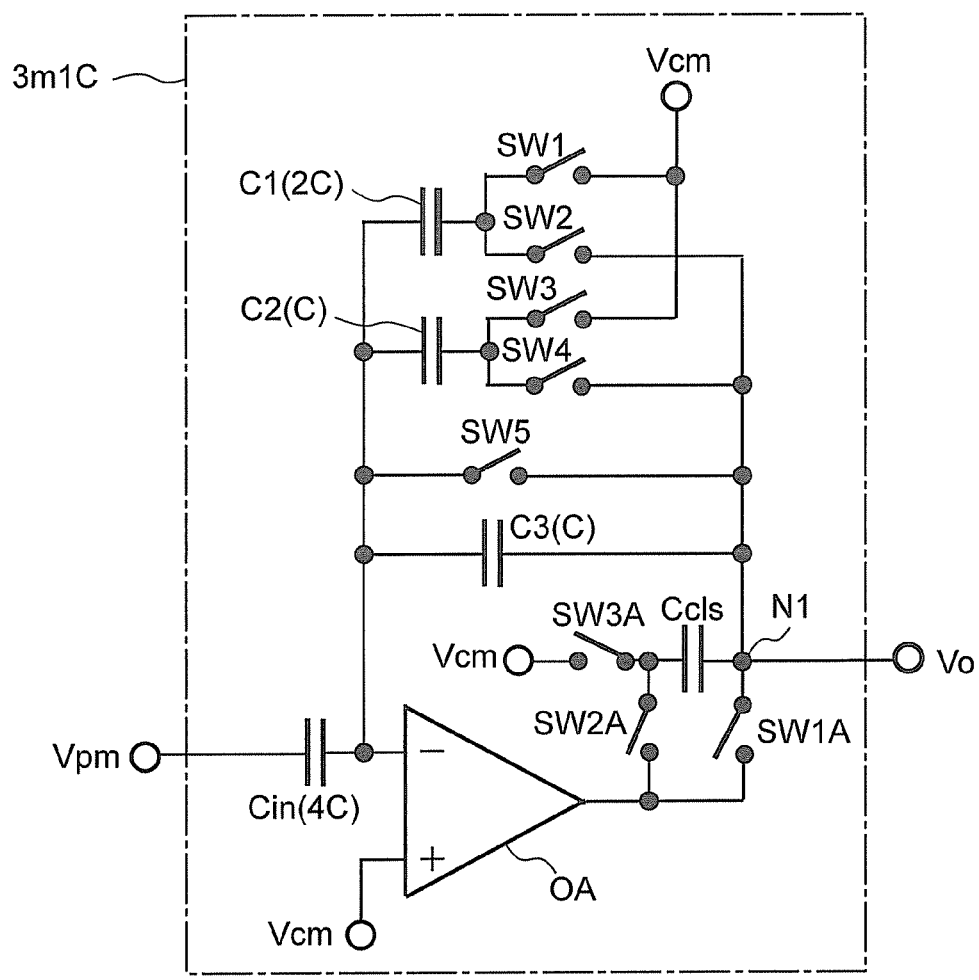
FIG. 39 is a circuit diagram illustrating an example of internal configuration of an amplification unit according to a sixth embodiment.

FIG. 39 is a circuit diagram illustrating an example of internal configuration of an amplification unit 3m1C according to the sixth embodiment. As shown in FIG. 39, an amplification unit 3m1C includes not only the configuration of the amplification unit 3m1 according to the first embodiment but also a capacitor (level shift capacitor) Ccls, a switch (first level shift switch) SW1A, a switch (second level shift switch) SW2A, and a switch (third level shift switch) SW3A.

One end of the capacitor C3 is connected to the inverting input terminal of the operational amplifier OA, and the other end thereof is connected to the output node N1 for outputting the output voltage Vo.

The switch SW1A is connected between the output node N1 and the output terminal of the operational amplifier OA. One end of the capacitor Ccls is connected to the output node N1. The switch SW2A is connected between the other end of the capacitor Ccls and the output terminal of the operational amplifier OA. The switch SW3A is connected between the other end of the capacitor Ccls and the common voltage Vcm.

The control unit 3m3 turns on the switch SW1A and the switch SW3A and turns off the switch SW2A, and like the first embodiment, the control unit 3m3 connects the other end of the capacitors C1, C2 to the output terminal of the operational amplifier OA or the common voltage Vcm, thus controlling the amplification factor gm. During this time, the charge is accumulated in the capacitor Ccls.

After the amplification factor gm is determined, a control unit 3m3 turns off the switch SW1A and the switch SW3A, and turns on the switch SW2A. Therefore, the output voltage Vo is a summation of the voltage of the output terminal of the operational amplifier OA and the voltage between both ends of the capacitor Ccls. More specifically, the voltage of the output terminal of the operational amplifier OA is a value obtained by subtracting the voltage between both ends of the capacitor Ccls from the output voltage Vo.

Therefore, as compared with the first embodiment, the voltage of the output terminal of the operational amplifier OA can be reduced. Therefore, the operating point of the output terminal of the operational amplifier OA moves less, and the ultimate amplification factor of the operational amplifier OA can be increased. Therefore, the error in the amplification factor gm of the amplification unit 3m1C can be reduced.

Figure 40:
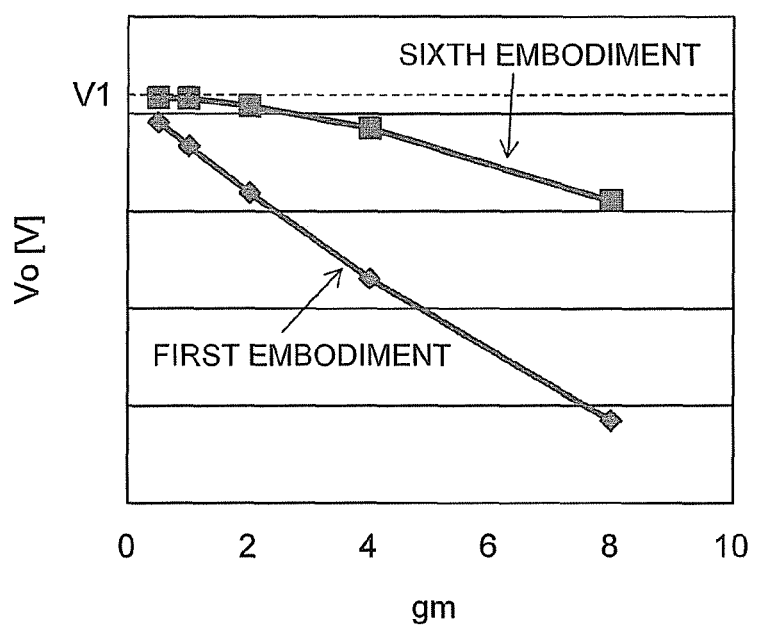
FIG. 40 is a figure illustrating how the output voltage of the amplification unit according to the first embodiment and the output voltage of the amplification unit according to the sixth embodiment are dependent on the amplification factor.

FIG. 40 is a figure illustrating how the output voltage Vo of the amplification unit 3m1 according to the first embodiment and the output voltage Vo of the amplification unit 3m1C according to the sixth embodiment are dependent on the amplification factor gm. For example, in the case of the amplification factor gm as configured, the pixel voltage Vp is input so that the output voltage Vo attains the target value V1 in each amplification factor gm.

As shown in FIG. 40, in the sixth embodiment, the output voltage Vo less greatly decreases from the target value V1 in each amplification factor gm, and the error in the amplification factor gm is lower as compared with the first embodiment.

As described above, according to the present embodiment, the error in the amplification factor gm of the amplification unit 3m1C can be reduced.

It should be noted that the sixth embodiment may be combined with any one of the second to the fifth embodiments.

Seventh Embodiment

The seventh embodiment is different from the fifth embodiment in that the reference voltage Vref is equal to the maximum voltage value Vomax and is different from the fifth embodiment in the method for setting the amplification factor gm. Hereinafter the difference from the fifth embodiment will be mainly explained.

A control unit 3m3A increases the amplification factor than the present amplification factor gm, and thereafter, when the output voltage Vo given by an amplification unit 3m1B is more than the reference voltage Vref (=maximum voltage value Vomax), the control unit 3m3A causes the amplification factor to be less than the present amplification factor gm, on the basis of the comparison result of a comparison unit 3m2. The operation will be hereinafter explained in more details.

Figure 41:
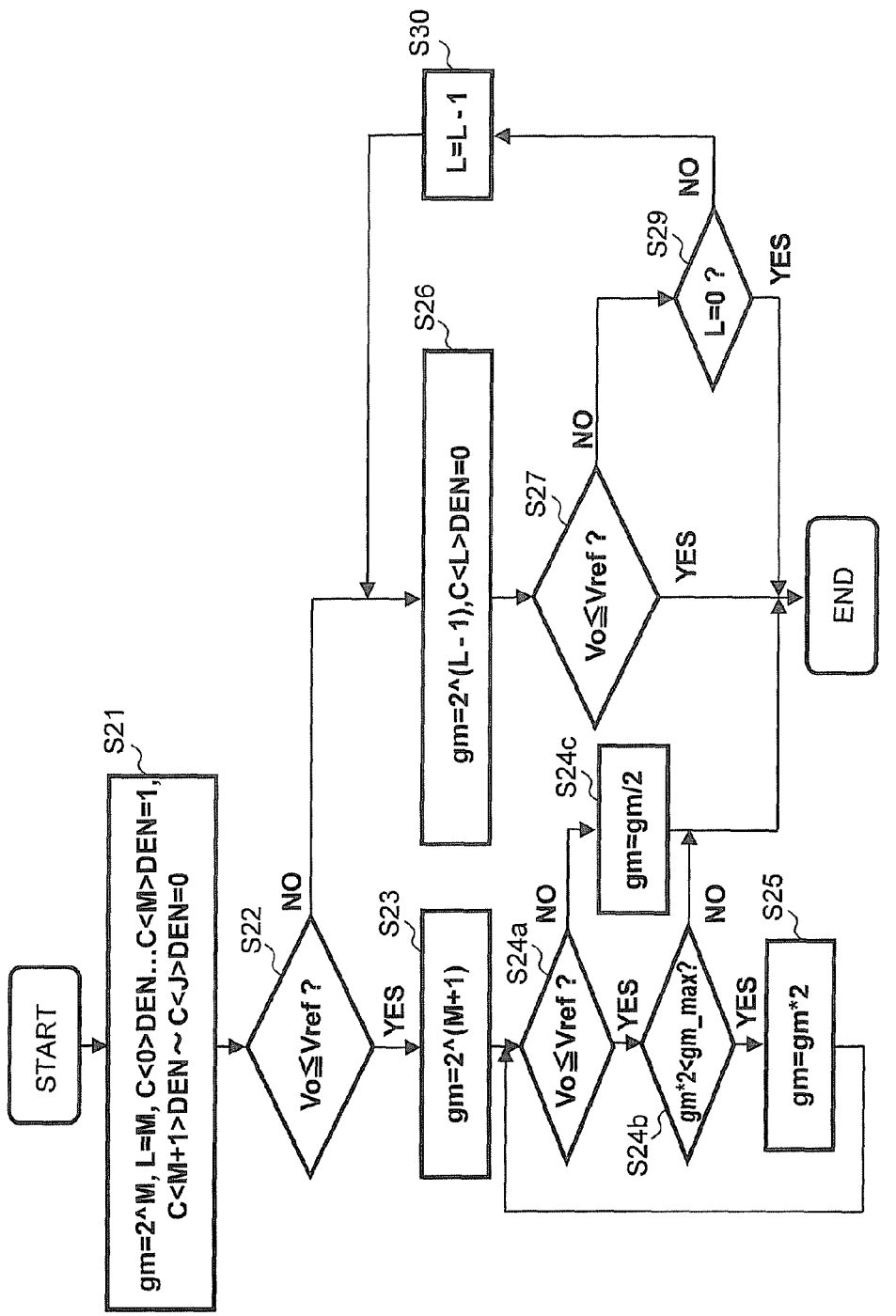
FIG. 41 is a flowchart illustrating an example of processing operation of the control unit according to a seventh embodiment.

FIG. 41 is a flowchart illustrating an example of processing operation of the control unit according to the seventh embodiment. The processing in steps S21 to S23 performed at first is the same as FIG. 37 of the fifth embodiment.

After step S23, when the output voltage Vo is equal to or less than the reference voltage Vref (YES in step S24a), and the value obtained by doubling the present amplification factor gm is less than the maximum amplification factor gm_max that can be set (YES in step S24b), then the control unit 3m3A changes the amplification factor to the value obtained by doubling the present amplification factor gm (step S25).

Then, the control unit 3m3A repeats this processing until the output voltage Vo becomes more than the reference voltage Vref or the value obtained by doubling the present amplification factor gm becomes equal to or more than the maximum amplification factor gm_max that can be set (YES in steps S24a, S24b, S25).

When the output voltage Vo is more than the reference voltage Vref (NO in step S24a), the control unit 3m3A changes the amplification factor to ½ of the present amplification factor gm (step S24c), and terminates the processing. Therefore, the amplification factor gm is determined.

When the value obtained by doubling the present amplification factor gm is equal to or more than the maximum amplification factor gm_max that can be set (NO in step S24b), the processing is terminated. Therefore, the amplification factor gm is determined.

The processing in steps S26, S27, S29, S30 is the same as FIG. 37 of the fifth embodiment. However, when the output voltage Vo is equal to or less than the reference voltage Vref in step S27 (YES in step S27), the processing is terminated.

Figure 42:
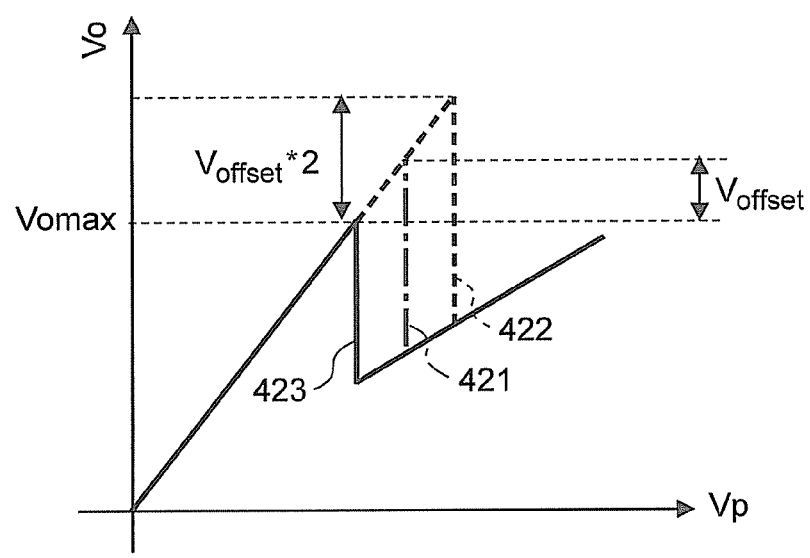
FIG. 42 is a figure illustrating a relationship between the output voltage and the pixel voltage.

FIG. 42 is a figure illustrating a relationship between the output voltage Vo and the pixel voltage Vp. FIG. 42 illustrates a feature 421 of the seventh embodiment in a case where the operational amplifier OA and the comparison unit 3m2 have an offset Voffset, a feature 422 of the fifth embodiment in a case where the operational amplifier OA and the comparison unit 3m2 have the offset Voffset, and a feature 423 of the fifth embodiment in an ideal case where the operational amplifier OA and the comparison unit 3m2 do not have the offset Voffset. FIG. 42 shows a case where the amplification factor gm is "2" and "4".

In the ideal case where the operational amplifier OA and the comparison unit 3m2 do not have the offset Voffset (feature 423), the maximum value of the output voltage Vo becomes the maximum voltage value Vomax. On the other hand, when the operational amplifier OA and the comparison unit 3m2 have the offset Voffset in the fifth embodiment (feature 422), the maximum value of the output voltage Vo becomes higher than the maximum voltage value Vomax by twice the offset Voffset. Therefore, the output voltage Vo is saturated because of the effect of the offset Voffset. Though not shown in the drawings, when the polarity of the offset is opposite, the maximum value of the output voltage Vo is lower than the maximum voltage value Vomax by twice the offset Voffset.

In contrast, when the operational amplifier OA and the comparison unit 3m2 have the offset Voffset in the present embodiment (feature 421), the maximum value of the output voltage Vo is higher than the maximum voltage value Vomax by the offset Voffset. Therefore, the degree of saturation of the output voltage Vo can be reduced than the fifth embodiment. When the polarity of the offset is opposite, the maximum value of the output voltage Vo is lower than the maximum voltage value Vomax by the offset Voffset.

As described above, as compared with the fifth embodiment, the present embodiment is less affected by variation of each device.

It should be noted that the seventh embodiment may be combined with any one of the first to fourth, and sixth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
an amplifier configured to amplify a pixel value with an amplification factor that is set in a variable manner, the pixel value being according to an intensity of light irradiated on a pixel;
a comparator configured to compare an output value given by the amplifier and a reference value; and
a controller configured to cause the amplification factor to be higher than a present amplification factor, only when the output value given by the amplifier is not saturated even where the amplification factor is caused to be higher than the present amplification factor, based on the comparison result of the comparator, and
wherein the reference value is $1/q$ (q is a number larger than one) of a maximum value that the amplifier can output, and
the controller makes the amplification factor into q times the present amplification factor, only when the output value given by the amplifier is not saturated even where the amplification factor is made into q times the present amplification factor.

2. The semiconductor integrated circuit according to claim 1 comprising:
an AD converter configured to convert the output value given by the amplifier into a digital value, after the amplification factor is determined; and
an arithmetic operation unit configured to output a value obtained by dividing the digital value, given by the AD converter, by a coefficient according to the determined amplification factor.

3. A semiconductor integrated circuit comprising:
an amplifier configured to amplify a pixel value with an amplification factor that is set in a variable manner, the pixel value being according to an intensity of light irradiated on a pixel;
a comparator configured to compare an output value given by the amplifier and a reference value;
a controller configured to cause the amplification factor to be higher than a present amplification factor, only when the output value given by the amplifier is not saturated even where the amplification factor is caused to be higher than the present amplification factor, based on the comparison result of the comparator;
an AD converter configured to convert the output value given by the amplifier into a digital value, after the amplification factor is determined; and
an arithmetic operation unit configured to output a value obtained by dividing the digital value, given by the AD converter, by a coefficient according to the determined amplification factor, and
wherein in accordance with control of the controller, the amplification factor is set to any one of amplification factors in a plurality of steps defined in advance,
the semiconductor integrated circuit comprises a correction coefficient calculation unit,
wherein when the amplification factor is set to a first amplification factor of the amplification factors in the plurality of steps, and the pixel value is a first value, then the correction coefficient calculation unit calculates the coefficient according to the first amplification factor, based on a ratio between a first digital value that is actually output from the AD converter and an expected value of the first digital value, and
when the amplification factor is set to a second amplification factor of the amplification factors in the plurality of steps, and the pixel value is the first value, then the correction coefficient calculation unit calculates the coefficient according to the second amplification factor, based on a ratio between a second digital value that is actually output from the AD converter and the first digital value, and
the arithmetic operation unit outputs a value by dividing the digital value by the coefficient which is according to the determined amplification factor and which is calculated by the correction coefficient calculation unit.

4. The semiconductor integrated circuit according to claim 2, wherein the comparator is used for the control of the amplification factor by the controller before the amplification factor is determined, and is used for the AD conversion by the AD converter after the amplification factor is determined.

5. The semiconductor integrated circuit according to claim 2 comprising a correction unit configured to correct the digital value, based on the digital value given by the AD converter, in a case where no light is irradiated on the pixel and the amplification factor is the maximum value thereof.

6. The semiconductor integrated circuit according to claim 1, wherein, first, the control unit sets the amplification factor to an amplification factor higher than the minimum amplification factor by one or more steps,
thereafter, when the output value given by the amplification unit may be saturated, the control unit decreases the amplification factor to a value less than the present amplification factor by one step,
and only when the output value given by the amplification unit is not saturated even where the amplification factor is increased to a value higher than the present amplification factor by one step, the control unit increases the amplification factor to a value higher than the present amplification factor by one step.

7. The semiconductor integrated circuit according to claim 6, wherein the amplification unit comprises:
an operational amplifier comprising a non-inverting input terminal receiving a common voltage and an output terminal outputting the output value;
an input capacitor, one end of the input capacitor receiving the pixel value, and the other end of the input capacitor being connected to an inverting input terminal of the operational amplifier;

a floating capacitor, one end of the floating capacitor being connected to the inverting input terminal of the operational amplifier;

a plurality of switching capacitors, one end of each of the switching capacitors being connected to the inverting input terminal of the operational amplifier; and a capacitor, one end of the capacitor being connected to the inverting input terminal of the operational amplifier, and the other end of the capacitor being connected to the output terminal of the operational amplifier, and wherein, first, the control unit causes the other end of the floating capacitor to be in a floating state, and connects the other ends of the plurality of switching capacitors to the output terminal of the operational amplifier, and accordingly, sets the amplification factor to an amplification factor higher than the minimum amplification factor by one step, thereafter, when the amplification factor is decreased, the control unit connects the other end of the floating capacitor to the output terminal of the operational amplifier, and when the amplification factor is increased, the control unit disconnects the other end of any one of the switching capacitors from the output terminal of the operational amplifier, and connects it to the common voltage.

8. The semiconductor integrated circuit according to claim 7, wherein the amplification unit comprises:

a first reset switch connected between the inverting input terminal and the output terminal; and a second reset switch connected between both ends of the floating capacitor, and wherein when no light is irradiated on the pixel, the control unit turns on the first reset switch and the second reset switch, and connects the other end of the switching capacitor to the common voltage, and thereafter, the control unit turns off the first reset switch and the second reset switch, and sets the amplification factor to an amplification factor higher than the minimum amplification factor by one step.

9. The semiconductor integrated circuit according to claim 7 comprising a single-slope-type AD conversion unit configured to convert the output value given by the amplification unit into a digital value, after the amplification factor is determined, and wherein the AD conversion unit comprises:

an AD conversion capacitor, one end of the AD conversion capacitor receiving the output value from the amplification unit;

a comparator, inverting input terminal of the comparator being connected to the other end of the AD conversion capacitor, and non-inverting input terminal of the comparator receiving a ramp voltage; and a digital value determination unit configured to determine the digital value in accordance with a rise timing of the ramp voltage and a comparison result of the comparator.

10. The semiconductor integrated circuit according to claim 1, wherein, first, the control unit sets the amplification factor to an amplification factor higher than the minimum amplification factor by (M+1) step, in accordance with a dynamic range control signal given from outside, the dynamic range control signal indicating that the dynamic range of the pixel value is 1/(2 M) times (M is an integer equal to or more than zero), and thereafter, when the output value given by the amplification unit may be saturated, the control unit decreases the amplification factor to a value lower than the present amplification factor by one step, and only when the output value given by the amplification unit is not saturated even where the amplification factor is increased to a value higher than the present amplification factor by one step, the control unit increases the amplification factor to a value higher than the present amplification factor by one step.

11. The semiconductor integrated circuit according to claim 10, wherein the AD conversion unit can switch the dynamic range of input thereof, in accordance with the dynamic range control signal.

12. The semiconductor integrated circuit according to claim 10, wherein the amplification unit comprises:

an operational amplifier comprising a non-inverting input terminal receiving a common voltage and an output terminal outputting the output value;

an input capacitor, one end of the input capacitor receiving the pixel value, and the other end of the input capacitor being connected to an inverting input terminal of the operational amplifier;

a plurality of switching capacitors, one end of each of the switching capacitors being connected to the inverting input terminal of the operational amplifier;

a capacitor, one end of the capacitor being connected to the inverting input terminal of the operational amplifier, and the other end of the capacitor being connected to the output terminal of the operational amplifier, and wherein, first, the control unit causes the other ends of (M+1) switching capacitors to be in a floating state, and connects the other ends of the remaining switching capacitors to the output terminal of the operational amplifier, and accordingly, sets the amplification factor to an amplification factor higher than the minimum amplification factor by (M+1) steps, thereafter, when the amplification factor is decreased, the control unit connects the other end of any one of the switching capacitors in the floating state to the output terminal of the operational amplifier, and when the amplification factor is increased, the control unit disconnects the other end of any one of the switching capacitors connected to the output terminal of the operational amplifier from the output terminal of the operational amplifier, and connects it to the common voltage.

13. The semiconductor integrated circuit according to claim 12, wherein the amplification unit comprises:

a first reset switch connected between the inverting input terminal and the output terminal; and (J+1) (J is a maximum value of M) second reset switches, each connected between both ends of the corresponding switching capacitor, wherein when no light is irradiated on the pixel, the control unit turns on the first reset switch and the (M+1) second reset switches, and turns off the remaining second reset switches, and connects, to the common voltage, the other end of the switching capacitor other than the (M+1) switching capacitors both ends of which are short-circuited, and thereafter, the control unit turns off the first reset switch and the (M+1) second reset switches, and sets the amplification factor to an amplification factor higher than the minimum amplification factor by (M+1) step.

14. The semiconductor integrated circuit according to claim 1, wherein the amplification unit comprises:

an operational amplifier comprising a non-inverting input terminal receiving a common voltage;

an input capacitor, one end of the input capacitor receiving the pixel value, and the other end of the input capacitor being connected to an inverting input terminal of the operational amplifier;

a plurality of switching capacitors, one end of each of the switching capacitors being connected to the inverting input terminal of the operational amplifier;

a capacitor, one end of the capacitor being connected to the inverting input terminal of the operational amplifier, and the other end of the capacitor being connected to an output node, the output node outputting the output value;

a first level shift switch connected between the output node and the output terminal of the operational amplifier;

a level shift capacitor, one end of the level shift capacitor being connected to the output node;

a second level shift switch connected between the other end of the level shift capacitor and the output terminal of the operational amplifier;

and a third level shift switch connected between the other end of the level shift capacitor and the common voltage, wherein the control unit turns on the first level shift switch and the third level shift switch and turns off the second level shift switch, and in this state, the control unit connects the other end of the switching capacitor to the output terminal of the operational amplifier or the common voltage, thus controlling the amplification factor, and after the amplification factor is determined, the control unit turns off the first level shift switch and the third level shift switch and turns on the second level shift switch.

15. An image sensor comprising:

a pixel array constituted by a plurality of pixels; and the semiconductor integrated circuit according to claim 1 processing a pixel value according to the intensity of the light irradiated on the pixel.

* * * * *